United States Patent
Kuroki et al.

(10) Patent No.: US 9,871,225 B2
(45) Date of Patent: Jan. 16, 2018

(54) ORGANIC ELECTROLUMINESCENCE ELEMENT

(71) Applicant: Konica Minolta, Inc., Chiyoda-ku, Tokyo (JP)

(72) Inventors: Takaaki Kuroki, Hachioji (JP); Akihiko Takeda, Sagamihara (JP); Yasunobu Kobayashi, Hachioji (JP)

(73) Assignee: KONICA MINOLTA, INC., Chiyoda-Ku (JP)

( * ) Notice: Subject to any disclaimer, the term of this patent is extended or adjusted under 35 U.S.C. 154(b) by 0 days.

(21) Appl. No.: 15/023,865

(22) PCT Filed: Dec. 1, 2014

(86) PCT No.: PCT/JP2014/081725
§ 371 (c)(1),
(2) Date: Mar. 22, 2016

(87) PCT Pub. No.: WO2015/083660
PCT Pub. Date: Jun. 11, 2015

(65) Prior Publication Data
US 2016/0315286 A1 Oct. 27, 2016

(30) Foreign Application Priority Data
Dec. 6, 2013 (JP) .................................. 2013-252693

(51) Int. Cl.
*H01L 51/52* (2006.01)
*H01L 51/56* (2006.01)

(52) U.S. Cl.
CPC ...... *H01L 51/5268* (2013.01); *H01L 51/5215* (2013.01); *H01L 51/5253* (2013.01);
(Continued)

(58) Field of Classification Search
CPC ............. H01L 51/5268; H01L 51/5215; H01L 51/5253; H01L 51/56; H01L 51/5203;
(Continued)

(56) References Cited

U.S. PATENT DOCUMENTS

| | | | |
|---|---|---|---|
| 2002/0125822 A1* | 9/2002 | Graff .................... | H01L 51/5256 313/506 |
| 2004/0253451 A1* | 12/2004 | Kawashima ............ | C23C 16/30 428/411.1 |
| 2008/0176041 A1* | 7/2008 | Sato .................... | H01L 51/0097 428/161 |

FOREIGN PATENT DOCUMENTS

| | | | |
|---|---|---|---|
| JP | 2004296437 A | 10/2004 | |
| JP | 4186688 B2 | 11/2008 | |

(Continued)

OTHER PUBLICATIONS

International Search Report corresponding to Application No. PCT/JP2014/081725; dated Feb. 10, 2015, with English translation.

(Continued)

*Primary Examiner* — Karen Kusumakar
(74) *Attorney, Agent, or Firm* — Cantor Colburn LLP

(57) ABSTRACT

Provided is an organic electroluminescent element including a film substrate having thereon: at least one gas barrier layer, a light scatter layer, at least one smooth layer, and a light-emitting unit containing an organic functional layer interposed between a pair of electrodes, laminated in this order, wherein the light scatter layer contains a binder and light scatter particles having an average particle size of 0.2 µm or more to less than 1 µm; and the smooth layer contains an oxide or a nitride of silicone or niobium as a main component.

12 Claims, 5 Drawing Sheets

(52) U.S. Cl.
CPC .......... *H01L 51/56* (2013.01); *H01L 51/5203* (2013.01); *H01L 51/524* (2013.01); *H01L 51/5212* (2013.01); *H01L 2251/301* (2013.01); *H01L 2251/303* (2013.01); *H01L 2251/5338* (2013.01); *H01L 2251/5369* (2013.01)

(58) Field of Classification Search
CPC ............... H01L 51/5212; H01L 51/524; H01L 2251/301; H01L 2251/303; H01L 2251/5338; H01L 2251/5369
See application file for complete search history.

(56) References Cited

FOREIGN PATENT DOCUMENTS

| | | | |
|---|---|---|---|
| JP | 2012109255 | A | 6/2012 |
| JP | 2012155177 | A | 8/2012 |
| JP | 2013539192 | A | 10/2013 |
| KR | 101114352 | B1 | 2/2012 |
| WO | 2011093120 | A1 | 8/2011 |
| WO | WO2011093120 | * | 8/2011 |

OTHER PUBLICATIONS

International Preliminary Report on Patentability and Written Opinion of the International Searching Authority corresponding to Application No. PCT/JP2014/081725; dated Jun. 7, 2016.
Korean IP Office Notice of Preliminary Rejection for corresponding Application No. 10-2016-7007017; dated Jul. 17, 2017.

* cited by examiner

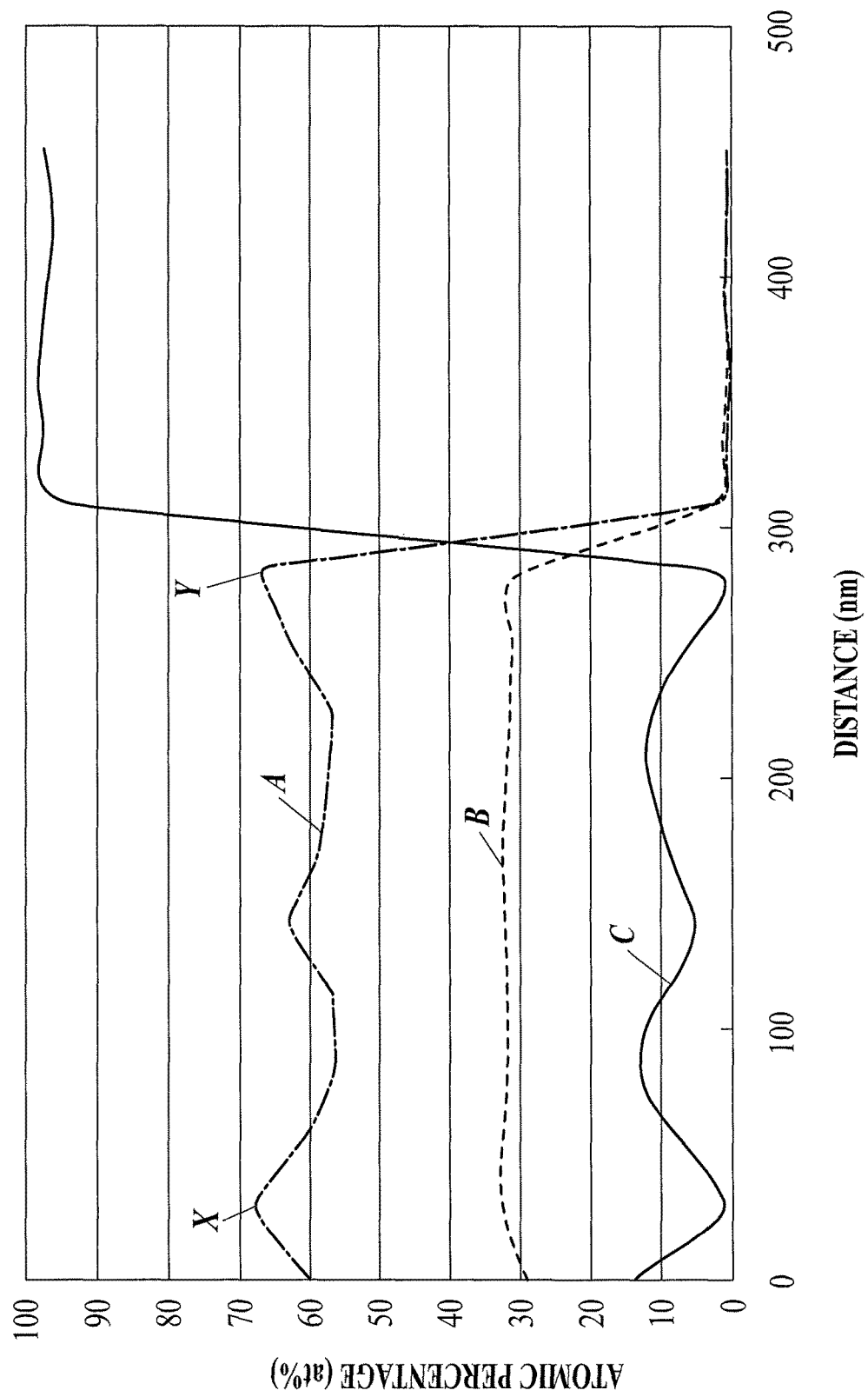

ORGANIC ELECTROLUMINESCENCE ELEMENT

CROSS REFERENCE TO RELATED APPLICATIONS

This is the U.S. national stage of application No. PCT/JP2014/081725, filed on Dec. 1, 2014. Priority under 35 U.S.C. § 119(a) and 35 U.S.C. § 365(b) is claimed from Japanese Application No. 2013-252693, filed Dec. 6, 2013, the disclosure of which is also incorporated herein by reference.

TECHNICAL FIELD

The present invention relates to an organic electroluminescent element achieving a high-temperature storage stability and improved light-emission efficiency while maintaining flexible aptitude.

BACKGROUND

In recent years, in the field of electronic devices, there have been added requirements of long-term reliability, flexible shape, and enabling curved display in addition to light weight and large size. The used of a film substrate such as a transparent plastic has been started in place of a glass substrate having a heavy weight and difficult in making a large size.

However, a film substrate such as a transparent plastic has a problem of inferior gas barrier property compared with a glass substrate.

It has been known that the function of the electronic device will be deteriorated by the penetrated water vapor and oxygen gas when a substrate of inferior gas barrier property is used.

It has been generally known to use a gas barrier film produced by forming a film having a gas barrier property (a gas barrier layer) on a film substrate. For example, as a gas barrier film used for package material for an object required to be provided with or for a liquid crystal display element, there are a film composed of a film substrate on which silicon oxide or a aluminum oxide is vapor deposited.

It has been reported that a light extraction structure containing a light scatter layer is efficient for the purpose of improving light-emission efficiency of an organic EL (electroluminescence) element (one of electronic devices) (refer to Patent document 1, for example).

When a gas barrier layer or a light scatter layer is formed on a film substrate, it will be produced unevenness on the surface. As a result, when a light-emitting unit having organic functional layers is formed thereon, it may be occurred deterioration of keeping property or short-circuit (electric short) under the environment of high-temperature and high-humidity.

In the first place, it is known that an organic EL element is very sensitive to a small amount of water, oxygen and other organic compounds (such as a remaining solvent). It was proposed a structure having a gas barrier layer directly under an organic functional layer (refer to Patent document 2, for example). It may be a reasonable idea.

However, it has not been disclosed technology to achieve both gas barrier property and bend (curvature) repeating resistance, namely, flexible aptitude. This has not been realized until now.

PRIOR ART DOCUMENTS

Patent Documents

Patent document 1: JP-A No. 2004-296437
Patent document 2: Japan Patent No. 4186688

SUMMARY OF THE INVENTION

Problems to be Solved by the Invention

The present invention has been made in view of the above-described problem and situation. An object of the present invention is to provide an organic electroluminescent element achieving a high-temperature storage stability and improved light-emission efficiency while maintaining flexible aptitude.

Means to Solve the Problems

The present inventors have investigated the reasons of the above-described problems to solve the problems, and found out to provide an organic electroluminescent element achieving a high-temperature storage stability and improved light-emission efficiency while maintaining flexible aptitude. The organic electroluminescent element contains: a film substrate having thereon at least one gas barrier layer, a light scatter layer, at least one smooth layer, and a light-emitting unit containing an organic functional layer interposed between a pair of electrodes, laminated in this order. Thus, the present invention has been achieved.

Namely, the above-described problems relating to the present invention are solved by the following embodiments.
1. An organic electroluminescent element comprising a film substrate having thereon: at least one gas barrier layer, a light scatter layer, at least one smooth layer, and a light-emitting unit containing an organic functional layer interposed between a pair of electrodes, laminated in this order,
wherein the light scatter layer contains a binder and light scatter particles having an average particle size of 0.2 μm or more to less than 1 μm; and
the smooth layer contains an oxide or a nitride of silicon or niobium as a main component.
2. An organic electroluminescent element comprising a film substrate having thereon: at least one gas barrier layer, a light scatter layer, at least one smooth layer, and a light-emitting unit containing an organic functional layer interposed between a pair of electrodes, laminated in this order,
wherein the light scatter layer contains a binder and light scatter particles having an average particle size of 0.2 μm or more to less than 1 μm; and
the smooth layer has a water vapor permeability of less than 0.1 g/(m$^2$·24 h).
3. An organic electroluminescent element described in the embodiment 2,
wherein the smooth layer contains an oxide or a nitride of silicon or niobium as a main component.
4. An organic electroluminescent element described in any one of the embodiments 1 to 3,
wherein the smooth layer contains a reaction product of an inorganic silicon compound or an organic silicon compound, or niobium oxide as a main component.
5. An organic electroluminescent element described in any one of the embodiments 1 to 4,
wherein a water vapor permeability of the gas barrier layer (Wg), a water vapor permeability of the light scatter layer (Ws), and a water vapor permeability of the smooth layer (Wf) satisfy the following conditional expression $$Wg \leq Wf < Ws$$

6. An organic electroluminescent element described in any one of the embodiments 1 to 4,
   wherein the smooth layer has a refractive index in the range of 1.7 to 3.0.
7. An organic electroluminescent element described in any one of the embodiments 1 to 6,
   wherein the smooth layer contains nanoparticles having a refractive index in the range of 1.7 to 3.0.
8. An organic electroluminescent element described in any one of the embodiments 1 to 7,
   wherein the smooth layer has a first smooth layer and a second smooth layer in a sequential order from a side of the light-emitting unit;
   the first smooth layer contains an oxide or a nitride of silicon or niobium as a main component; and
   the second smooth layer is formed with a wet process.
9. An organic electroluminescent element described in the embodiment 8,
   wherein the first smooth layer is formed with a dry process.
10. An organic electroluminescent element described in the embodiments 8 or 9,
    wherein the first smooth layer is formed with a wet process.
11. An organic electroluminescent element described in any one of the embodiments 8 to 10,
    wherein at least one of the first smooth layer and the second smooth layer contains nanoparticles having a refractive index in the range of 1.7 to 3.0.
12. An organic electroluminescent element described in any one of the embodiments 8 to 11,
    wherein the first smooth layer and the second smooth layer both respectively have a refractive index in the range of 1.7 to 3.0.
13. An organic electroluminescent element described in any one of the embodiments 1 to 12,
    wherein the light scatter layer is patterned in a sealing region.

Effects of the Invention

By the above-described means of the present invention, it can provide an organic electroluminescent element achieving a high-temperature storage stability and improved light-emission efficiency while maintaining flexible aptitude.

A formation mechanism or an action mechanism of the effects of the present invention is not clarified. However, it is supposed as follows.

Since a light-emission efficiency of an organic EL element will be decreased due to confinement or deactivation of the emitted light in the inside of the element, it is an effective embodiment to place a light extracting structure between the substrate and the electrode. However, such light extracting structure utilizes particles enabling to produce Mie scattering or geometrical scattering, or unevenness of 3 dimensions. These structures are required to be placed between the substrate and the electrode. As a method for forming these structures, various types of methods such as a coating process and a nanoimprint method have been proposed. Many effective methods have been proposed for the glass substrate in the past.

On the other hand, when the above-described light extracting structure is intended to form on a flexible substrate (for example, a film substrate), a high-temperature treatment cannot be done during the formation of the above-described structure due to the small heat resistance of the film substrate. That is the most disadvantage of the film substrate. As a result, a small amount of gas is emitted from the material composing these light extracting structures. An organic EL element is very sensitive to water or the gases emitted from various materials. When an organic EL element is exposed to these, degradation of the initial property of the production will be accelerated. As a result, light-emission efficiency and a lifetime of an organic EL element will be lowered.

An organic EL element of the present invention has a highly effective light extracting structure capable of being formed on a film, and it has a smooth layer made of an oxide or a nitride of silicon or niobium on the light extracting structure. By this specific composition, a predetermined gas barrier property can be obtained without hindering the light extracting efficiency and the flexibility. Consequently, it is supposed that the high-temperature storage stability of a light-emitting element formed on a film substrate is increased and light-emission efficiency is also improved.

BRIEF DESCRIPTION OF DRAWINGS

FIG. 7 is a graph indicating of a profile of each element in a layer thickness direction of a gas barrier layer for comparison to the present invention with XPS depth element analysis.

EMBODIMENTS TO CARRY OUT THE INVENTION

Figure 1:
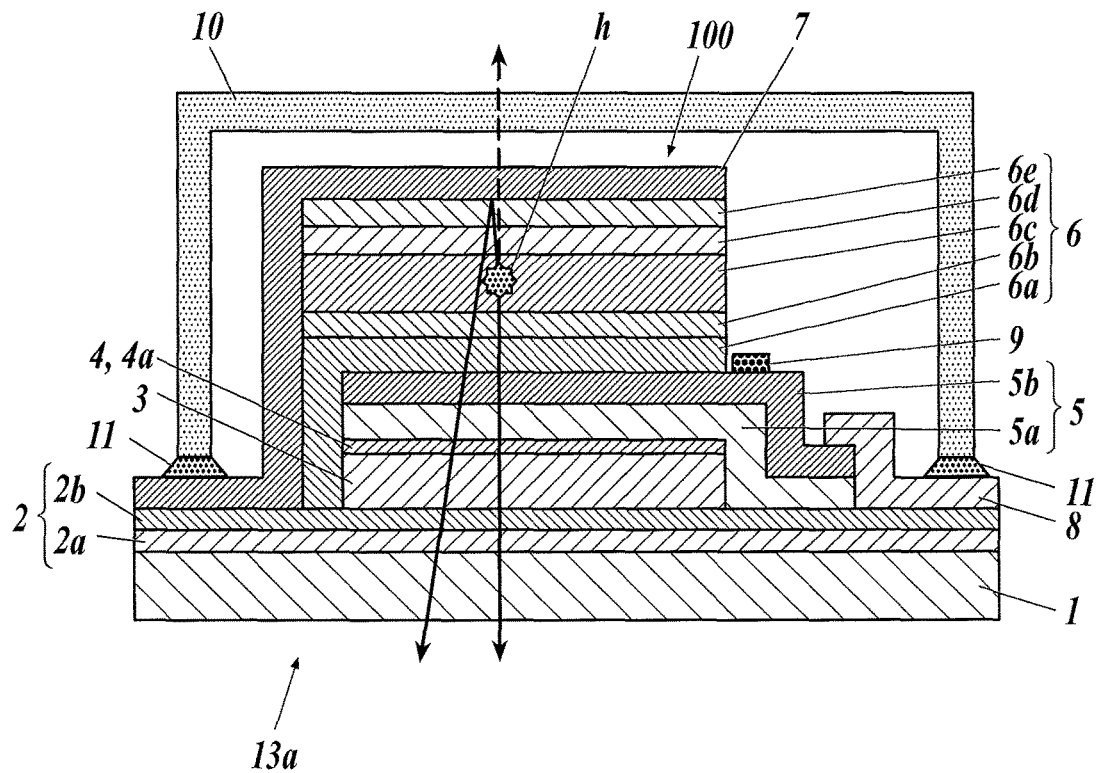
FIG. 1 is a cross-sectional view illustrating a schematic constitution of an organic EL element.

An organic electroluminescent element of the present invention contains a film substrate having thereon: at least one gas barrier layer, a light scatter layer, at least one smooth layer, and a light-emitting unit containing an organic functional layer interposed between a pair of electrodes, laminated in this order, wherein the light scatter layer contains a binder and light scatter particles having an average particle size of 0.2 μm or more to less than 1 μm; and the smooth layer contains an oxide or a nitride of silicon or niobium as a main component, or the smooth layer has a water vapor permeability of less than 0.1 g/(m2·24 h). This feature is a common technical feature of the invention according to the embodiments 1 to 13.

In the present invention, in order to effectively prevent penetration of water to result in achieving a prolonged lifetime of an organic EL element, the smooth layer preferably contains a reaction product of an inorganic silicon compound or an organic silicon compound, or niobium oxide as a main component.

In view of storage stability for a long period of time, a water vapor permeability of the gas barrier layer (Wg), a water vapor permeability of the light scatter layer (Ws), and a water vapor permeability of the smooth layer (Wf) satisfy the following conditional expression.

$$Wg \leq Wf < Ws$$

Although it is preferable that the absolute value of Wg is small, the gas permeability of the scatter layer is theoretically large. On the other hand, it is theoretically possible to improve the performance by making Wf to be the lowest among the three. However, the change of the amount of the adsorbed gas of the scatter layer may induce decrease of light-emission efficiency of an element, or degradation of film strength. Therefore, it is preferable to make Wg to be the smallest. In order to make Wg to be small, an effective embodiment is to place a gas barrier layer on the opposite side of the transparent substrate, and to use repeatedly two constituting members composed of a support and a gas barrier layer.

In view of preventing deterioration of light extracting efficiency by the smooth layer, it is preferable that the smooth layer contains nanoparticles having a refractive index in the range of 1.7 to 3.0.

The irregularity of the surface of the formed light scatter layer will be decreased by placing a gas barrier layer. Therefore, it is preferable that: the smooth layer has a first smooth layer and a second smooth layer in a sequential order from a side of the light-emitting unit; the first smooth layer contains an oxide or a nitride of silicon or niobium as a main component; and the second smooth layer is formed with a wet process.

In view of decreasing the amount of water or gasses emitted from various materials penetrating the layers adjacent to the light-emitting element/electrodes, it is preferable that the first smooth layer is formed with a dry process.

Further, in view of improving smoothness of the layers adjacent to the light-emitting element/electrodes, it is preferable that the first smooth layer is formed with a wet process.

In view of preventing deterioration of light extracting efficiency by the smooth layer, it is preferable that the smooth layer has a refractive index in the range of 1.7 to 3.0. For achieving this property, it is preferable that the smooth layer contains nanoparticles having a refractive index in the range of 1.7 to 3.0.

From the viewpoint of improving performance, it is best to achieve the following two: the property of decreasing the amount of water or gasses emitted from various materials penetrating the layers adjacent to the light-emitting element/ electrodes; and the property of high smoothness of this layers. From this point, it is preferable that the smooth layer of the present invention is composed of a plurality of layers. These layers may be formed with the same process, or with a different process. These layers may be formed with the same material, or with a different material. As examples of the combination, it can be cited: lamination with a wet process; lamination with a dry process; lamination with a dry process on a layer formed with a wet process; and lamination with a wet process on a layer formed with a dry process. A preferable embodiment is forming a second smooth layer (a layer near to the light scatter layer) with a wet process, and forming a first smooth layer with a dry process.

In the present invention, in order to effectively prevent penetration of water to result in achieving a prolonged lifetime of an organic EL element, the smooth layer preferably contains niobium oxide, or a reaction product of an inorganic silicon compound or an organic silicon compound as a main component. From the viewpoint of light-emission efficiency, the first smooth layer and the second smooth layer both respectively have a refractive index in the range of 1.7 to 3.0. In order to achieve this property, it is particularly preferable that the first smooth layer contains niobium oxide as a main component, and the second smooth layer contains a reaction product of an inorganic silicon compound or an organic silicon compound as a main component.

From the viewpoint of protecting the light scatter layer with a minimum amount of the smooth layer, and preventing penetration of water vapor in the air, it is preferable that the light scatter layer is patterned in a sealing region.

The present invention and the constitution elements thereof, as well as configurations and embodiments, will be detailed in the following. In the present description, when two figures are used to indicate a range of value before and after "to", these figures are included in the range as a lowest limit value and an upper limit value.

<<Constitution of Organic EL Element>>

An organic EL element of the present invention contains a film substrate having thereon: at least one gas barrier layer, a light scatter layer, at least one smooth layer, and a light-emitting unit containing an organic functional layer interposed between a pair of electrodes, laminated in that order.

Here, "a light-emitting unit" indicates a light-emitting body (unit) mainly composed of organic functional layers such as a light-emitting layer, a hole transport layer, and an electron transport layer. They incorporate various types of organic compounds described later. The light-emitting body is interposed between a pair of electrodes composed of an anode and a cathode. The hole supplied from the anode and the electron supplied from the cathode will be recombined in the light-emitting body to result in producing light.

An organic EL element of the present invention may be provided with a plurality of the light-emitting unit according to the required light-emission color.

Specifically, as illustrated in FIG. 1, the organic EL element 100 of the present invention is preferably disposed of the following on a film substrate 1: a gas barrier 2, a light scatter layer 3, a smooth layer 4 (4a), an anode (a transparent electrode) 5, a light-emitting unit 6 composed of organic materials, and a cathode (an opposite electrode) 7, which are laminated in that order. This is a preferable embodiment.

An extraction electrode 8 is provided at one end of the transparent electrode 5 (electrode layer 5b). The transparent electrode 5 is electrically connected to an external power supply (not illustrated in the figure) through the extraction electrode 8. The organic EL element 100 is configured such that generated light (emitted light h) is extracted at least from the film substrate 1.

The organic EL element 100 may have any layer structure, for example, a typical layer structure. Throughout the specification, the transparent electrode 5 functions as an anode and the opposite electrode 7 functions as a cathode. In this case, an exemplary configuration of the light-emitting unit 6 includes: a hole injection layer 6a/a hole transport layer 6b/a light-emitting layer 6c/an electron transport layer 6d/and an electron injection layer 6e, sequentially disposed on the transparent electrode 5 as an anode. It is essential existence of the light-emitting layer 6c composed of at least an organic material among these layers. The hole injection layer 6a and the hole transport layer 6b may be disposed of as a hole transport-injecting layer. The electron transport layer 6d and the electron injection layer 6e may be disposed of as an electron transport-injecting layer. In the light-emitting unit 6, the electron injection layer 6e may be composed of an inorganic material, for example.

The light-emitting unit 6 may include a hole blocking layer and an electron blocking layer disposed in required places if necessary. The light-emitting layer 6c may include luminous sublayers of different colors generating luminescent lights in the corresponding wavelength regions. These luminous sublayers of different colors and a non-luminous intermediate sublayer may be laminated with the non-luminous intermediate sublayer interposed between the luminous sublayers. The intermediate sublayer may function as a hole blocking layer or an electron blocking layer. The opposite electrode 7 or the cathode may have a laminate structure if necessary. In such a laminate configuration, only the portion of the light-emitting unit 6 interposed between the transparent electrode 5 and the opposite electrode 7 corresponds to the light emission region of the organic EL element 100.

In the layer configuration as described above, an auxiliary electrode 9 may be disposed on the electrode layer 5b of the transparent electrode 5 to reduce the resistance of the transparent electrode 5.

Figure 2:
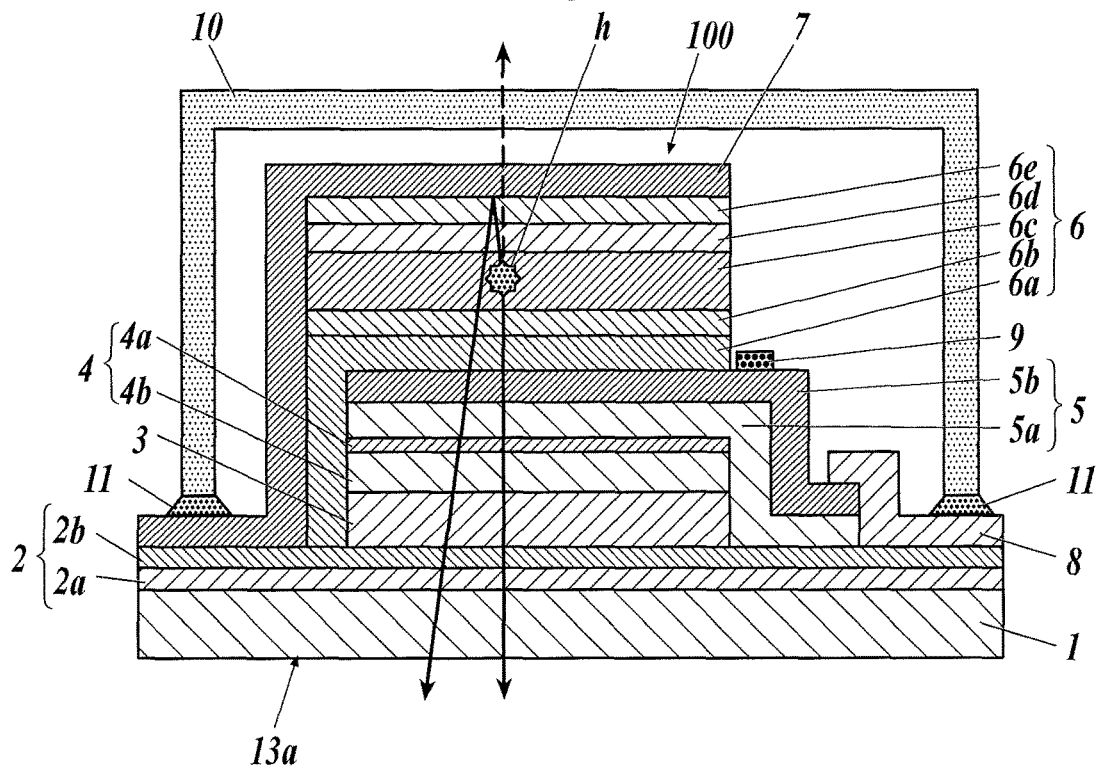
FIG. 2 is a cross-sectional view illustrating a schematic constitution of an organic EL element.

An organic EL element 100 of the present invention may have a smooth layer 4 composed of a smooth layer 4a (hereafter, it is called as a first smooth layer) and a smooth layer 4b (hereafter, it is called as a second smooth layer) in this order from the side of the light-emitting unit 6, as illustrated in FIG. 2.

The organic EL element 100 having such a configuration is sealed with a sealing material 10 described later, which is disposed over the film substrate 1 to prevent degradation of the organic light-emitting unit 6 composed of an organic material. The sealing material 10 is fixed to the film substrate 1 with an adhesive 11. The terminals of the transparent electrode 5 (extraction electrode 8) and the opposite electrode 7 are kept insulated on the film substrate 1 by the interposed light-emitting unit 6, and are exposed from the sealing material 10.

An organic EL element of the present invention may be a so-called tandem structure element in which plural light-emitting units each containing at least one light-emitting layer are laminated.

As an example of a representative element constitution of the tandem structure, it can be cited the following constitution.

Anode/First Light-Emitting Unit/Intermediate Layer/Second Light-Emitting Unit/Intermediate Layer/Third Organic Light-Emitting Unit/Cathode Here, the above-described first light-emitting unit, second light-emitting unit, and third organic light-emitting unit may be the same or different. It may be possible that two of the light-emitting units are the same, and the remaining one is different.

In addition, plural light-emitting units each may be laminated directly or they may be laminated through an intermediate layer.

The intermediate layer is also called as: an intermediate electrode, an intermediate conductive layer, a charge generating layer, an electron extraction layer, a connecting layer, and an intermediate insulating layer. Known composing materials may be used as long as it can form a layer which has a function of supplying an electron to an adjacent layer to the anode, and a hole to an adjacent layer to the cathode.

Examples of a material used in an intermediate layer are: conductive inorganic compounds such as ITO (indium tin oxide), IZO (indium zinc oxide), $ZnO_2$, TiN, ZrN, HfN, $TiO_X$, $VO_X$, CuI, InN, GaN, $CuAlO_2$, $CuGaO_2$, $SrCu_2O_2$, $LaB_6$, $RuO_2$, and Al; a two-layer film such as $Au/Bi_2O_3$; a multi-layer film such as $SnO_2/Ag/SnO_2$, ZnO/Ag/ZnO, $Bi_2O_3/Au/Bi_2O_3$, $TiO_2/TiN/TiO_2$, and $TiO_2/ZrN/TiO_2$; fullerene such as $C_{60}$; and a conductive organic layer such as oligothiophene, metal phthalocyanine, metal-free phthalocyanine, metal porphyrin, and metal-free porphyrin. The present invention is not limited to them.

A preferable constitution for a light-emitting unit is a structure of the above-described representative element constitution from which the anode and the cathode are removed. However, the present invention is not limited to that.

Examples of a tandem type organic EL element are described in: U.S. Pat. No. 6,337,492, U.S. Pat. No. 7,420,203, U.S. Pat. No. 7,473,923, U.S. Pat. No. 6,872,472, U.S. Pat. No. 6,107,734, U.S. Pat. No. 6,337,492, WO 2005/009087, JP-A 2006-228712, JP-A 2006-24791, JP-A 2006-49393, JP-A 2006-49394, JP-A 2006-49396, JP-A 2011-96679, JP-A 2005-340187, JP Patent 4711424, JP Patent 3496681, JP Patent 3884564, JP Patent 4213169, JP-A 2010-192719, JP-A 2009-076929, JP-A 2008-078414, JP-A 2007-059848, JP-A 2003-272860, JP-A 2003-045676, and WO 2005/094130. The constitutions of the elements and the composing materials are described in these documents, however, the present invention is not limited to them.

Main constituting components and their preparation method of an organic EL element 100 will be described in the following.

<<Smooth Layer (First Smooth Layer)>>

A first smooth layer 4a according to the present invention is characterized in that: it has oxide or nitride of silicon (Si) or niobium (Nb) as a main component; and it has a water vapor permeability of less than 0.1 $g/(m^2 \cdot 24\ h)$. By these features, it can effectively prevent penetration of gas emitted from a light scater layer 3 and a second smooth layer (described later) and water in the air. At the same time, it can prevent harmful effects of deterioration of keeping property or short-circuit (electric short) under the environment of high-temperature and high-humidity.

Here, "a main component" indicates a component having a maximum constituting ratio among all of the components constituting the first smooth layer 4a.

A water vapor permeability of the first smooth layer 4a is a value determined by the method based on JIS K 7129-1992.

A preferred water vapor permeability is 0.1 $g/(m^2 \cdot 24\ h)$ or less, more preferably, it is 0.01 $g/(m^2 \cdot 24\ h)$ or less, and still more preferably, it is 0.001 $g/(m^2 \cdot 24\ h)$ or less.

A refractive index of the first smooth layer 4a is preferably in the range of 1.7 to 3.0, more preferably, it is in the range of 1.7 to 2.5, and still more preferably, it is in the range of 1.7 to 2.2. A refractive index of the present invention is a value measured at wavelength of 633 nm with an ellipsometer at 25° C.

When the first smooth layer is made of a low refractive material (having a refractive index of less than 1.7), a thinner layer thickness is preferable. Specifically, a preferable layer thickness is less than 100 nm. The first smooth layer of the present invention preferably has a predetermined gas barrier property. By taking this point into consideration, the layer thickness of the continuous film has the lower limit. It is required that the thickness is 5 nm or more, more preferably it is 10 nm or more, and still more preferably it is 30 nm or more.

On the other hand, when the first smooth layer is made of a high refractive material (having a refractive index of 1.7 or more), there is no limitation to the upper limit of the layer thickness. The lower limit is the same as in the case of the above-described layer made of a low refractive material. With the condition that when the first smooth layer absorbs visible light, a thinner layer thickness is preferable. An optimum layer thickness may be determined from the viewpoint of a required gas barrier property and a light extracting efficiency It is preferable that a 100 nm thick layer has small absorption in the entire visible region (it is a value obtained by spectral wavelength measurement with an integrating sphere after removing the total value of T % and R %). Preferably it is less than 10%, more preferably it is less than 5%, still more preferably it is less than 3%, and most preferably it is less than 1%.

Further, in the present invention, the bending resistance of a film having a thickness of 100 nm is important. A PET film is provided with a gas barrier film thereon, and then, a film having a thickness of 100 nm is formed. This sample is subjected to a bending test of repeating 100 times of bending. A preferable result is to generate a crack having a diameter of 30 mmΦ or less, more preferably a diameter of 15 mmΦ or less, and still more preferably a diameter of 10 mmΦ or less.

In the following, as film forming methods, a case of a dry process and a case of a wet process are described separately.
<Film Formation with a Dry Process>

Examples of an oxide or a nitride of silicon and niobium are: reaction products of an inorganic silicon compound and an organic silicon compound, niobium oxide, niobium oxynitride, niobium nitride, niobium oxycarbide, and niobium carbo-nitride.

Examples of a reaction product of an inorganic silicon compound are: silicon oxide, silicon oxynitride, silicon nitride, silicon oxycarbide, and silicon carbo-nitride.

Examples of an organic silicon compound are: hexamethyldisiloxane, 1,1,3,3-tetramethyldisiloxane, vinyl trimethylsilane, trimethylsilane, hexamethyldisilane, methylsilane, dimethylsilane, trimethylsilane, diethylsilane, propylsilane, phenylsilane, vinyl triethoxysilanesilane, vinyltrimethoxysilane, tetramethoxysilane, tetraethoxysilane, phenyltrimethoxysilane, methyltriethoxysilane, and octamethylcyclotetrasiloxane. Among these organic silicon compounds, hexamethyldisiloxan and 1,1,3,3-tetramethyldisiloxane are preferably used from the viewpoint of handling during layer formation and light distribution property of the obtained second gas barrier layer. Further, these organic silicon compounds may be used singly, or may be used in combination of two or more.

When a first smooth layer 4a containing a reaction product of hexamethyldisiloxane is formed, the mole quantity (flow rate) of oxygen is preferably not more than 12 times, which is the stoichiometric ratio, more preferably not more than 10 times that of the hexamethyldisiloxane, which is the raw material gas. With such contents of hexamethyldisiloxane and oxygen, the carbon atoms and hydrogen atoms in the hexamethyldisiloxane that are not completely oxidized are incorporated in the first smooth layer 4a, enabling to form a desired first smooth layer 4a. In this view, the lower limit of the mole quantity (flow rate) of oxygen relative to the mole quantity (flow rate) of hexamethyldisiloxane in the deposition gas is preferably 0.1 times or more of the mole quantity (flow rate) of hexamethyldisiloxane, more preferably 0.5 times or more.

When a first smooth layer 4a made of niobium oxide is formed, the following film forming apparatus may be used. The apparatus contains an RF magnetron plasma generating section and a target composed of niobium oxide ($Nb_2O_5$) to which spattering in made with plasma generated by the RF magnetron plasma generating section. These are connected to a vacuum treating chamber through an introducing section. The film forming apparatus has an RF magnetron spatter source composed of the RF magnetron plasma generating section and the target. An argon gas plasma is produced by the RF magnetron plasma generating section. By applying the voltage to the disk type target, niobium and oxygen atoms are spattered (RF magnetron spattering), and these are adhered to the substrate located in the downstream. Thus film formation can be done.

It may be formed with a method disclosed in JP-A No. 2006-28634. This method uses a niobium metal as a target. At the moment of forming a niobium oxide film on a substrate surface with a spattering method, an introduction amount of reaction gas is adjusted with a plasma emission monitoring (PME) method. By controlling the intensity of plasma generated from the niobium metal, it may be effectively formed a niobium oxide film excellent in film forming rate and realizing an excellent optical property.

Among these, as an oxide or a nitride of silicon and niobium contained in the first smooth layer 4a, specifically preferred are: silicon nitride, silicon oxynitride, and niobium oxide.

When a dry process is used for forming a film, a stoichiometric composition will be hardly realized due to the presence of a small amount of gas beside the introduced gas. Specifically, the most representative stoichiometric composition is $SiO_2$. However, in reality, the formed film has $SiO_x$ (x=1.9 to 2.1) with a composition range. In the present invention, these compounds are treated as $SiO_2$.

The above-described atom number ratio may be determined with a known method. An example thereof is to use an analytical apparatus using an X-ray photoelectron spectroscopy (XPS).

Examples of a dry process are: a vapor deposition method (a resistance heating method, an electron beam vapor deposition (EB) method), a sputtering method and an ion plating method. Any method may be suitably used as long as it can form a film of a low film stress and high density with having small water vapor permeability.
<Film Formation with a Wet Process>

When the first smooth layer 4a is produced with a wet process, it is preferable that the layer contains a silicon dioxide compound that is a reaction product of an inorganic silicon compound. In particular, polysilazane is preferably used for forming this film. However, the present invention is not limited to that, and any known materials may be used.

It may be used polysilazane represented by Formula (A) that is used for a light scatter layer 3.

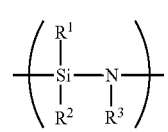

Formula (A)

In Formula, $R^1$, $R^2$, and $R^3$ each independently represent a hydrogen atom, an alkyl group, an alkenyl group, a cycloalkyl group, an aryl group, an alkylsilyl group, an alkylamino group, or an alkoxy group.

From the viewpoint of the density of the first smooth layer 4a, most preferred is a compound having all of $R^1$, $R^2$, and $R^3$ of hydrogen atoms. That is, perhydropolysilazane (PHPS) is particularly preferable.

The first smooth layer 4a is formed by applying a coating liquid containing polysilazane, then, the coated layer is dried and irradiated with vacuum ultraviolet rays.

As an organic solvent to prepare a polysilazane containing coating liquid, it is preferable to avoid an alcohol solvent or water which easily reacts with polysilazane. Example of an applicable organic solvent are: a hydrocarbon solvent such as an aliphatic hydrocarbon, an alicyclic hydrocarbon, and an aromatic hydrocarbons; an halogenated hydrocarbon solvent; and ether such as an aliphatic ether and an alicyclic ether. Specific examples thereof are: a hydrocarbon such as pentane, hexane, cyclohexane, toluene, xylene, Solvesso™, and turpentine; a halogenated hydrocarbon such as methylene chloride and trichloroethane; and ether such as dibutyl ether, dioxane and tetrahydrofuran. These organic solvents may be chosen in accordance with characteristics, such as solubility of polysilazane, and an evaporation rate of an organic solvent, and a plurality of solvents may be mixed.

A concentration of polysilazane in a polysilazane containing coating liquid is different depending on the thickness of the first smooth layer 4a and the pot life of the coating liquid. Preferably, it is in the range of about 0.2 to 35 mass %.

In order to promote the conversion to silicon oxynitride, the polysilazane containing coating liquid for forming a second gas barrier layer may contain additives. Examples thereof are: an amine catalyst, and a metal catalyst (Pt compound such as Pt acetyl acetonate, a Pd compound such as propionic acid PD, a Rh compound such as Rh acetyl acetonate). In the present invention, an amine catalyst is particularly preferable. Specific examples of an amine catalyst are: N,N-diethylethanolamine, N,N-dimethylethanolamine, triethanolamine, triethylamine, 3-morpholinopropylamine, N,N,N',N'-tetramethyl-1,3-diaminopropane, and N,N,N',N'-tetramethyl-1,6-diaminohexane.

An added amount of these catalyst to polysilazane is preferably in the range of 0.1 to 10 mass % with respect to the total mass of the coating liquid for forming a second gas barrier layer. More preferably, it is in the range of 0.2 to 5 mass %, and still more preferably, in the range of 0.5 to 2 mass %. By making the concentration of a catalyst in this range, it is possible to avoid excessive formation of silanol due to a rapid advance in reaction such as decrease of a layer density and increase of layer defects.

A conventionally known appropriate wet coating method, may be adopted as a coating method of a polysilazane containing coating liquid. Specific examples of a coating method include: a roller coat method, a flow coat method, an inkjet method, a spray coat method, a printing method, a dip coat method, a casting film forming method, a bar coat method and a gravure printing method.

A coating thickness may be appropriately set up according to the purpose. For example, a coating thickness may be set up to be in the range of 20 nm to 2 μm, more preferably, it is in the range of 30 nm to 1.5 μm, still more preferably, it is in the range of 40 nm to 1 μm.

<Excimer Treatment>

The first smooth layer 4a according to the present invention is subjected to a process in which a polysilazane containing layer is irradiated with vacuum ultraviolet (VUV) rays. At least a part of polysilazane is reformed to silicon oxynitride by this process.

In a vacuum ultraviolet ray irradiation process of the present invention, illuminance of the aforesaid vacuum ultraviolet rays which are received at a coated layer surface of a polysilazane coated layer is preferably in the range of 30 to 200 mW/cm$^2$, and more preferably, it is in the range of 50 to 160 mW/cm$^2$. When it is 30 mW/cm$^2$ or more, the reforming efficiency will not be decreased. When it is 200 mW/cm$^2$ or less, there will not occur concern of producing ablation in the coated layer or giving damage to the substrate.

An amount of irradiation energy (irradiation amount) of vacuum ultraviolet rays at a polysilazane coated layer surface is preferably in the range of 200 to 10,000 mJ/cm$^2$, more preferably, it is in the range of 500 to 5,000 mJ/cm$^2$. When it is 200 mJ/cm$^2$ or more, sufficient reforming will be done. When it is 10,000 mJ/cm$^2$ or less, there will not occur concern of producing crack due to over reforming or thermal deformation of the substrate.

As a vacuum ultraviolet ray source, the above-described rare gas excimer lamp is preferably used.

Oxygen is required for the reaction during ultraviolet ray irradiation. Since a vacuum ultraviolet ray is absorbed by oxygen, efficiency during the step of ultraviolet ray irradiation is likely to decrease. Therefore, irradiation of the vacuum ultraviolet rays is preferably carried out at a concentration of oxygen and water vapor being as low as possible. That is, an oxygen concentration during a vacuum ultraviolet ray irradiation is preferably in the range of 10 to 10,000 ppm, more preferably, it is in the range of 50 to 5,000 ppm, and still more preferably, it is in the range of 1,000 to 4,500 ppm.

As a gas which is used during vacuum ultraviolet ray irradiation and fills an irradiation atmosphere, a dry inactive gas is preferably used. In particular, a dry nitrogen gas is preferable from the viewpoint of cost. The adjustment of an oxygen concentration may be made by measuring a flow rate of an oxygen gas and an inactive gas introduced in an irradiation chamber and by changing a flow rate ratio.

<Nanoparticles>

It is preferable that the first smooth layer 4a is formed by incorporating nanoparticles having a refractive index of 1.7 to 3.0 in a binder. When the nanoparticles have a refractive index of 1.7 or more, the targeted effect of the present invention can be sufficiently attained. When the nanoparticles have a refractive index of 3.0 or less, they will reduce multiple scattering within the layer to prevent degradation of the transparency.

In the present invention, "nanoparticles" are defined as fine particles of nanometer order (colloidal particles) that are dispersed in a dispersion medium. The particles are in the state of a separate particle (primary particles) or in the state of an aggregated particle (secondary particles). In the present invention, "nanoparticles" are defined by including primary particles and secondary particles.

The lower limit of the particle size of the nanoparticles is preferably 5 nm or more, more preferably 10 nm or more, still more preferably 15 nm or more. The upper limit of the particle size of the nanoparticles is preferably 70 nm or less, more preferably 60 nm or less, still more preferably 50 nm or less. By setting the particle size of the nanoparticles to be in the range of 5 to 60 nm, high-transparency of the layer can be achieved. This is preferable. The particle size can have any distribution as long as it does not deteriorate the advantageous effects of the present invention. The distribution of the particle size may be wide or narrow, or may have two or more distribution peaks.

In view of stability, the nanoparticles contained are preferably made of TiO$_2$ (titanium dioxide sol). Particularly preferred TiO$_2$ is of a rutile type, which has a catalytic activity lower than that of an anatase type to enhance the weatherability of the first smoothing layer 4a and adjacent layers, and has a refractive index higher than that of the anatase type.

The titanium dioxide sol usable in the present invention may be prepared by referring to the documents of JP-A Nos. S63-17221, H7-819, H9-165218, and H11-43327, for example.

As described above, the first smooth layer 4a is formed with a wet process or a dry process. These two processes may be combined. To use one composition or to combine different compositions by using a method of one process is a most preferable embodiment. Such complex film or laminated film will exhibit the function and the effect of the smooth layer as a hole.

When a wet process is used, the film after coated and subjected to drying, curing, and reforming is required to form a component of the present invention. In this case, the content of the component may have a gradient from the surface to the depth direction.

In view of enabling to achieve the above-described properties, silicon oxynitride, silicon nitride, and niobium oxide are specifically preferable for a dry process. As a coating material for a wet process, excimer curing of polysilazane under a low oxygen density will produce a specific high refractive index. This is preferable. Further, the addition of nanoparticles to a coating material enables to adjust the refractive index. The application of the combination of the nanoparticles is specifically suitable.

<<Other Smoothing Layer (Second Smooth Layer)>>

The second smooth layer 4b according to the present invention is provided in order to mainly avoid the defects such as deterioration in storage under high-temperature and high-humidity, or electric short circuit (short) caused by unevenness of the surface of the gas barrier layer 2 or the light scatter layer 3, when the light-emitting unit 6 is provided on the gas barrier layer 2 or the light scatter layer 3. The second smooth layer 4b is a layer interposed between the light scatter layer 3 and the first smooth layer 4a.

It is important that the second smooth layer 4b has a sufficient flatness to form an excellent transparent electrode 5 thereon. The surface of the second smooth layer 4b preferably has an arithmetic average roughness Ra in the range of 0.5 to 50 nm, more preferably it is 30 nm or less, still more preferably it is 10 nm or less, and most preferably it is 5 nm or less. By making the arithmetic average roughness Ra to be in the range of 0.5 to 50 nm, it can prevent the defect such as short of the laminated organic EL element.

Here, the term "arithmetic average roughness Ra" of the surface refers to an arithmetic average roughness in accordance with HS B0601-2001. The average surface roughness Ra (arithmetic average roughness Ra) is determined by atomic force microscopy (AFM). The irregularity of a surface is continuously measured with a detector equipped with a stylus having a micro tip with an extremely small radius to calculate the roughness from the cross-sectional curve of the irregularity. The fine irregularity over a 10 μm section on the surface is measured three times with the stylus having a micro tip with an extremely small radius to average the three roughness values determined from fluctuations caused by the fine irregularity.

The emitted light h from the light-emitting unit 6 enters the second smooth layer 4b. Therefore, it is preferable that an average refractive index nf of the second smooth layer 4b is near to a refractive index of the organic functional layer contained in the light-emitting unit 6. Specifically, since the light-emitting unit 6 contains an organic material having a high refractive index, it is preferable that the second smooth layer 4b is a high refractive layer having an average refractive index nf from 1.5 or more, or in particular, from 1.65 to less than 2.5 at the shortest local maximum wavelength among the emission maximums of the emitted light h from the light-emitting unit 6. When the average refractive index nf is in the range of 1.65 to less than 2.5, it may be formed with a single material or may be formed with mixed materials. In the case of a mixed system, an average refractive index nf of the second smooth layer 4b is determined by addition of the values obtained from the refractive index of each material multiplied by the mixture ratio. In this case, the refractive index of each material may be 1.65 or less, or it may be 2.5 or more. Only requirement is that an average refractive index nf of the layer made of the mixed materials satisfies to be in the range of 1.65 or more to less than 2.5.

Here, "an average refractive index nf" of the second smooth layer 4b is a refractive index of a single material when it is formed with a single material, and it is a calculated refractive index determined by addition of the values obtained from the refractive index of each material multiplied by the mixture ratio when it is formed with mixed materials. The refractive index is determined as follows: the layer is irradiated at 25° C. with a light beam having the shortest local maximum wavelength among the emission maximums of the emitted light h from the light-emitting unit 6, and the refractive index is measured with an Abbe refractometer (made by ATAGO Co., Ltd., DR-M2)

Any known resins may be used without specific limitation for the second smooth layer 4b of the present invention. Examples of the binder include resin films, such as acrylic esters, methacrylic esters, poly(ethylene terephthalate) (PET), poly(butylene terephthalate), poly(ethylene naphthalate) (PEN), polycarbonates (PCs), polyallylates, poly(vinyl chloride) (PVC), polyethylene (PE), polypropylene (PP), polystyrene (PS), nylon (Ny), aromatic polyamides, polyether ether ketones, polysulfone, polyether sulfones, polyimides, and polyetherimides; a heat-resistant transparent film having a basic skeleton of silsesquioxane having an organic-inorganic hybrid structure (product name: Sila-DEC, made by Chisso Corporation); silane compounds containing a perfluoroalkyl group (such as (heptadecafluoro-1,1,2,2-tetradecyl)triethoxysilane); and fluorine-containing copolymers composed of fluorine-containing monomers and cross-linkable monomers. These resins may be used in combination of two or more kinds. Among these resins, preferred are resins having organic-inorganic hybrid structures.

The following hydrophilic resins may also be used. The hydrophilic resins include water-soluble resins, water-dispersible resins, colloidal dispersion resins, and mixtures thereof. Examples of the hydrophilic resins include acrylic, polyester, polyamide, polyurethane, and fluorinated resins, and specific examples include polymers, such as poly(vinyl alcohol), gelatin, poly(ethylene oxide), poly(vinyl pyrrolidone), casein, starch, agar, carrageenan, polyacrylic acid, polymethacrylic acid, polyacrylamide, polymethacrylamide, poly(styrenesulfonate), cellulose, hydroxylethyl cellulose, carboxylmethyl cellulose, hydroxylethyl cellulose, dextran, dextrin, pullulan, and water-soluble poly(vinyl butyral). Among these polymers, preferred is polyvinyl alcohol.

These polymers usable for the binder resins may be used alone or in combination of two or more kind when needed.

Known resin particles (emulsions) may also be suitably used for a binder.

In addition, resins curable by ultraviolet light or electron beams (i.e., mixtures of ionizing radiation-curable resins, thermoplastic resins, and solvents) and thermosetting resins may also be suitably used as the binder.

Binder resins of this type are preferably polymers having saturated hydrocarbon or polyether in the main chain, and more preferably polymers having saturated hydrocarbon in the main chain.

The binder is preferably cross-linked. The polymers having saturated hydrocarbon in the main chain are preferably prepared through a polymerization reaction of ethylenically unsaturated monomers. The cross-linked binder is preferably prepared with a monomer having two or more ethylenically unsaturated groups.

As nanoparticles contained in the binder of the second smooth layer 4b, it can be cited the same nanoparticles and the binder as used for the first smooth layer 4a. The fine particle sol contained in the binder of the second smooth layer 4b may be suitably used.

The thickness of the second smooth layer 4b is required to be sufficiently thick so as to reduce the surface roughness of the light scatter layer 3. On the other hand, it is required to be thin in such a manner to prevent energy loss caused by absorption of light An example of a method for forming the second smooth layer 4b is as follows. After forming a light scatter layer 3, mixing a dispersion liquid dispersed with nano $TiO_2$ particles with a resin solution, and the mixture is filtered with a filter to obtain a second smooth layer 4b producing solution. Then, this solution is applied on the light scatter layer 3, and it is dried and heated. Thus, the second smooth layer 4b is produced.

<<Light Scatter Layer>>

It is preferable that the light scatter layer 3 is a high refractive layer having an average refractive index of from 1.5 or more, or in particular, from 1.65 to less than 2.5 at the shortest local maximum wavelength among the emission maximums of the emitted light h from the light-emitting unit 6. In this case, the light scatter layer 3 may be formed with a single material having an average refractive index ns from 1.6 to less than 2.5, or it may be formed with mixed materials to achieve a film having an average refractive index ns from 1.6 to less than 2.5. In the case of a mixed system, an average refractive index ns of the scatter layer 3 is determined by addition of the values obtained from the refractive index of each material multiplied by the mixture ratio. In this case, the refractive index of each material may be less than 1.65, or it may be 2.5 or more. Only requirement is that an average refractive index ns of the layer made of the mixed materials satisfies to be in the range of 1.65 or more to less than 2.5.

Here, "an average refractive index ns" is a refractive index of a single material when it is formed with a single material, and it is a calculated refractive index determined by addition of the values obtained from the refractive index of each material multiplied by the mixture ratio when it is formed with mixed materials.

The light scatter layer 3 is preferably a layer utilizing a difference of refractivity between the low refractive binder as a layer medium and the high refractive light scatter particles contained in the layer medium.

The light scatter layer 3 is a layer enabling to improve the light extraction efficiency. It is preferable that it is formed on the outmost surface at the side of the transparent electrode 5 on the gas barrier layer 2 on the film substrate 1.

The binder having a low refractive index has a refractive index nb of preferably less than 1.9, and more preferably less than 1.6.

Here, a refractive index nb of light scatter particles is a refractive index of a single material when it is formed with a single material, and it is a calculated refractive index determined by addition of the values obtained from the refractive index of each material multiplied by the mixture ratio when it is formed with mixed materials.

The light scatter particles having a high refractive index has a refractive index np of preferably less than 1.5 or more, more preferably 1.8 or more, and most preferably 2.0 or more.

Here, a refractive index np of a binder is a refractive index of a single material when it is formed with a single material, and it is a calculated refractive index determined by addition of the values obtained from the refractive index of each material multiplied by the mixture ratio when it is formed with mixed materials.

One of the roles of the light scatter particles having a high refractive index in the light scatter layer 3 is a light scatter function of the guided-wave light. For achieving that role, it is required to improve a light scatter property. In order to improve a light scatter property, the following are conceivable: to increase the difference of refractivity between the high refractive light scatter particles and the binder; to increase the layer thickness; and to increase the density of particles. Among these, to increase the difference of refractivity between the inorganic particles and the binder is the most effective method for achieving small trade-off between other properties.

The difference of refractivity between the resin material (binder) as a layer medium and the high refractive light scatter particles |nb−np| is preferably 0.2 or more, and more preferably 0.3 or more. When the difference of refractivity between the layer medium and the light scatter particles |nb−np| is 0.3 or more, a light scatter effect will be produced at the interface of the layer medium and the light scatter particles. When the difference of refractivity |nb−np| is larger, refraction at the interface will be increased, and an improved light scatter effect will be obtained. This is preferable.

Specifically, it is preferable that an average refractive index ns of the light scatter layer 3 is as high as 1.6 or more to less than 2.5. Therefore, it is preferable that high refractive light scatter particles have a refractive index np of 1.8 or more.

The refractive index is determined in the same manner as the method for the second smooth layer 4b: That is: the layer is irradiated at 25° C. with a light beam having the shortest local maximum wavelength among the emission maximums of the emitted light h from the light-emitting unit 6, and the refractive index is measured with an Abbe refractometer (DR-M2, made by ATAGO Co., Ltd.)

As described above, the light scatter layer 3 is a layer diffusing light by the difference of refractivity between the layer medium and the light scatter particles. Therefore, it is required that the contained light scatter particles will not give a harmful effect to other layers, and at the same time, they will scatter the emitted light from the light-emitting unit 6.

Here, "scatter" is a condition of the light scatter layer 3 having a haze value (proportion of the scattering transmittance to the total light transmittance) of 20% or more, more preferably 25% or more, and still more preferably 30% or more. A haze value of 20% or more can enhance luminescence efficiency.

The haze value refers to a physical property expressed by a numeric value calculated in consideration of: (i) the effect of the difference in refractive index between the compositions in the layer; and (ii) the effect of the shape of the surface of the layer. Through control of the surface roughness of the layer in the range of less than a predetermined value, a haze value independent of the effect (ii) may be attained.

Specifically, the haze value may be measured by Haze mater NDH-2000 (made by Nippon Denshoku Industries Co. Ltd.)

For example, a light scatter property may be improved by adjusting the particle size, and the defect such as a short circuit will be controlled. Specifically, it is preferable to use transparent light scattering particles having a particle size equal to or more than a particle size enabling generation of Mie scattering in the visible light region. In the present invention, the average particle size is 0.2 μm or more.

On the other hand, the upper limit of the average particle size is less than 1 μm. When a larger particle size is used, it is required to increase a thickness of the first smoothing layer 4a and the second smoothing layer 4b for smoothing the roughness of the light scattering layer 3 containing the light scattering particles. This is not preferable in view of increasing a load on production steps and absorption of light in the layer.

The light scatter layer 3 may contain plural kinds of particles. It is preferable to use plural kinds of the above-described light scatter particles. And, other kinds of light scatter particles than the particles described above may be in combination. In this case, as other kinds of light scatter particles except for the light scatter particles according to the present invention, it is preferable that at least one kind of them is particles having an average particle size in the range of 100 nm to 3 μm without containing particles having an average particle size of larger than 3 μm. And it is more preferable that at least one kind of them is particles having an average particle size in the range of 200 nm to 1 μm without containing particles having an average particle size of larger than 1 μm.

An average particle size of these particles may be measured with an apparatus UPA-EX150 (made by Nippon Denshoku Industries Co. Ltd.) making use of a dynamic light scatter method or with an image treatment for the electron microscopic picture.

Any type of light scattering particles may be appropriately selected according to the purpose, and may be organic or inorganic nanoparticles. Among these particles preferred are inorganic nanoparticles having high refractive indices.

Examples of organic nanoparticles having high refractive indices include beads of poly(methyl methacrylate), acrylic-styrene copolymers, melamines, polycarbonates, styrene, crosslinked polystyrene, poly(vinyl chloride), and benzoguanamine-melamine formaldehyde.

Examples of inorganic nanoparticles having high refractive indices include inorganic particles of at least one oxide selected from the group consisting of oxides of zirconium, titanium, indium, zinc, antimony, cerium, niobium, and tungsten. Specific examples of such inorganic oxide particles include $ZrO_2$, $TiO_2$, $BaTiO_3$, $In_2O_3$, $ZnO$, $Sb_2O_3$, ITO, $CeO_2$, $Nb_2O_5$, and $WO_3$. Among these particles, preferred are $TiO_2$, $BaTiO_3$, $ZrO_2$, $CeO_2$, and $Nb_2O_5$, and more preferred is $TiO_2$. Preferred $TiO_2$ is of a rutile type, which has a catalytic activity lower than an anatase type to enhance the weatherability of the high-refractive index layer or adjacent layers, and has a refractive index higher than that of the anatase type.

Since these particles are contained in a light scattering layer 3 with a high refractive index, surface treated particles or surface-untreated particles may be selected according to the dispersibility of the particles in a dispersion described later or the stability of the dispersion.

Specific examples of materials used in the surface treatment include different inorganic oxides, such as silicon oxide and zirconium oxide; metal hydroxides, such as aluminum hydroxide; and organic acids, such as organosiloxane and stearic acid. These surface treating materials may be used alone or in combination of plural kinds. Among these surface treating materials, preferred are different inorganic oxides and/or metal hydroxides, more preferred are metal hydroxides in view of obtaining a stable dispersion liquid.

In inorganic oxide particles coated with the surface treating material, the coating amount of the surface treating material (typically, the coating amount is represented by the proportion of the mass of the surface treating material applied to the surfaces of the particles to the mass of the particle) is preferably 0.01 to 99 mass %. A coating amount of the surface treating material within this range can sufficiently attain an effect of enhancing the dispersibility of particles and the stability of the dispersion due to the surface treatment. And it can improve light extraction efficiency by the light scattering layer 3 with a high refractive index.

Besides these high-refractive index materials, quantum dots described in WO 2009/014707 and U.S. Pat. No. 6,608,439 can also be suitable for use.

The high-refractive index particles are preferably disposed on or near the interface between the light scattering layer 3 and the first smoothing layer 4a or the second smoothing layer 4b in a thickness substantially equal to the average particle size of the light scattering particle. The particles thus disposed can scatter evanescent light totally reflected within the first smoothing layer 4a or the second smoothing layer 4b and leaked in the light scattering layer 3, enhancing light extraction efficiency.

The content of the high-refractive index particle in the light scattering layer 3 defined as a volume filling rate is within the range of preferably 1.0 to 70%, more preferably 5.0 to 50%. Such a content can generate inhomogeneous distribution of the refractive index on the interface between the light scattering layer 3 and the first smoothing layer 4a or the second smoothing layer 4b to increase the amount of light to be scatted, enhancing light extraction efficiency.

As a method for forming a light scatter layer 3, it can be formed by the following. When a layer medium is a resin material, the above-described light scatter particles are dispersed in a resin material (polymer) solution (a solvent is selected in which particles are not resolved), then the dispersion is coated on a film substrate 1.

These light scatter particles are practically polydisperse particles, and it is difficult to arrange regularly. As a result, even if there locally appears a diffraction effect, mostly, they will change the direction of light and improve light extraction effect.

<Binder>

As binders usable for the scatter payer 3, it can be cited the resins used for the second smooth layer 4b.

In the present invention, compounds which can form metal oxides, metal nitrides, or metal oxide nitrides by irradiation with ultraviolet light under a specific atmosphere may be particularly suitably used. The compounds suitable for the present invention are preferably compounds that may be reformed at relatively low temperature, which are described in JP-A No. H8-112879.

Specific examples of such compounds include polysiloxanes having Si—O—Si bonds (including polysilsesquioxane), polysilazanes having Si—N—Si bonds, and polysiloxazanes having both Si—O—Si bonds and Si—N—Si bonds. These compounds may be used in combination. Two or more different compounds may be sequentially or simultaneously deposited.

The thickness of the scatter payer 3 is required to be a certain thickness in order to secure the light path length for generating scatter. On the other hand, it is required to be thin in order to prevent energy loss due to absorption of light. Specifically, it is preferably in the 0.1 to 5 μm, and more preferably in the 0.2 to 2 μm.

(Polysiloxane)

The polysiloxanes used in the light scatter layer 3 may include general structure units $[R_3SiO_{1/2}]$, $[R_2SiO]$, $[RSiO_{3/2}]$, and $[SiO_2]$. In the formulas, R is independently selected from the group consisting of a hydrogen atom, an alkyl group having 1 to 20 carbon atoms (such as methyl, ethyl, and propyl), an aryl group (such as phenyl), and an unsaturated alkyl group (such as vinyl). Specific examples of polysiloxane groups include $[PhSiO_{3/2}]$, $[MeSiO_{3/2}]$, $[HSiO_{3/2}]$, [MePhSiO], $[Ph_2SiO]$, [PhViSiO], $[ViSiO_{3/2}]$, [MeHSiO], [MeViSiO], $[Me_2SiO]$, and $[Me_3SiO_{1/2}]$. Mixtures or copolymers of different polysiloxanes may also be used.

(Polysilsesquioxane)

Among the polysiloxanes described above, polysilsesquioxane is preferably used in the light scatter layer 3. Polysilsesquioxane includes silsesquioxane in the structure unit. The compound "silsesquioxane" is one of polysiloxanes represented by $[RSiO_{3/2}]$, and is typically prepared through hydrolysis and polycondensation of a compound represented by $RSiX_3$ (where R is a hydrogen atom, an alkyl group, an alkenyl group, an aryl group, or an aralkyl group; X is a halogen or an alkoxy group). Molecules forming silsesquioxane typically have an amorphous structure, a ladder structure, a cage structure, or a partially open cage structure (cage structure from one silicon atom is removed or a cage structure in which silicon-oxygen bonds are partially cut).

Among these polysilsesquioxanes, the so-called hydrogen silsesquioxane polymers are preferably used. Examples of the hydrogen silsesquioxane polymers include hydride siloxane polymers represented by a formula $HSi(OH)_x(OR)_yO_{z/2}$ (where R's each represent an organic group or a substituted organic group; R forms a hydrolytic substituent if R bonded through an oxygen atom to silicon; x=0 to 2, y=0 to 2, z=1 to 3, and x+y+z=3). Examples of R include alkyl groups, such as methyl, ethyl, propyl and butyl; aryl groups, such as phenyl; alkenyl groups, such as allyl and vinyl. These resins defined as above may be completely condensed into $(HSiO_{3/2})_n$, or may be partially hydrolyzed (that is, partially containing Si—OR) and/or partially condensed (that is, partially containing Si—OH).

(Polysilazane)

The polysilazane used in the light scatter layer 3 refers to a polymer having a silicon-nitrogen bond, and is an inorganic precursor polymer for $SiO_2$, $Si_3N_4$ including Si—N, Si—H, or N—H, and an intermediate solid solution $SiO_xN_y$ (x: 0.1 to 1.9, y: 0.1 to 1.3) between $SiO_2$ and $Si_3N_4$.

The polysilazane preferably used in the light scatter layer 3 is a polymer represented by Formula (A).

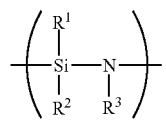

Formula (A)

In Formula, $R^1$, $R^2$, and $R^3$ each independently represent a hydrogen atom, an alkyl group, an alkenyl group, a cycloalkyl group, an aryl group, an alkylsilyl group, an alkylamino group, or an alkoxy group.

From the viewpoint of the density of the obtained light scatter layer 3, most preferred is a compound having all of $R^1$, $R^2$, and $R^3$ of hydrogen atoms. That is, perhydropolysilazane (PHPS) is particularly preferable.

Perhydropolysilazane is presumed to have a structure containing a straight chain and a ring structure mainly composed of a 6- and a 8-membered ring. Its molecular weight is about 600 to 2,000 (in polystyrene conversion value, with a gel permeation chromatography) in a number average molecular weight (Mn). It is a material of liquid or solid.

Polysilazane is commercially available in a solution state dissolved in an organic solvent. A commercially available product may be used directly as a coating liquid for producing a polysilazane reforming layer. Examples of commercially available polysilazane are: NN120-20, NAX120-20 and NL120-20, which are supplied by AZ Electronic Materials, Ltd.

As a binder, it can be used an ionizing radiation-curable resin composition. An example of a curing method is a conventionally known curing method can be used. That is, it can be cured by irradiation with electron beams or ultraviolet light.

Curing with electron beams is performed with electron beams having an energy of 10 to 1,000 keV, preferably 30 to 300 keV emitted from a variety of electron beam accelerators, such as accelerators of a Cockcroft-Walton type, a Van de Graaff type, a resonant type, an insulating core transformer type, a linear type, a dynamitron type, and a high frequency type. Among these accelerators, particularly preferred are electron beams having weak intensity. An electron beam source "EB Engine" made by Hamamatsu Photonics K.K. may be particularly preferably used.

Curing with ultraviolet light may be performed with ultraviolet light emitted from ultra-high pressure mercury lamps, high pressure mercury lamps, low pressure mercury lamps, carbon arc lamps, xenon arc lamps, and metal halide lamps. Preferred is use of ultraviolet light from an excimer lamp as described above.

(VUV Irradiation Apparatus Having an Excimer Lamp)

As a specific example of an ultraviolet light source, it ca be cited a rare gas excimer lamp emitting VUV rays in the range of 100 to 230 nm.

The atoms of rare gases, such as Xe, Kr, Ar, and Ne, do not form molecules via chemical bonding, and these gases are referred to as inert gases; however, the atoms (excited atoms) of the rare gases given energy by discharge may be bonded to other atoms to form molecules.

In an example where the rare gas is xenon (Xe), excimer light at 172 nm is emitted when an excited excimer molecule $Xe_2^*$ transits to the ground state as shown in the following reaction formulas.

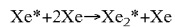

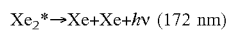

The excimer lamp has high efficiency because the excimer lamp mainly radiates at a single wavelength while barely emitting unnecessary light having wavelengths other than the single wavelength. The excimer lamp can keep the target object at a relatively low temperature without emitting unnecessary light. The excimer lamp may be instantaneously turned on/off because it starts and restarts quickly.

Examples of the light sources for efficiently radiating excimer light include dielectric barrier discharge lamps.

The dielectric barrier discharge lamp generates electrical discharge between two electrodes separated by a dielectric substance, and typically includes a discharge container composed of a dielectric substance and at least one of the electrodes externally disposed on the discharge container. In an exemplary dielectric barrier discharge lamp, a double cylindrical discharge container is composed of inner and outer quartz tubes, and contains a rare gas, such as xenon. The discharge container includes a first net electrode externally disposed thereon and a second electrode disposed inside the inner tube. The dielectric barrier discharge lamp generates dielectric barrier discharge inside the discharge container in response to high frequency voltage applied between these electrodes, and generates excimer light during dissociation of the excimer molecules, such as xenon, generated by the discharge.

The excimer lamp can emit light at high efficiency and thus at low electric power. The excimer lamp radiates energy in the ultraviolet light region at a single wavelength without emission of long-wavelength light, which heats the target object; hence, the excimer lamp prevents the target object from being heated by the incident light.

For the purpose of further introducing the light taken in the first smooth layer 4a or the second smooth layer 4b placed adjacent with one another into the light scatter layer 3, it is preferable that the first smooth layer 4a or the second smooth layer 4b adjacent to the binder of the light scatter layer 3 has a small refractivity difference. Specifically, it is preferable that the first smooth layer 4a or the second smooth layer 4b adjacent to the binder of the light scatter layer 3 has a refractivity difference of 0.1 or less. Further, it is preferable that the binder contained in the first smooth layer 4a and the second smooth layer 4b placed adjacent with one another is made of the same material as the binder contained in the light scatter layer 3.

By controlling the total layer thickness of the first smooth layer 4a, the second smooth layer 4b, and the light scatter layer 3, it can restrain penetration of water and the wiring defect by the step difference of the edge when pattering is carried out. Thus, it can improve scattering property. Specifically, the total layer thickness of the first smooth layer 4a, the second smooth layer 4b, and the light scatter layer 3 is preferably in the range of 100 nm to 5 μm, more preferably in the range of 300 nm to 2 μm.

<<Gas Barrier Layer>>

It is preferable that the gas barrier layer 2 of the present invention is constituted with at least two gas barrier layers each having a different element composition or a different distribution condition. By making this constitution, it can effectively prevent penetration of oxygen or water vapor.

The gas barrier layer 2 is a gas barrier film (it is also called as a gas barrier film) preferably having the following property: a water vapor permeability of 0.01 g/(m²·24 h) or less (25±0.5° C., and relative humidity (90±2) % RH) determined based on JIS K 7129-1992; and an oxygen permeability of 1×10⁻³ ml/(m²·24 h·atm) or less, determined based on JIS K 7126-1987. In addition, a water vapor permeability is preferably 1×10⁻⁵ g/(m²·24 h) or less.

When the gas barrier layer 2 is constituted of two or more kinds of layers, it is preferable that at least one of the two or more gas barrier layers contains silicon dioxide which is a reaction product of an inorganic silicon compound. Further, among the two or more gas barrier layers, it is preferable that at least one of the gas barrier layers contains a reaction product of an organic silicon compound. Namely, it is preferable that at least one of the gas barrier layers contains oxygen, silicon and carbon as constituting elements, which are derived from an organic silicon compound.

The composition or the distribution condition of elements that constitute the gas barrier layer 2 may be uniform in the layer, or may be different in thickness direction of the layer. As a method of making different the composition or the distribution condition of the constituting elements, it is preferable to change the forming method or forming materials of the gas barrier layer 2. This method will be described later.

It is preferable that a water vapor permeability of the gas barrier layer 2 (Wg), a water vapor permeability of the light scatter layer 3 (Ws), and a water vapor permeability of the first smooth layer 4a (Wf) satisfy the following conditional expression.

$$Wg \leq Wf < Ws$$

An example of the gas barrier layer 2 according to the present invention will be described in the following. Among the two gas barrier layers constituting the gas barrier layer 2, one layer is called as a first gas barrier layer 2a, and the other is called as a second gas barrier layer 2b.

<<First Gas Barrier Layer>>

As constituting elements of the first gas barrier layer 2a, the requirement of the elements is that they form a compound to prevent penetration of oxygen and water vapor, and that they are different from the constituting elements of second gas barrier layer 2b that will be described later.

For example, the first gas barrier layer 2a may be placed as a layer containing silicon, oxygen and carbon as constituting elements on one side of the film substrate 1. In this case, a preferable embodiment is that the distribution curve of each element satisfy all of the following requirements of (i) to (iv) from the viewpoint of improving the gas barrier property. The distribution curve of each element is obtained based on the measurement of element distribution in the depth direction with X-ray photoelectron spectroscopy.

(i) The atomic percentages of silicon, oxygen, and carbon satisfy the relationship indicated below in an area covering 90% or more of the distance from the surface across the thickness of the first gas barrier layer 2a.

(Atomic percentage of carbon)<(Atomic percentage of silicon)<(Atomic percentage of carbon)

(ii) The carbon distribution curve has at least two local extremum points.
(iii) An absolute value of the difference between the maximum value and the minimum value of the carbon atomic percentage in the carbon distribution curve is 5 at % or more.
(iv) The local maximum point in the oxygen distribution curve located at the nearest place of the surface of the first gas barrier layer 2a at the side of the film substrate 1 becomes the maximum value among the local maximum points of the oxygen distribution curve in the first gas barrier layer 2a.

The first gas barrier layer 2a is preferably formed on a flexible film substrate 1 in a belt form through a plasma enhanced chemical vapor deposition method in which the film substrate 1 is conveyed in contact with a pair of deposition rollers, and plasma is discharged between the deposition rollers to form a thin layer on the film substrate 1.

In the present invention, an extremum is a local maximum point or a local minimum point of the atomic percentage of each element in relation to the distance in the layer thickness direction from the surface of the first gas barrier layer 2a.

<Definition of Local Maximum Point and Local Minimum Point>

In the present invention, the local maximum point represents a point at which the atomic percentage of the element changes from an increase to a decrease when the distance from the surface of the first gas barrier layer 2a varies, and from which point the atomic percentage of the element decreases by 3 at % or more when the distance from the surface of the first gas barrier layer 2a in the thickness direction varies by 20 nm.

In the present invention, the local minimum point represents a point at which the atomic percentage changes from a decrease to an increase when the distance from the surface of the first gas barrier layer 2a varies, and from which point the atomic percentage of the element increases by 3 at % or more when the distance from the surface of the first gas barrier layer 2a in the thickness direction varies by 20 nm.

<Average Value of Carbon Atomic Percentage and Relation of Maximum Value and Minimum Value of Carbon Atomic Percentage>

A carbon atomic percentage in the first gas barrier layer 2a is preferably in the range of 8 to 20 at % as an average value for the entire layer in view of flexibility. More preferably, it is in the range of 10 to 20 at %. By making it in this range, it can form a first gas barrier layer 2a satisfying both gas barrier property and flexibility.

In the first gas barrier layer 2a, it is preferable that an absolute value of the difference between the maximum value and the minimum value of the carbon atomic percentage is 5 at % or more. In the first gas barrier layer 2a, it is more preferable that an absolute value of the difference between the maximum value and the minimum value of the carbon atomic percentage is 6 at % or more. And still more preferably, it is 7 at % or more. When the absolute value is 3 at % or more, the obtained first gas barrier layer 2a will have a sufficient gas barrier property when it is bent.

<Location of Extremum of Oxygen Atomic Percentage and Relation of Maximum Value and Minimum Value of Oxygen Atomic Percentage>

In the present invention, as described above, in view of preventing penetration of water molecules from the side of the film substrate 1, the following is preferable. In an oxygen distribution curve of the first gas barrier layer 2a, it is preferable that the local maximum point in the oxygen distribution curve located at the nearest place of the surface of the first gas barrier layer 2a at the side of the film substrate 1 becomes the maximum value among the local maximum points of the oxygen distribution curve in the first gas barrier layer 2a.

Figure 3:
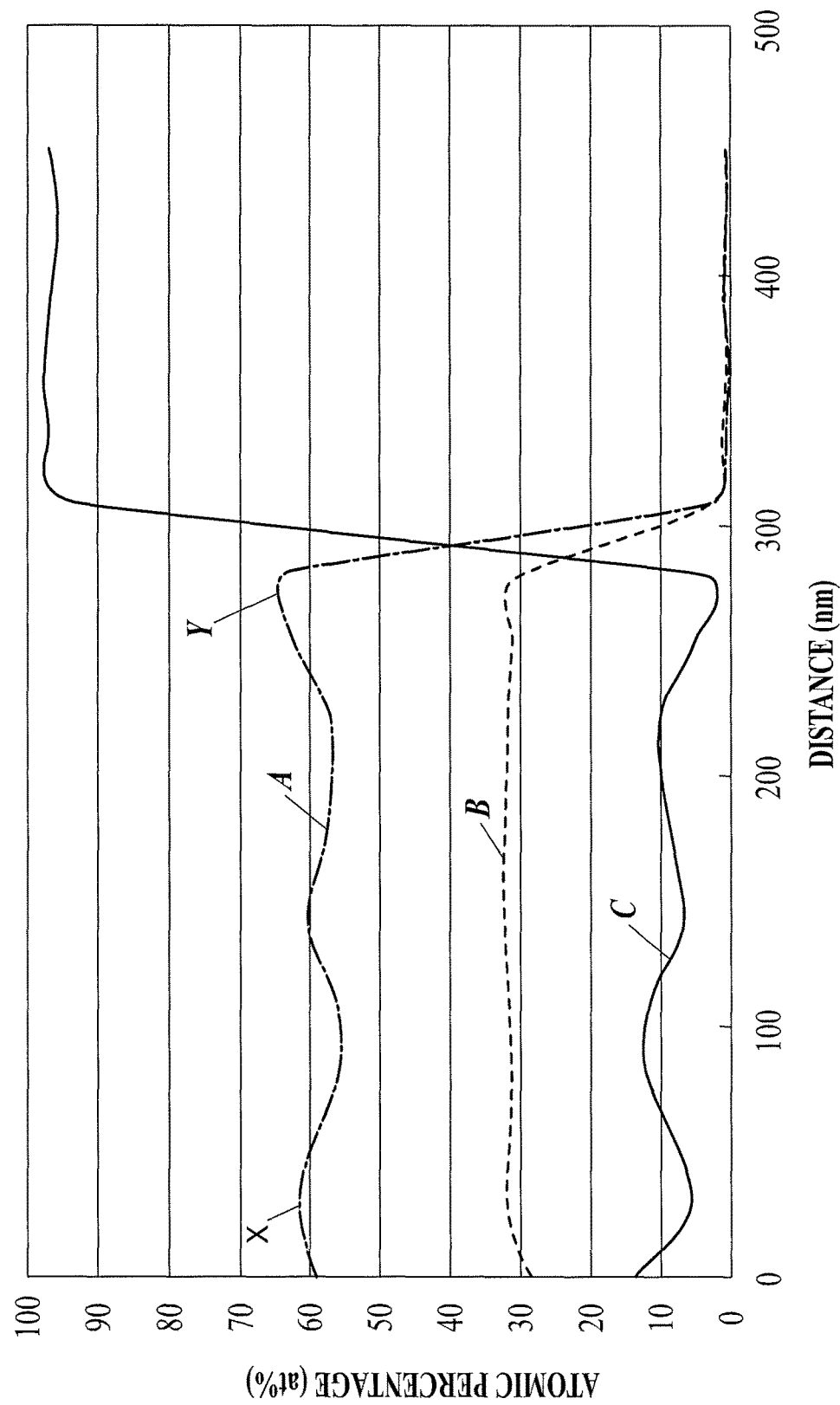
FIG. 3 is a graph indicating of a profile of each element in a layer thickness direction of a gas barrier layer of the present invention with XPS depth element analysis.

FIG. 3 is a graph indicating of a profile of each element in the layer thickness direction with XPS depth profiling (distribution in the depth direction).

In FIG. 3, an oxygen distribution curve is indicated by "A", a silicon distribution curve is indicated by "B", and a carbon distribution curve is indicated by "C".

The atomic percentage of each element is continuously changed from the surface of the first gas barrier layer 2a (distance of 0 nm) to the surface of the film substrate 1 (distance of about 300 nm). The local maximum point of the oxygen atomic percentage in the oxygen distribution curve A located at the nearest position to the surface of the first gas barrier layer 2a is designated as "X", the local maximum point of the oxygen atomic percentage located at the nearest position to the surface of the film substrate 1 is designated as "Y". It is preferable that the values of the local maximum points of the oxygen atomic percentage satisfy the relation of: Y>X, in view of preventing penetration of water molecules from the side of the film substrate 1.

It is preferable that the oxygen atomic percentage Y is larger than the oxygen atomic percentage X by 1.05 times or more. Here, the oxygen atomic percentage Y is the local maximum point in the oxygen distribution curve located at the nearest position to the surface of the first gas barrier layer 2a at the side of the film substrate 1; and the oxygen atomic percentage X is the local maximum point in the oxygen distribution curve located at the nearest position to the surface of the first gas barrier layer 2b facing the film substrate 1 by interposing with the first gas barrier layer 2a.

Namely, it is preferable that: $1.05 \leq Y/X$. Although the upper limit of Y/X is not limited in particular, preferable is in the range of: $1.05 \leq Y/X \leq 1.30$. More preferably, it is in the range of: $1.05 \leq Y/X \leq 1.20$. When Y/X is in these ranges, it can prevent penetration of water molecules, and it may not be occurred deterioration of gas barrier property. It is preferable from the viewpoint of productivity and cost performance.

In an oxygen distribution curve of the first gas barrier layer 2a, it is preferable that an absolute value of the difference between the maximum value and the minimum value of the atomic percentage of oxygen is 5 at % or more. More preferably, it is 6 at % or more. And still more preferably, it is 7 at % or more.

<Relation of Maximum and Minimum Values of Silicon Atomic Percentage>

In a silicon distribution curve of the first gas barrier layer 2a, it is preferable that an absolute value of the difference between the maximum value and the minimum value of the atomic percentage of silicon is less than 5 at %. More preferably, it is less than 4 at %. Still more preferably, it is less than 3 at %. When the difference between the maximum value and the minimum value of the atomic percentage of silicon is in the above-described ranges, the gas barrier property and the mechanical strength of the obtained first gas barrier layer 2a become sufficient.

<Composition Analysis in the Depth Direction of the Gas Barrier Layer with XPS>

The above-described carbon, oxygen, silicon, distribution curves in the depth direction of the gas barrier layer 2 will be prepared through XPS depth profiling in which the interior of the specimen is exposed in sequence for analysis of the surface composition through a combination of X-ray photoelectron spectroscopy and ion-beam sputtering using a rare gas, such as argon.

Each distribution curve acquired through such XPS depth profiling has, for example, a vertical axis representing the atomic percentage (unit: at %) of the element and a horizontal axis representing the etching time (sputtering time).

In a distribution curve of an element having an etching time as a horizontal axis, the etching time correlates approximately with the distance from the surface of the gas barrier layer 2 in the depth direction of the gas barrier layer 2. Thus, a distance from the surface of the gas barrier layer 2 calculated on the basis of the relationship between the etching rate and etching time used in the XPS depth profiling may be adopted "as a distance from the surface of the gas barrier layer 2 in the thickness direction".

For the XPS depth profiling, it is preferable to select an ion-beam sputtering of a rare gas using argon ($Ar^+$) as an ionic species and an etching rate of 0.05 nm/sec (equivalent to a value for a thermally-oxidized $SiO_2$ film).

In the present invention, from the viewpoint of forming a gas barrier layer having a uniform layer in the whole surface of the first gas barrier layer 2a and superior gas barrier property, it is preferable that the first gas barrier layer 2a is substantially uniform in the direction of the film surface (the direction parallel to the surface of the first gas barrier layer 2a).

In the present invention, a first gas barrier layer 2a being substantially uniform in the direction of the film surface means the following. At any two points of the first gas barrier layer 2a, when the oxygen and carbon distribution curves are measured with XPS depth profiling, for the arbitral two points contain the same number of extremum points in the carbon distribution curve, and the absolute values of the differences between the maximum value and the minimum value of the carbon atomic percentage in the carbon distribution curves are identical or have a difference within 5 at %.

It is preferable that the gas barrier layer 2 is provided with at least one first gas barrier layer 2a satisfying all of the above-described conditions (i) to (iv). It may be provided with two or more that satisfy all of the conditions.

In addition, when the gas barrier layer 2 is provided with two or more first gas barrier layers 2a, a plurality of first gas barrier layers 2a may be the same, or they may be different. Further, such gas barrier layer 2 may be formed on one surface of the film substrate 1, and it may be formed on both surfaces of the film substrate 1.

In the silicon, oxygen, and carbon distribution curves, when atomic percentages of silicon, oxygen, and carbon satisfy the condition represented by the relationship (i) in an area corresponding to 90% or more of the thickness of the first gas barrier layer 2a, it is preferable that the silicon atomic percentage in the first gas barrier layer 2a is in the range of 25 to 45 at %, more preferably in the range of 30 to 40 at %.

It is preferable that the oxygen atomic percentage in the first gas barrier layer 2a is in the range of 33 to 67 at %, more preferably in the range of 45 to 67 at %.

Further, it is preferable that the carbon atomic percentage in the first gas barrier layer 2a in the range of 3 to 33 at %, more preferably in the range of 3 to 25 at %.

<Layer Thickness of First Gas Barrier Layer>

A layer thickness of the first gas barrier layer 2a is preferably in the range of 5 to 3,000 nm, more preferably in the range of 10 to 2,000 nm, and still more preferably in the range of 100 to 1,000 nm, particularly preferably in the range of 300 to 1,000 nm. When the first gas barrier layer 2a has a thickness within these ranges, the first gas barrier layer 2a will be excellent in gas barrier property such as an oxygen gas barrier property and water vapor barrier property. The gas barrier property thereof will not be decreased even after bending.

<Method of Forming First Gas Barrier Layer>

A first gas barrier layer 2a is preferably formed through a plasma enhanced chemical vapor deposition method. More specifically, the first gas barrier layer 2a is preferably formed through a plasma enhanced chemical vapor deposition method (plasma CVD) in which a film substrate 1 is conveyed in contact with a pair of deposition rollers, and plasma is discharged between the deposition rollers.

During discharge between the pair of deposition rollers, it is preferable that the polarities of the deposition rollers are alternately inverted. The deposition gas used in the aforesaid plasma enhanced chemical vapor deposition preferably includes an organosilicon compound and oxygen. The content of the oxygen in the deposition gas to be supplied is preferably equal to or less than a theoretical quantity required for the complete oxidation of the entire quantity of the organosilicon compound in the deposition gas. In the present invention, the first gas barrier layer 2a is preferably formed through a continuous deposition process on the film substrate 1. The plasma enhanced chemical vapor deposition method may be a Penning discharge plasma method.

In order to form a layer in which a carbon atomic percentage has a density gradient and the density gradient continuously changes in the layer like as the above-described first gas barrier layer 2a, it is preferable to generate plasma discharge in the space between the plural discharge rollers when plasma is generated with a plasma enhanced chemical vapor deposition method.

In the present invention, it is preferable that a pair of deposition rollers is used and that a film substrate 1 is conveyed in contact with the pair of deposition rollers, and plasma is discharged between the pair of deposition rollers.

As described above, by using the pair of deposition rollers, conveying the film substrate 1 in contact with the pair of deposition rollers, and discharging plasma between the pair of deposition rollers, the distance of the plasma discharge position between the film substrate 1 and the deposition rollers will be varied. As a result, it is possible to achieve a gas barrier layer having a density gradient of the carbon atomic percentage and the density gradient continuously changing in the layer.

Thus, while film formation is performed on a surface portion of the film substrate 1 located on one deposition roller, film formation can be performed on other surface portion of the film substrate 1 located on other deposition roller.

As a result, the deposition rate will be increased to double, and a thin film may be efficiently produced. In addition, it may form a layer having the same composition and the number of the extremum points in the carbon distribution curve will be increased to at least double. Consequently, it can from a gas barrier layer satisfying all of the above-described conditions (i) to (iv).

A gas barrier film is preferably produced by forming a gas barrier layer 2 on a surface of a film substrate 11 through a roll-to-roll processing in view of productivity.

Although any apparatus may be used for the production of a gas barrier film through plasma enhanced chemical vapor deposition, the apparatus preferably includes at least a pair of deposition rollers and a plasma power source and is capable of discharging in the space between the deposition rollers. For example, the manufacturing apparatus illustrated in FIG. 4 can manufacture a gas barrier film through plasma enhanced chemical vapor deposition in a roll-to-roll process.

Figure 4:
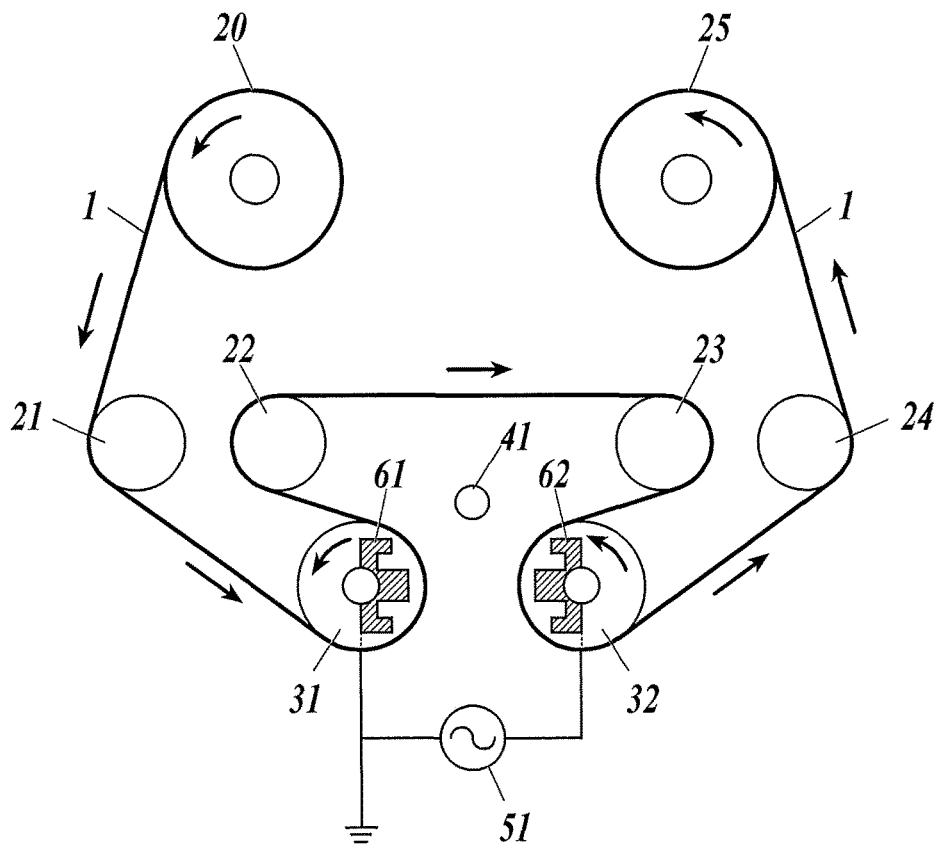
FIG. 4 is a schematic drawing illustrating an example of a production apparatus of a gas barrier film.

With reference to FIG. 4, a method for manufacturing a first gas barrier layer 2a of the present invention will now be described in detail. FIG. 4 is a schematic drawing illustrating an example of a production apparatus suitably used for producing a first gas barrier layer 2a on a film substrate 1.

The production apparatus illustrated in FIG. 4 includes a delivery roller 20, conveyer rollers 21, 22, 23 and 24, deposition rollers 31 and 32, a deposition gas inlet 41, a power source 51 for plasma generation, magnetic-field generators 61 and 62 disposed inside the deposition rollers 31 and 32, and a reeling roller 71. Such a production apparatus includes a vacuum chamber (not shown) that accommodates at least the deposition rollers 31 and 32, the deposition gas inlet 41, the power source 51 for plasma generation, and the magnetic-field generators 61 and 62. The vacuum chamber of such a production apparatus is connected to a vacuum pump (not shown). The vacuum pump can appropriately adjust the pressure in the vacuum chamber.

In the aforesaid production apparatus, a pair of deposition rollers (deposition rollers 31 and 32) is connected to the power source 51 for plasma generation so that the deposition rollers can function as opposing electrodes. Thus, electric power will be supplied from the power source 51 for plasma generation to the pair of deposition rollers (deposition rollers 31 and 32) and discharge will be done in the space between the deposition rollers 31 and 32. This will generate plasma in the space between the deposition rollers 31 and 32. The deposition rollers 31 and 32 may be used as electrodes by appropriately selecting the material and design for the deposition rollers suitable as electrodes. The deposition rollers (deposition rollers 31 and 32) in the production apparatus are preferably disposed such that the central axes of the rollers 31 and 32 are substantially parallel to each other on a single plane. Such arrangement of the deposition rollers (deposition rollers 31 and 32) will make double the deposition rate and it will deposit a film with an identical structure. As a result, the number of extreme value points in the aforesaid carbon distribution curve may be increased at least to double.

The deposition rollers 31 and 32 respectively accommodate the magnetic-field generators 61 and 62, which are fixed without rotation even when the deposition rollers rotate.

The deposition rollers 31 and 32 may be any appropriate known roller. The deposition rollers 31 and 32 are preferred to have identical diameters in view of the efficient deposition of the films. The diameter of the deposition rollers 31 and 32 is preferably in the range of 300 to 1,000 mmφ, in particular in the range of 300 to 700 mmφ, in view of the discharge conditions and the space in the chamber. When the diameter is 300 mmφ or more, the plasma discharge space will not be too small. There is no deterioration in productivity. It can avoid the phenomenon that the total amount of heat of the plasma discharge is given in a short time. On the other hand, when the diameter is 1,000 mmφ or less, it can maintain the practical condition of the apparatus design, as well as it can achieve uniform plasma discharge space.

The delivery roller 20 and the conveyer rollers 21, 22, 23 and 24 of the production apparatus may be any appropriate known roller. The reeling roller 25 may be any appropriate known roller that can reel the film substrate 1 on which is formed the gas barrier layer. It is not limited in particular.

The deposition gas inlet 41 may be any appropriate inlet that can supply or discharge a raw material gas at a predetermined rate.

The power source 51 for plasma generation may be any appropriate power source for a known plasma generator. The power source 51 for plasma generation supplies power to the deposition rollers 31 and 32 connected thereto and can use the deposition rollers 31 and 32 as opposing electrodes for electrical discharge. The power source 51 for plasma generation is preferably an AC source that will alternatively invert the polarities of the deposition rollers so as to efficiently perform the roller plasma CVD method. It is preferred to apply power in the range of 100 W to 10 kW and have an AC frequency in the range of 50 Hz to 500 kHz.

The magnetic-field generators 61 and 62 may be any appropriate known magnetic-field generator.

The production apparatus, such as that illustrated in FIG. 4, can manufacture the gas barrier film through appropriate adjustment of, for example, the type of raw material gas, the electric power of the electrode drum in the plasma generator, the strength of the magnetic-field generator, the pressure in the vacuum chamber, the diameter of the deposition rollers, and the conveying rate of the resin substrate. That is, the production apparatus illustrated in FIG. 4 supplies a deposition gas (for example, raw material gas) into the vacuum chamber and generates plasma discharge with impressing the magnetic-field between the deposition rollers (deposition rollers 31 and 32) so as to decompose the deposition gas (for example, raw material gas) by the plasma, and deposit the first gas barrier layer 2a on the surface of the film substrate 1 located on the deposition roller 31. Through such deposition process, the film substrate 1 is conveyed by the delivery roller 20 and the deposition roller 31, and the first gas barrier layer 2a is formed on the surface of the film substrate 1 through continuous roll-to-roll deposition process.

Preferably, the first gas barrier layer 2a has the following feature: (iv) the local maximum point in the oxygen distribution curve located at the nearest place of the surface of the first gas barrier layer 2a at the side of the film substrate 1 becomes the maximum value among the local maximum points of the oxygen distribution curve in the first gas barrier layer 2a.

Preferably, the oxygen atomic percentage has the following feature. The oxygen atomic percentage of the local maximum point in the oxygen distribution curve located at the nearest position to the surface of the first gas barrier layer 2a at the side of the film substrate 1 is larger than the oxygen atomic percentage of the local maximum point in the oxygen distribution curve located at the nearest position to the surface of the first gas barrier layer 2b facing the film substrate 1 by interposing with the first gas barrier layer 2a by 1.05 times or more.

The method for making the oxygen atomic percentage to be a required distribution in the first gas barrier layer 2a is not limited in particular. Examples of a usable method are: a method of changing the deposition gas content during film formation; a method of changing the position of the deposition gas inlet 41; a method of supplying the deposition gas to plural positions; a method of placing a shielding plate at the neighbor of the deposition gas inlet 41 to control the flow of the gas; and a method of changing the deposition gas content and plural plasma CVD processes are performed. Among them, a simple and reproducible method is performing plasma CVD by changing the position of the deposition gas inlet 41 to a nearer place or a further place of the deposition rollers 31 and 32.

Figure 5:
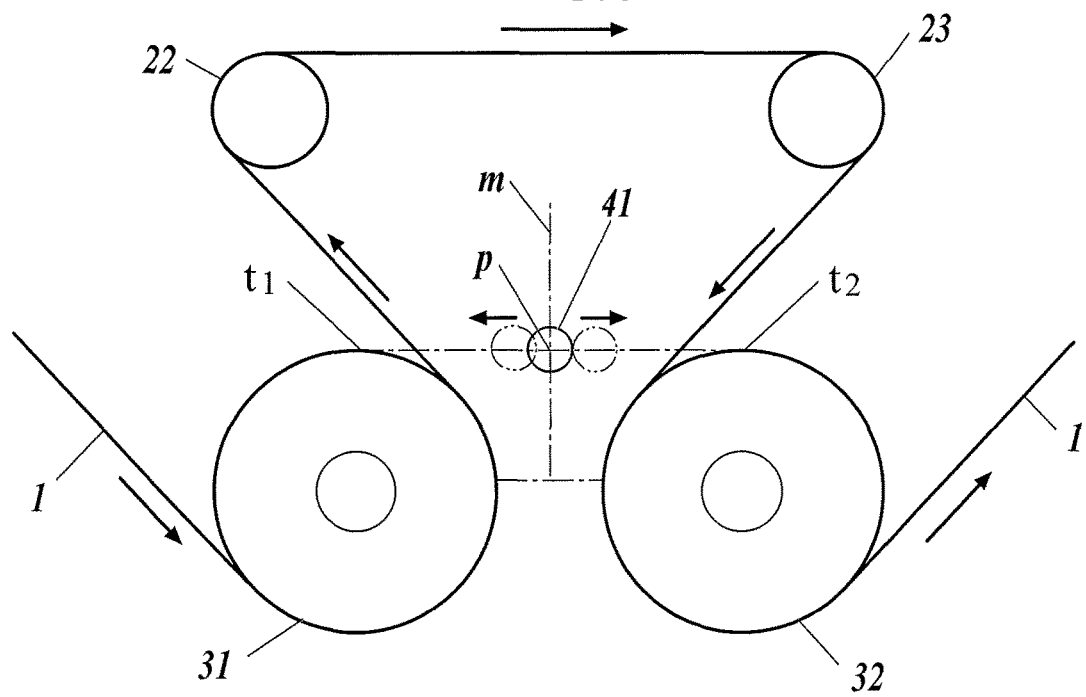
FIG. 5 is a schematic drawing illustrating positional setting of a deposition gas inlet.

FIG. 5 is a schematic drawing describing the movement of the deposition gas inlet 41 of the CVD apparatus.

When the distance from the deposition gas inlet 41 to the deposition rollers 31 or 32 is made to be 100%, the deposition gas inlet 41 is moved to the deposition rollers 31 or 32 in an amount in the range of 5 to 20% from the perpendicular bisector m of the line bonding the deposition rollers 31 or 32. By this process, it can be controlled the extremum conditions of the oxygen distribution curve.

That is, when the distance ($t_1$–p) and the distance ($t_2$–p) are made to be 100%, the deposition gas inlet 41 is moved to the deposition rollers direction in a parallel direction from the point p on the perpendicular bisector m of the line bonding the deposition rollers 31 or 32 toward the points $t_1$ or $t_2$.

In this case, by the moving distance of the deposition gas inlet 41, the amount of the extremum value may be controlled. For example, in order to increase the extremum value in the oxygen distribution curve located at the nearest position to the surface of the first gas barrier layer 2a at the side of the film substrate 1, it is possible to achieve by making to approach the gas deposition inlet 41 to the deposition rollers 31 or 32 with a moving distance of about 20%.

The moving range of the gas deposition inlet 41 is preferably in the range of 5 to 20%. More preferably, it is in the range of 5 to 15%. Within this range, the oxygen distribution curve or other element distribution in the surface will not be dispersed and a required distribution curve can be uniformly and reproducibly formed.

The film formation was done by making to approach the gas deposition inlet 41 to the direction of the deposition roller 31 with 5%. An example of an element profile with PS depth profiling in the thickness direction is illustrated in FIG. 3.

In addition, the film formation was done by making to approach the gas deposition inlet 41 to the direction of the deposition roller 32 with 10%. An example of an element profile with PS depth profiling in the thickness direction is illustrated in FIG. 6.

Figure 6:
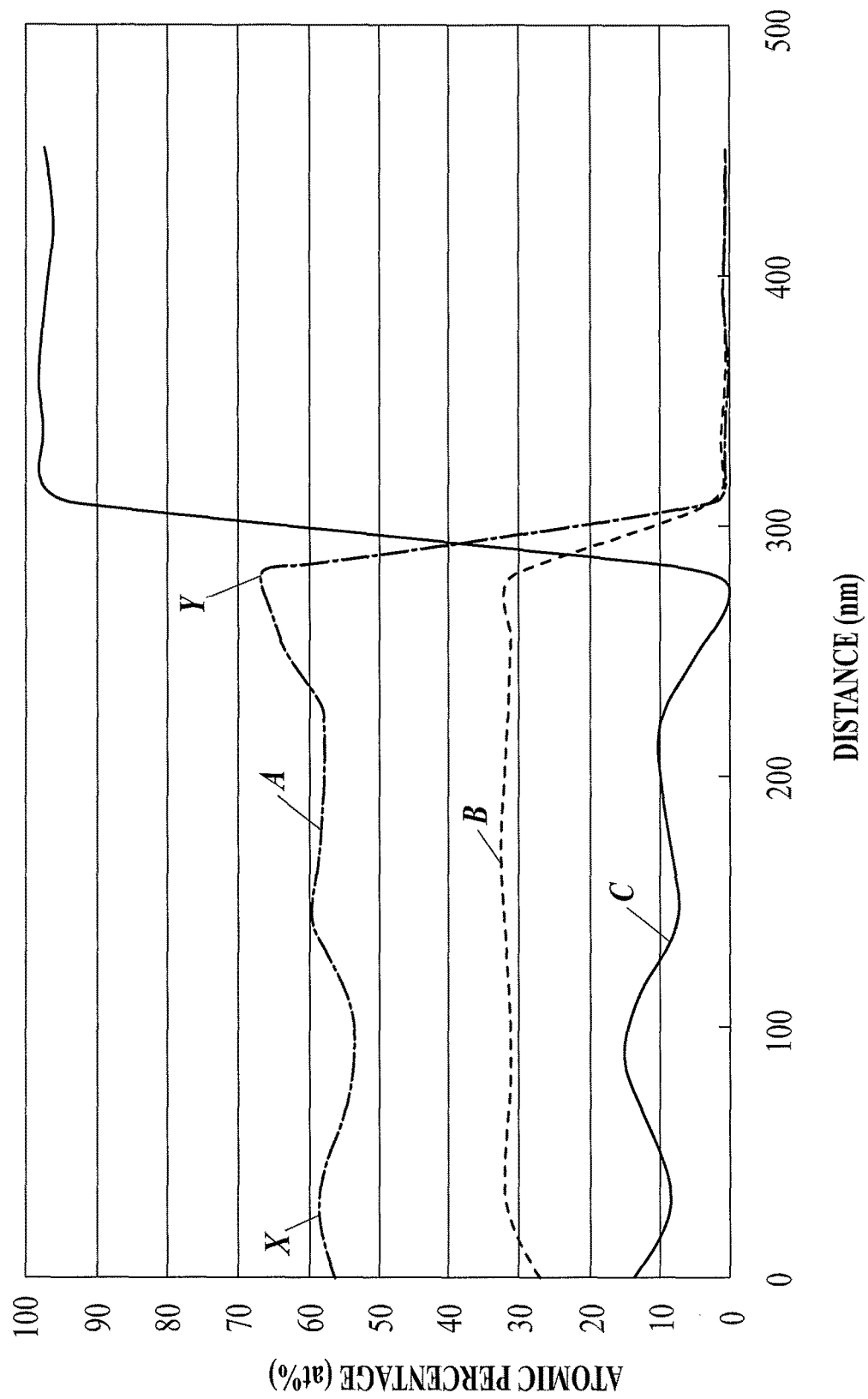
FIG. 6 is a graph indicating of a profile of each element in a layer thickness direction of a gas barrier layer of the present invention with XPS depth element analysis.

Both FIG. 3 and FIG. 6 indicate that Y>Y, wherein the local maximum point of the oxygen atomic percentage in the oxygen distribution curve A located at the nearest position to the surface of the first gas barrier layer 2a is designated as "X", and the local maximum point of the oxygen atomic percentage located at the nearest position to the surface of the film substrate 1 is designated as "Y".

On the other hand, FIG. 7 is an example of an element profile with PS depth profiling in the thickness direction of the comparative gas barrier layer. The comparative gas barrier layer was formed by setting the gas deposition inlet 41 on the perpendicular bisector m of the line bonding the deposition rollers 31 or 32. In the oxygen distribution curve A of this gas barrier layer, the local maximum point X of the oxygen atomic percentage of the gas barrier surface located to the nearest position of the side of the film substrate is almost the same as the local maximum point Y of the oxygen atomic percentage located at the nearest position to the opposite gas barrier facing the film substrate by interposing the gas barrier film.

It was found that the extremum value in the oxygen distribution curve of the gas barrier layer located at the nearest position to the side of the film substrate was not the maximum value in the layer.

<Raw Material Gas>

A raw material gas composing a deposition gas used for forming a first gas barrier layer 2a of may be suitably selected according to the material for forming a gas barrier layer. As such a raw material gas, it is preferable to use an organic silicon compound containing silicon.

Examples of an organic silicon compound are: hexamethyldisiloxane, 1,1,3,3-tetramethyldisiloxane, vinyl trimethylsilane, trimethylsilane, hexamethyldisilane, methylsilane, dimethylsilane, trimethylsilane, diethylsilane, propylsilane, phenylsilane, vinyl triethoxysilanesilane, vinyltrimethoxysilane, tetramethoxysilane, tetraethoxysilane, phenyltrimethoxysilane, methyltriethoxysilane, and octamethylcyclotetrasiloxane. Among these organic silicon compounds, hexamethyldisiloxan and 1,1,3,3-tetramethyldisiloxane are preferably used from the viewpoint of handling during layer formation and light distribution property of the obtained first gas barrier layer 2a. Further, these organic silicon compounds may be used singly, or may be used in combination of two or more.

As a deposition gas, it may be used a reactive gas in addition to the raw material gas. It may be suitably selected a reactive gas which is changed in an inorganic compound of oxide or nitride after reacted with the raw material gas.

Examples of a reactive gas for producing an oxide are oxygen and ozone. Examples of a reactive gas for producing a nitride are nitrogen ammonia.

These reactive gases may be used alone or in combination of two or more kinds. For example, when an oxynitride compound is aimed to produce, it may be used by combining a reactive gas for producing an oxide and a reactive gas for producing a nitride.

The aforesaid deposition gas may contain a carrier gas, if required, for supplying the raw material gas to the vacuum chamber. The deposition gas may contain a discharge gas, if required, for the generation of plasma discharge. Such carrier gas and discharge gas may be any appropriate known gas, including rare gases, such as helium, argon, neon, and xenon, and hydrogen.

When the deposition gas contains a raw material gas including a raw material gas and a reactive gas, it is preferable that the deposition gas contains the reactive gas at a percentage not too higher than the theoretical percentage of the reactive gas required for complete reaction of the raw material gas and the reactive gas. If the percentage of the reactive gas is too high, it is difficult to obtain a first gas barrier layer required for the present invention. Consequently, in order to obtain a required property as a gas barrier film, it is preferable that a total amount of an organosilicon compound in the deposition gas is set to be less than a theoretical amount for complete oxidation.

As a representative example, it will be described a case in which hexamethyldisiloxane (organosilicon compound (HMDSO: $(CH_3)_6Si_2O$) is a raw material gas and oxygen ($O_2$) is a reactive gas.

When a silicon-oxygen thin film is formed with a plasma CVD method by using hexamethyldisiloxane (HMDSO: $(CH_3)_6Si_2O$) as a raw material gas, and oxygen ($O_2$) as a reactive gas, a thin film composed of silicon dioxide is produced through the following reaction scheme (1).

$$(CH_3)_6Si_2O + 12O_2 \rightarrow 6CO_2 + 9H_2O + 2SiO_2 \quad \text{Reaction scheme (1):}$$

In this reaction, 12 moles of oxygen is required for complete oxidation of 1 mole of hexamethyldisiloxane. Thus, the complete reaction of a deposition gas containing 12 moles or more oxygen for each mole of hexamethyldisiloxane will generate a uniform silicon dioxide layer. Therefore, the flow rate of the material gas is adjusted to a rate equal to or less than the theoretical rate for complete reaction so as to maintain an incomplete reaction. That is, less than 12 moles of the oxygen should be provided for each mole of hexamethyldisiloxane, which is lower than the stoichiometric ratio of oxygen.

In an actual CVD chamber, the hexamethyldisiloxane, which is the raw material gas, and the oxygen, which is the reactive gas, are supplied from the gas inlets to the deposition region. Thus, even if the quantity of the reactive oxygen gas in moles (flow rate) is 12 times of that of hexamethyldisiloxane, which is the raw material gas, the reaction actually cannot be completely accomplished. A complete reaction is presumed to be accomplished only when oxygen is supplied in a quantity that significantly exceeds the stoichiometric ratio (for example, the mole quantity (flow rate) of oxygen may be set to at least approximately 20 times of that of hexamethyldisiloxane so as to produce silicon oxide through a complete oxidation with a CVD method. Thus, the mole quantity (flow rate) of oxygen is preferably not more than 12 times, which is the stoichiometric ratio, more preferably not more than 10 times that of the hexamethyldisiloxane, which is the raw material gas.

With such contents of hexamethyldisiloxane and oxygen, the carbon atoms and hydrogen atoms in the hexamethyldisiloxane that are not completely oxidized are incorporated in a gas barrier layer, enabling to form a desired gas barrier layer. When the mole quantity (flow rate) of oxygen is too small relative to the mole quantity (flow rate) of hexamethyldisiloxane in the deposition gas, the non-oxidized carbon and hydrogen atoms are excessively taken in the gas barrier layer. Thus, the gas barrier layer will have low transparency and it cannot be used as a flexible substrate for a device such as an organic EL element or an organic film solar cell, which is required to have transparency.

In this view, the lower limit of the mole quantity (flow rate) of oxygen relative to the mole quantity (flow rate) of hexamethyldisiloxane in the deposition gas is preferably 0.1 times or more of the mole quantity (flow rate) of hexamethyldisiloxane, more preferably 0.5 times or more.

<Vacuum Level>

The pressure (vacuum level) in the vacuum chamber may be appropriately adjusted depending on the type of raw material gas and it is preferably in the range of 0.5 to 100 Pa.

<Roller Deposition>

In such plasma CVD method, in order to discharge between the deposition rollers 31 and 32, the electric power to be applied to electrode drums (in the present embodiment, they are provide with the deposition rollers 31 and 32) connected to the power source 51 may be appropriately adjusted depending on the type of the raw material gas and the pressure in the vacuum chamber. Although it is not generalized, a preferred electric power is in the range of 0.1 to 10 kW.

Electric power applied within such a range does not generate particles (unwanted particles), and the heat generated during deposition is not excessive and controllable. Thus, heat damage and wrinkles in the film substrate 1 due to the increase in temperature at the surface of the film substrate 1 during deposition do not occur. In addition, it will prevent the damage to the deposition rollers caused by the discharge of large amount of current between the naked deposition rollers after melting of the resin substrate.

The conveying rate (line rate) of the film substrate 1 may be appropriately adjusted depending on the type of the raw material gas and the pressure in the vacuum chamber, and it is preferably in the range of 0.25 to 100 m/min, more preferably in the range of 0.5 to 20 m/min. If the line rate is within these ranges, wrinkles in the film substrate 1 due to heat are not easily formed, and the thickness of the formed first gas barrier layer 2a is controllable.

<<Second Gas Barrier Layer>>

In the present invention, the gas barrier film of the present invention is preferably provided with a second gas barrier layer 2b. The second gas barrier layer 2b is formed with a polysilazane containing liquid by a wet coating method on a first gas barrier layer 2a. The coated second gas barrier layer 2b is dried and irradiated with vacuum ultraviolet rays (VUV rays). Then, a reforming treatment is performed to the formed coated second gas barrier layer 2b. The second gas barrier layer 2b is formed on the first gas barrier layer 2a formed with a CVD method. By this structure, it can bury the minute defects remaining in the first gas barrier layer 2a already formed with a gas barrier component of polysilazane from the upper part. As a result, it can further improve gas barrier property and flexibility. This is favorable.

The layer thickness of the second gas barrier layer 2b is preferably in the range of 1 to 500 nm, more preferably, in the range of 10 to 300 nm. When the layer thickness of the second gas barrier layer is 1 nm or more, a requested gas barrier property can be exhibited. When it is 500 nm or less, it can prevent film deterioration such as generation of cracks in the dense silicon oxynitride film.

<Polysilazane>

In the second gas barrier layer 2b, it may be used polysilazane represented by Formula (A). From the viewpoint of the density of the obtained second gas barrier layer 2b, most preferred is a compound having all of $R^1$, $R^2$, and $R^3$ of hydrogen atoms. That is, perhydropolysilazane (PHPS) is particularly preferable.

The second gas barrier layer 2b is formed by applying a coating liquid containing polysilazane on the first gas barrier layer 2a made by a CVD method, then, the coated layer is dried and irradiated with vacuum ultraviolet rays.

As an organic solvent to prepare a polysilazane containing coating liquid, it is preferable to avoid an alcohol solvent or water which easily reacts with polysilazane. Example of an applicable organic solvent are: a hydrocarbon solvent such as an aliphatic hydrocarbon, an alicyclic hydrocarbon, and an aromatic hydrocarbons; a halogenated hydrocarbon solvent; and ether such as an aliphatic ether and an alicyclic ether. Specific examples thereof are: a hydrocarbon such as pentane, hexane, cyclohexane, toluene, xylene, Solvesso™, and turpentine; a halogenated hydrocarbon such as methylene chloride and trichloroethane; and ether such as dibutyl ether, dioxane and tetrahydrofuran. These organic solvents may be chosen in accordance with characteristics, such as solubility of polysilazane, and an evaporation rate of an organic solvent, and a plurality of solvents may be mixed.

A concentration of polysilazane in a polysilazane containing coating liquid is different depending on the thickness of the second gas barrier layer 2b and the pot life of the coating liquid. Preferably, it is in the range of 0.2 to 35 mass %.

In order to promote the conversion to silicon oxynitride, the polysilazane containing coating liquid for forming a second gas barrier layer may contain additives. Examples thereof are: an amine catalyst, and a metal catalyst (Pt compound such as Pt acetyl acetonate, a Pd compound such as propionic acid PD, a Rh compound such as Rh acetyl acetonate). In the present invention, an amine catalyst is particularly preferable. Specific examples of an amine catalyst are: N,N-diethylethanolamine, N,N-dimethylethanolamine, triethanolamine, triethylamine, 3-morpholinopropylamine, N,N,N,N-tetramethyl-1,3-diaminopropane, and N,N,N',N'-tetramethyl-1,6-diaminohexane.

An added amount of these catalyst to polysilazane is preferably in the range of 0.1 to 10 mass % with respect to the total mass of the coating liquid for forming a second gas barrier layer. More preferably, it is in the range of 0.2 to 5 mass %, and still more preferably, in the range of 0.5 to 2 mass %. By making the concentration of a catalyst in this range, it is possible to avoid excessive formation of silanol due to a rapid advance in reaction such as decrease of a layer density and increase of layer defects.

A conventionally known appropriate wet coating method may be adopted as a coating method of a polysilazane containing coating liquid. Specific examples of a coating method include: a roller coat method, a flow coat method, an inkjet method, a spray coat method, a printing method, a dip coat method, a casting film forming method, a bar coat method and a gravure printing method.

A coating thickness may be appropriately set up according to the purpose. For example, a coating thickness may be set up so that the thickness after being dried is preferably about 50 nm to 2 μm, more preferably, it is in the range of 70 nm to 1.5 μm, still more preferably, it is in the range of 100 nm to 1 μm.

<Excimer Treatment>

The second gas barrier layer 2b according to the present invention is a process to irradiate a polysilazane containing layer with vacuum ultraviolet (VUV) rays. At least a port of polysilazane is reformed to silicon oxynitride by this process.

Here, it will be described a supposed mechanism of forming a specific composition of $SiO_xN_y$ by reforming a polysilazane containing coated layer with a vacuum ultraviolet ray irradiating process. Perhydropolysilazane is taken as an example for explanation.

Perhydropolysilazane can be specified by the composition of "—$(SiH_2$—$NH)_n$—".

When it is specified by $SiO_xN_y$, it is shown by x=0 and y=1. In order to achieve the condition of x>0, it is required an outer oxygen source. The outer oxygen sources are as follows.

(i) Oxygen or water contained in a polysilazane coating liquid (ii) Oxygen or water taken in a coated layer from the environment of a coating-drying process (iii) Oxygen, water, ozone, and singlet oxygen taken in a coated layer from the environment of a vacuum ultraviolet ray irradiating process (iv) Oxygen or water transferred as a released gas in a coated layer from the substrate side by the heat given in a vacuum ultraviolet ray irradiating process (v) Oxygen or water taken in a coated layer from the oxidation environment, when the vacuum ultraviolet ray irradiating process is conducted in a non-oxidation environment, and then, the coated layer is transferred from the non-oxidation environment to an oxidation environment.

On the other hand, since it is a very unusual case in which oxidation of N is progressed than oxidation of Si, y has basically un upper limit value of 1.

Based on the relationship of the bond of Si, O and N, x and y are basically in the range of: $2x+3y \leq 4$. In the condition of complete oxidation, y=0, the coated layer becomes to contain a silanol group. There is a case in which $2<x<2.5$.

In the following, it will be described a supposed reaction mechanism of forming silicon oxynitride from perhydropolysilazane, and further, forming silicon oxide in the vacuum ultraviolet ray irradiating process.

(1) Dehydrogenation, and Formation of Si—N Bond Accompanied Thereby

A Si—H bond and a N—H bond in perhydropolysilazane are relatively easily broken by excitation with vacuum ultraviolet ray irradiation. It is supposed that they are bonded again as a Si—N bond in an inactive atmosphere (there is a case of forming a non-bonding site in Si).

Namely, it is cured as forming a $SiN_y$ composition without oxidation. In this case, there is no break in the polymer main chain. The break of a Si—H bond or a N—H bond is promoted by the presence of a catalyst or by heat. The broken H will be released out of the film as $H_2$.

(2) Formation of Si—O—Si Bond by Hydrolysis and Dehydrocondensation

A Si—N bond in perhydropolysilazane is hydrolyzed with water, and a Si—OH bond is formed by the break of the polymer main chain. Two Si—OH bonds are dehydrocondensed to form a Si—O—Si bond and cured. Although this reaction is taken place in the atmosphere, it is considered that water vapor produced as a released gas from the resin substrate becomes a main water source, the water vapor being released by the irradiation heat in the vacuum ultraviolet ray irradiating process. When ware is excessive, there remain Si—OH bonds which are not dehydrocondensed. As a result, the cured film has a low gas barrier property represented by the composition of $SiO_{2.1}$ to $SiO_{2.1\ to\ 2.3}$.

(3) Direct Oxidation by Singlet Oxygen, Formation of Si—O—Si Bond

During the vacuum ultraviolet ray irradiation, when an appropriate amount of oxygen exists in the atmosphere, it will be produced singlet oxygen having very strong oxidation ability. H and N in perhydropolysilazane are substituted with O to form c to result in being cured. It is considered that there is a case in which recombination of bonds occur by the break of the polymer main chain.

(4) Oxidation Accompanied by the Break of Si—N Bond with Vacuum Ultraviolet Ray Irradiation and Excitation Since the energy of vacuum ultraviolet rays is higher than the bond energy of Si—N bond in perhydropolysilazane, the Si—N bond is broken. When there are oxygen sources such as oxygen, ozone, and water in the surroundings, it is oxidized to form a Si—O—Si bond or a Si—O—N bond. It is considered that there is a case in which recombination of bonds occur by the break of the polymer main chain.

The adjustment of the composition of silicon oxynitride in the polysilazane containing layer irradiated with vacuum ultraviolet rays can be done by controlling the oxidation state with a suitable combination of the oxidation mechanisms of (1) to (4).

In a vacuum ultraviolet ray irradiation process of the present invention, illuminance of the aforesaid vacuum ultraviolet rays which are received at a coated layer surface of a polysilazane coated layer is preferably in the range of 30 to 200 mW/cm², and more preferably, it is in the range of 50 to 160 mW/cm². When it is 30 mW/cm² or more, the reforming efficiency will not be decreased. When it is 200 mW/cm² or less, there will not occur concern of producing ablation in the coated layer or giving damage to the substrate.

An amount of irradiation energy (irradiation amount) of vacuum ultraviolet rays at a polysilazane coated layer surface is preferably in the range of 200 to 10,000 mJ/cm², more preferably, it is in the range of 500 to 5,000 mJ/cm². When it is 200 mJ/cm² or more, sufficient reforming will be done. When it is 10,000 mJ/cm² or less, there will not occur concern of producing crack due to over reforming or thermal deformation of the substrate.

As a vacuum ultraviolet ray source, a rare gas excimer lamp is as described above is preferably used.

Excimer light emission is attained by dielectric barrier discharge. The dielectric barrier discharge refers to thunder-like micro-discharge generated in a gaseous space between electrodes separated by a dielectric substance (transparent quartz in the excimer lamp) through application of a high frequency voltage of tens of kilohertz to the electrodes. The micro-discharge disappears if streamers of the micro-discharge reach the wall of the tube (dielectric substance) to accumulate charges on the surface of the dielectric substance.

This micro-discharge spreads over the wall of the tube, and repeatedly appears and disappears. Such micro-discharge generates flickering of light visible to the naked eye. Streamers at very high temperatures locally and directly reach the wall of the tube, so that the wall of the tube may be quickly degraded.

Besides dielectric barrier discharge, excimer emission can also be efficiently attained by electrodeless discharge. The electrodeless discharge or radio-frequency (RF) discharge is caused by capacitive coupling. The electrodeless discharge may use the same configuration composed of the same lamp and the same electrodes used in the dielectric barrier discharge. The lamp is activated on in response to a high frequency of several megahertz applied between the electrodes. The electrodeless discharge attains such spatially and temporally homogenous discharge to ensure a prolonged service life of the lamp without flickering.

In dielectric barrier discharge, micro-discharge occurs only between the electrodes. To generate discharge in the overall discharging space, the outer surface of the discharge container should be completely covered with the outer electrode composed of a light transmissive material to extract light to the outside.

For this purpose, the electrode used in dielectric barrier discharge is in the form of a net composed of a thin metal wire. The metal wire of the net electrode should be as thin as possible not to block light. Such a net electrode is readily damaged by ozone generated by ultraviolet light in an oxygen atmosphere.

To prevent such damage, the surrounding region of the lamp, namely, the inside of the irradiation apparatus containing the lamp should be placed under an atmosphere of an inert gas, such as nitrogen, and a window composed of synthetic quartz should be provided to extract radiant light. The window composed of synthetic quartz is an expensive consumable part, and causes loss of light.

In a double cylindrical lamp having an outer diameter of about 25 mm, the difference in the traveling distance from the surface of the lamp to the target surface under the lamp is significantly large between the lights perpendicularly incident on the target surface and the lights obliquely incident on the target surface, causing a great difference in illuminance. No homogenous illuminance distribution is also attained even if the lamps are closely aligned. An irradiating apparatus equipped with a window composed of synthetic quartz can provide a fixed radiation distance of the lights in the oxygen atmosphere to attain a homogenous illuminance distribution.

No external net electrode is required in an electrodeless discharge mode. An external electrode may be disposed on part of the outer surface of the lamp to attain glow discharge spreading over the entire discharging space. Typically, the external electrode composed of an aluminum block and also serving as a light-reflecting plate is disposed on the back of the lamp. The lamp has a large outer diameter as in the lamp in the dielectric barrier discharge mode, and needs a synthetic-quartz window to attain a homogenous illuminance distribution.

The most specific feature of a thin tubular excimer lamp is that it has a simple structure. The thin tubular excimer lamp is composed of only a quartz tube having closed ends and a gas for excimer emission encapsulated inside the tube.

The thin tubular excimer lamp has an outer diameter of about 6 nm to 12 mm. A lamp having a significantly large outer diameter needs high starting voltage.

The thin tubular excimer lamp can discharge in a dielectric barrier discharge mode or an electrodeless discharge mode. The thin tubular excimer lamp may have an electrode having a flat surface in contact with the lamp. An electrode having a curved surface along the lamp can firmly fix the lamp, and be in tight contact with the lamp to continue stable discharge. A mirror electrode having a curved surface finished with aluminum also serves as a light-reflecting plate.

A xenon excimer lamp, which radiates ultraviolet light having a single short wavelength of 172 nm, has high luminescence efficiency. This ultraviolet light has a large absorption coefficient to oxygen, and can generate a high concentration of radical atomic oxygen species and ozone from a slight amount of oxygen The light having a short wavelength of 172 nm is known to have high energy which can dissociate bonds of organic substances. The activated oxygen or ozone and high energy of ultraviolet light radiation can achieve reformation of the polysilazane layer in a short time.

Accordingly, the ultraviolet light having a higher throughput than those of light of low pressure mercury lamps and plasma emitting light at wavelengths of 185 nm and 254 nm, respectively, can shorten the treatment time, can reduce the facility in size, and can be applied to irradiation of organic materials and plastic substrates susceptible to thermal degradation.

The excimer lamp can generate light at high efficiency and thus can be activated at low electricity. The excimer lamp radiates energy in the ultraviolet light region at a single wavelength without emitting long wavelength light, which heats the target object; hence, the excimer lamp prevents the target object from being heated by the light emitted onto the object. Such advantages of ultraviolet light are suitable for flexible film materials, such as PET.

Oxygen is required for the reaction during ultraviolet ray irradiation. Since a vacuum ultraviolet ray is absorbed by oxygen, efficiency during the step of ultraviolet ray irradiation is likely to decrease. Therefore, irradiation of the vacuum ultraviolet rays is preferably carried out at a concentration of oxygen and water vapor being as low as possible. That is, an oxygen concentration during a vacuum ultraviolet ray irradiation is preferably in the range of 10 to 10,000 ppm, more preferably, it is in the range of 50 to 5,000 ppm, and still more preferably, it is in the range of 1,000 to 4,500 ppm.

As a gas which is used during vacuum ultraviolet ray irradiation and fills an irradiation atmosphere, a dry inactive gas is preferably used. In particular, a dry nitrogen gas is preferable from the viewpoint of cost. The adjustment of an oxygen concentration may be made by measuring a flow rate of an oxygen gas and an inactive gas introduced in an irradiation chamber and by changing a flow rate ratio.

<<Film Substrate>>

As a film substrate 1 on which a transparent electrode 5 is formed, it can be cited resin films, for example. However, the present invention is not limited to them. A preferably used film substrate 1 is a transparent resin film.

Examples of a resin film includes: polyesters such as polyethylene terephthalate (PET) and polyethylene naphthalate (PEN); polyethylene, polypropylene; cellulose esters or their derivatives such as cellophane, cellulose diacetate, cellulose triacetate, cellulose acetate butylate, cellulose acetate, propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefin resins such as ARTON (produced by JSR Co. Ltd.) and APEL (produce by Mitsui Chemicals, Inc.).

<<Other Constituting Components of Organic EL Element>>

<<Electrode>>

An organic EL element 100 of the present invention has a light-emitting unit including an organic functional layer interposed between a pair of anode and cathode described in the following. The electrodes will be detailed.

<<Anode (Transparent Electrode)>>

As an anode (transparent electrode 5) according to an organic EL element of the present invention, those comprising metal, alloy, a conductive compound, which is provided with a large work function (4 eV or more), and a mixture thereof as an electrode substance are preferably utilized. Specific examples of such an electrode substance include: metals like Au and Ag; a conductive transparent material such as CuI, indium tin oxide (ITO), $SnO_2$ and ZnO. Further, a material such as IDIXO ($In_2O_3$—ZnO), which can prepare an amorphous and transparent electrode, may be also utilized.

As for an anode, these electrode substances may be made into a thin layer by a method such as evaporation or spattering, and a pattern of a desired form may be formed by means of photolithography. In the case of requirement of pattern precision is not so severe (not less than 100 μm), a pattern may be formed through a mask of a desired form at the time of evaporation, or spattering of the above-described substance.

Alternatively, when coatable materials such as organic electrically conductive compounds are employed, it is possible to employ a wet system filming method such as a printing system or a coating system. When emission is taken out of this anode, the transmittance is preferably set to be 10% or more, and the sheet resistance as an anode is preferably a few hundred Ω/square or less. Further, although the layer thickness depends on a material, it is generally selected in the range of 10 to 1,000 nm, and preferably in the range of 10 to 200 nm.

In an organic EL element 100 of the present invention, a preferable anode is a transparent electrode 5 as illustrated in FIG. 1.

The transparent electrode 5 illustrated in FIG. 1 has a two-layer structure of a laminate of an undercoat layer 5a and an electrode layer 5b sequentially disposed on the film substrate 1. Among these layers, the electrode layer 5b is composed of silver or an alloy mainly composed of silver, and the undercoat layer 5a is composed of a compound containing a nitrogen atom, for example.

The transparency of the transparent electrode 5 indicates that the transmittance of light at a wavelength of 550 nm is 50% or more.

(1) Undercoat Layer

The undercoat layer 5a is disposed on the film substrate 1 side of the electrode layer 5b. The undercoat layer 5a may be prepared with any material to inhibit aggregation of silver particles during formation of the electrode layer 5b composed of silver or an alloy mainly composed of silver. Examples of such a material include compounds containing a nitrogen atom.

When an undercoat layer 5a is composed of a low-refractive index material (refractive index: less than 1.7), the upper limit of the layer thickness should be less than 50 nm, and it is preferably less than 30 nm, more preferably less than 10 nm, particularly preferably less than 5 nm. A thickness of less than 50 nm minimizes optical loss. The lower limit of the layer thickness should be 0.05 nm or more, and it is preferably 0.1 nm or more, particularly preferably 0.3 nm or more. A thickness of 0.05 nm or more can attain a homogenous undercoat layer 5a to uniformly inhibit aggregation of silver particles.

When an undercoat layer 5a is composed of a high-refractive index material (refractive index: 1.7 or more), the thickness has any upper limit, and the lower limit of the thickness is the same as in the low-refractive index material.

Only one requirement for the undercoat layer 5a is that a selected thickness of the undercoat layer attains a homogenous layer.

The undercoat layer 5a may be prepared with any compound containing a nitrogen atom in the molecule. Preferred is a compound having a heterocycle containing a nitrogen heteroatom. Examples of the heterocycle containing a nitrogen heteroatom include aziridine, azirine, azetidine, azete, azolidine, azole, azinane, pyridine, azepane, azepine, imidazole, pyrazole, oxazole, thiazole, imidazoline, pyrazine, morpholine, thiazine, indole, isoindole, benzoimidazole, purine, quinoline, isoquinoline, quinoxaline, cinnoline, pteridin, acridine, carbazole, benzo-C-cinnoline, porphyrin, chlorin, and choline.

Examples of the method of forming the undercoat layer 5a include wet processes, such as application, ink jetting, coating, and dipping, and dry processes, such as vapor deposition processes (e.g., resistive heating deposition and electron beam (EB) deposition), sputtering, and chemical vapor deposition (CVD). Among these processes, preferably used are deposition processes.

(2) Electrode Layer

The electrode layer 5b is composed of silver or an alloy containing silver as a main component. It is formed on the undercoat layer 5a. Here, "main component" indicates a component having a maximum constituting ratio among all of the components constituting the electrode layer 5b.

Examples of an alloy containing silver (Ag) as a main component which constitutes the electrode layer 5b are: silver magnesium (AgMg), silver copper (AgCu), silver palladium (AgPd), silver palladium copper (AgPdCu), and silver indium (AgIn).

The above-described electrode layer 5b may have a constitution in which plural layers are laminated, each layer being made of silver or containing silver as a main component.

A thickness of the electrode layer 5b is preferably in the range of 2 to 15 nm, more preferably in the range of 3 to 12 nm, and still more preferably in the range of 4 to 9 nm. When the thickness is smaller than 15 nm, an absorbing component or a reflection component of the layer becomes small, and transmittance of the transparent metal electrode becomes large. When the thickness is larger than 2 nm, conductivity of the layer may be sufficiently secured.

The transparent electrode 5, which has a laminated structure made of the undercoat layer 5a formed thereon the electrode layer 5b, may be covered with a protective layer on the upper portion of the electrode layer 5b, or may be laminated with other electrode layer. In this case, it is preferable that the protective layer or the other electrode layer has a light transmitting property in order to avoid deterioration of light transmitting property of the transparent electrode 5.

Examples of the method of forming the electrode layer 5b include wet processes, such as application, ink jetting, coating, and dipping, and dry processes, such as vapor deposition processes (e.g., resistive heating deposition and electron beam (EB) deposition), sputtering, and chemical vapor deposition (CVD). Among these processes, preferably used are deposition processes.

Although the electrode layer 5b deposited on the undercoat layer 5a has sufficient conductivity without annealing at high temperature after deposition, the deposited electrode layer 5b may be annealed at high temperature after deposition if necessary.

The transparent electrode 5 having a constitution as described above has a constitution in which an electrode layer 5b composed of silver or an alloy containing silver as a main component is provided on an undercoat layer 1a formed by using a nitrogen containing compound. By this constitution, silver atoms composing the electrode layer 5b will interact with the nitrogen containing compound composing the undercoat layer 5a. As a result, the silver atom will decrease its diffusion distance on a surface of the undercoat layer 5a, and aggregation of silver atoms will be prevented.

Here, in the film formation of the electrode layer 5b made of silver as a main component, increase of film formation is done with a nucleus growth type (Volumer-Weber: VM type). The silver grains tend to be isolated, and it is difficult to obtain conductivity when the thickens is small. The sheet resistivity will become high. Therefore, it is necessary to increase the thickness to secure the conductivity. When the thickness is increased, the light transmitting property will be decreased. This is not appropriate for the transparent metal electrode.

However, in the transparent electrode 5, aggregation of silver atoms will be prevented on the undercoat layer 5a as described above. As a result, increase of film formation is done with a mono-layer growth type (Frank-van der Merwe: FM type) in the film formation of the electrode 5b composed of silver or an alloy containing silver as a main component.

Here, "transparency" of the transparent electrode 5 indicates a property that a light transmittance at a wavelength of 550 nm is 50% or more. The above-described materials used for the undercoat layer 5a is sufficiently transparent compared with the electrode layer 5b made of silver or an alloy containing silver as a main component, and forms a preferable film. On the other hand, the conductivity of the transparent electrode 5 is secured mainly by the electrode layer 5b. Consequently, the electrode layer 5b made of silver or an alloy containing silver as a main component secures conductivity with a thinner layer. Thus, it is possible to achieve improvement of both conductivity and light transmittance of the transparent metal electrode 5.

<<Cathode>>

A cathode (opposite electrode 7) is an electrode film that functions as a cathode to supply electrons to the organic light-emitting unit 6. A metal, an alloy, a conductive compound and a mixture thereof, which have a small work function (4 eV or less) are used as an electrode substance.

Specific examples of such an electrode substance include: sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against oxidation, preferable are: a mixture of election injecting metal with a second metal which is stable metal having a work function larger than electron injecting metal. Examples thereof are: a magnesium/silver mixture, a magnesium/aluminum mixture, a magnesium/indium mixture, an aluminum/aluminum oxide ($Al_2O_3$) mixture, a lithium/aluminum mixture and aluminum.

The sheet resistance as a cathode is preferably not more than a few hundred Ω/square, and the layer thickness is generally selected in the range of 10 nm to 5 μm, and preferably in the range of 5 to 200 nm. Herein, to transmit produced emission, either one of an anode or a cathode of an organic EL element is preferably transparent or translucent to improve the emission, luminance.

Further, after forming the cathode made of the above-described metal having a thickness of 1 to 20 nm, and by depositing a conductive transparent material as described in the anode section, it is possible to prepare a transparent or translucent cathode in such a manner that electrically conductive transparent materials are prepared thereon. By applying the above, it is possible to produce an element in which both anode and cathode are transparent.

When emitted light h is intended to be taken out also from the side of the cathode (the opposite electrode 7) of this organic EL element 100, a good light transparent conductive material is selected among the above-described materials, and the opposite electrode 7 is suitably constituted.

A cathode may be prepared by forming a thin layer of the electrode material with a vapor deposition or a spattering method.

<<Auxiliary Electrode>>

An auxiliary electrode 9 is provided in order to decrease the resistivity of the transparent electrode 5. It is placed in contact with the electrode layer 5b of the transparent electrode 5. Materials used for forming the auxiliary electrode 9 are preferably low resistive metals such as gold, platinum, silver, copper, and aluminum. Since these metals have a low light transmitting property, it is formed in a pattern within the region that will not affect the extracting of emitted light h from the light extracting surface 13a.

A line width of the auxiliary electrode 9 is preferably 50 μm or less from the viewpoint of opening ratio of the light extracting. A thickness of the auxiliary electrode 9 is preferably 1 μm or more from the viewpoint of conductivity.

As a forming method of the auxiliary electrode 9, it may be cited: a vapor deposition method, a sputtering method, a printing method, an inkjet method and an aerosol jet method.

<<Extraction Electrode>>

An extraction electrode 8 electrically connects a transparent electrode 5 with an outer electric source. The materials thereof are not specifically limited, and known materials are suitably used. For example, it may use a metal film composed of a three-layered structure of MAM electrode (Mo/Al—Nd alloy/Mo).

<<Light-Emitting Unit>>

A light-emitting unit 6 of the present invention is a light-emitting body (unit) mainly composed of organic functional layers such as a light-emitting layer, a hole transport layer, and an electron transport layer. They incorporate various types of organic compounds described later. The light-emitting body is interposed between a pair of electrodes composed of an anode and a cathode. The hole supplied from the anode and the electron supplied from the cathode will be recombined in the light-emitting body to result in producing light.

An example of the light-emitting unit 6 of the present invention has a laminated structure in the sequential order from the transparent electrode 5 as an anode with: a hole injection layer 6a/a hole transport layer 6b/a light-emitting layer 6c/an electron transport layer 6d/an electron injection layer 6e. Each layer will be described in detail in the following.

<Light-Emitting Layer>

A light-emitting layer 6c used in the present invention preferably contains a phosphorescence emitting compound as a light-emitting material.

This light-emitting layer 6c is a layer in which electrons injected from the electrode or the electron transport layer 6d and holes injected from the hole transport layer 6b are recombined to emit light. The light-emitting portion may be inside of the light-emitting layer 6c, or may be at an interface between the light-emitting layer 6c and the adjacent layer thereto.

The constitution of the light-emitting layer 6c is not specifically limited as long as the contained light-emitting material satisfies the light-emitting requirement. It may be composed of a plurality of layers having the same light-emitting spectrum or the same maximum wavelength. In this case, it is preferable that a non-light-emitting intermediate layer (not shown in the figure) is contained between each light-emitting layer 6c.

A total thickness of the light-emitting layer 6c is preferably in the range of 1 to 100 nm, more preferably in the range of 1 to 30 nm in order to achieve a lower driving voltage.

Here, the total thickness of the light-emitting layer 6c indicates a thickness including the intermediate layer when there is a non-light emitting intermediate layer among the light-emitting layer 6c.

When the constitution of the light-emitting layer 6c is made by laminating plural layers, it is preferable that each light-emitting layer is adjusted to have a thickness in the range of 1 to 50 nm, more preferably, in the range of 1 to 20 nm. When the laminated plural light-emitting layers each correspond to an emitting light of blue, green and red, there is no specific limitation to the relationship of the thickness of each light-emitting layer of blue, green and red.

A plurality of light-emitting materials may be mixed in the light-emitting layer 6c. It may be used a combination of a phosphorescent compound (phosphorescent dopant) and a fluorescent material (fluorescent dopant) in the same light-emitting layer 6c.

As a constitution of the light-emitting layer 6c, it is preferable that it contains a host compound (light-emitting host) and a light-emitting material (light-emitting dopant), and that light-emission is made from the light-emitting material.

The above-described light-emitting layer 6c may be formed by using known light-emitting material or host compounds with known thin film forming methods such as: a vapor deposition method, a spin coating method a cast method, an LB method, and an inkjet method.

(1) Host Compound

A preferable host compound incorporated in a light-emitting layer 6c is a compound having a phosphorescent quantum yield of the phosphorescence emission of less than 0.1 at room temperature (25° C.). More preferably, the phosphorescent quantum yield is less than 0.01. Further, among the compounds incorporated in the light-emitting layer 6c, it is preferable that the volume ratio of the host compound in the aforesaid layer is at least 50%.

It may be used a known host compound singly or it may be used in combination with a plurality of known host compounds. It is possible to control the transfer of charges by making use of a plurality of host compounds, which results in high efficiency of an organic EL element 100. In addition, it is possible to mix a different emission lights by making use of a plurality of light-emitting dopants which will be described later. Any required emission color may be obtained thereby.

Further, a light-emitting host used in the present invention may be either a low molecular weight compound or a polymer compound having a repeating unit, in addition to a low molecular weight compound provided with a polymerizing group such as a vinyl group and an epoxy group (a polymerizable light-emitting host after vapor deposition). These compounds may be used singly or in combination of two or more compounds.

As a known host compound which may be used together, preferable is a compound having properties of hole transport ability and electron transport ability, and at the same time, preventing longer wavelength of emitted light and having a high Tg (glass transition temperature).

Here, the glass transition temperature (Tg) is a value obtained using DSC (Differential Scanning calorimetry) based on the description of JIS K 7121.

As specific examples of a host compound, the compounds described in the following documents are preferable.

For example, JP-A Nos. 2010-2516075, 2001-257076, 2002-308855, 2001-313179, 2002-319491-2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

(2) Light-Emitting Material

As light-emitting materials used for the present invention, it can be cited fluorescence emitting compounds (also referred to as fluorescent compounds or fluorescent materials) and phosphorescence emitting compounds (also referred to as phosphorescent compound, or phosphorescent materials).

<Phosphorescent Compound>

The phosphorescent compound of the present invention is a compound, wherein emission from an excited triplet state thereof is observed, specifically, emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescent compound of the present invention to exhibit the above phosphorescence quantum yield (0.01 or more) using any of the appropriate solvents.

Two kinds of principles regarding emission of a phosphorescent compound are cited. One is an energy transfer-type, wherein carriers recombine on a host compound on which the carriers are transferred to produce an excited state of the host compound, and then via transfer of this energy to a phosphorescent dopant, emission from the phosphorescence-emitting dopant is realized. The other is a carrier trap-type, wherein a phosphorescence-emitting dopant serves as a carrier trap and then carriers recombine on the phosphorescent dopant to generate emission from the phosphorescent dopant. In each case, the excited state energy level of the phosphorescent dopant is required to be lower than that of the host compound.

A phosphorescent compound usable in the present invention may be selected from the known compounds used in the light-emitting layers of the organic EL elements.

Preferable compounds are metal complexes containing a metal belonging to groups 8 to 10 in the periodic table. More preferable compounds are an iridium compound, an osmium compound, a platinum compound (platinum complex compound), or a rare earth complex. Among them, most preferable is an iridium compound.

In the present invention, at least one light-emitting layer 6c may contain two or more kinds of phosphorescent compounds. The density ratio of the phosphorescent compound in the light-emitting layer 6c may vary in the thickness direction of the light-emitting layer 6c.

The content of the phosphorescent compound in the light-emitting layer 6c is in the range of 0.1 volume % or more to less than 30 volume % based on the total amount of the light-emitting layer 6c.

The phosphorescent compound may be suitably selected and used from the known compounds used in the light-emitting layer of an organic EL element.

Specific examples of a phosphorescent compound are compounds described in JP-A No. 2010-251657. However, the present invention is not limited to them.

<Fluorescent Compound>

As fluorescent dopants, listed are compounds such as: coumarin based dyes, pyran based dyes, cyanine based dyes, croconium based dyes, squarylium based dyes, oxobenzanthracene based dyes, fluorescein based dyes, Rhodamine based dyes, pyrylium based dyes, perylene based dyes, stilbene based dyes, polythiophene based dyes, and rare earth complex based fluorescent materials.

<Injection Layer: Hole Injection Layer and Electron Injection Layer>

An injection layer is a layer which is arranged between an electrode and a light-emitting layer 6c to decrease a driving voltage and to improve an emission luminance, which is detailed in volume 2, chapter 2 (pp. 123-166) of "Organic EL Elements and Industrialization Front thereof (Nov. 30, 1998, published by N. T. S. Corp.)", and it includes a hole injection layer 6a and an electron injection layer 6e.

An injecting layer is provided when needed. A hole injection layer 6a may be provided: between an anode and a light-emitting layer 6c or a hole transport layer 6b. An electron injection layer 6e may be provided: between a cathode and a light-emitting layer 6c or an electron transport layer 6d.

A hole injection layer 6a is also detailed in publications such as JP-A Nos. 9-45479, 9-260062 and 8-288069. Specific examples thereof include: a phthalocyanine buffer layer containing such as copper phthalocyanine; an oxide buffer layer containing such as vanadium oxide; an amorphous carbon buffer layer; and a polymer buffer layer employing conductive polymer such as polyaniline (or called as emeraldine) or polythiophene.

An election injection layer 6e is detailed in JP-A Nos. 6-325871, 9-17574, and 10-74586. Examples thereof include: a metal layer made of such as strontium and aluminum; an alkaline metal halide layer made of such as potassium fluoride; an alkaline earth metal compound layer made of such as magnesium fluoride; and an oxide layer made of such molybdenum oxide. The above-described election injection layer 6e is preferably a very thin layer, and the layer thickness is preferably in the range of 1 nm to 10 μm, although it depends on a raw material.

<Hole Transport Layer>

A hole transport layer 6b contains a hole transport material having a function of transporting a hole, and in a broad meaning, a hole injection layer 6a and an electron blocking layer are also included in a hole transport layer 6b. A hole transport layer 6b may be provided as a single layer or a plurality of layers.

A hole transport material is a material having any one of properties to inject or transport a hole or a barrier property to an electron, and it may be either an organic substance or an inorganic substance. For example, listed materials are a triazole derivative, an oxadiazole derivative, an imidazole derivative, a polyarylalkane derivative, a pyrazolone derivative, a phenylenediamine derivative, an arylamine derivative, an amino substituted chalcone derivative, an oxazole derivatives, a styrylanthracene none derivative, a hydrazone derivative, a stilbene derivative, a silazane derivative, an aniline type copolymer, or conductive polymer oligomer, and specifically preferably such as thiophene oligomer.

As a hole transport material, those described above may be utilized, however, it is preferable to utilized a porphyrin compound, an aromatic tertiary amine compound and a styrylamine compound, and specifically preferably an aromatic tertiary amine compound.

Representative examples of an aromatic tertiary amine compound and a styrylamine compound include: N,N,N',N'-tetraphenyl-4,4'-diaminophenyl; N,N'-diphenyl-N,N-bis(3-methylphenyl)-(1,1'-biphenyl)-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-metylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole. In addition, there are cited those having two condensed aromatic rings in the molecule described in U.S. Pat. No. 5,061,569, such as 4,4'-bis[N-(1-naphthyl)-N-phenylamino]biphenyl(NDP), and 4,4',4"-tris[N-(3-methylphenyl)-N-phenylamino]triphenylamine (MDTDATA), in which three of triphenyl amine units are bonded in a star burst form, as described in JP-A No. 4-308688.

Polymer materials, in which these materials are introduced in a polymer chain or in the main chain of polymer, may be also utilized. Further, an inorganic compound such as a p-type Si and a p-type SiC may be utilized as a hole injection material and a hole transport material.

Further, it is possible to employ so-called p-type hole transport materials, as described in JP-A No. 11-251067, and J. Huang et al., Applied Physics Letters 80(2002), p. 139. In the present invention, since a highly-efficient light-emitting element may be prepared, it is preferable to employ these materials.

Further, it is possible to increase p-property of a hole transport layer 6b by doping with an impurity. As examples thereof, listed are those described in JP-A Nos. 4-297076, 2000-196140, 2001-102175, as well as in J. Appl. Phys., 95, 5773 (2004).

It is preferable to employ a hole transport layer 6b of such a high p-property, since it is possible to produce an element of lower electric power consumption.

This hole transport layer 6b may have a single layer structure composed of one or plural types of the above described materials.

The layer thickness of a hole transport layer 6b is not specifically limited, however, it is generally 5 nm to 5 μm, and preferably 5 to 200 nm.

The hole transport layer 6b may be prepared by forming a thin layer made of the above-described hole transport material according to a method well known in the art such as a vacuum evaporation method, a spin coating method, a cast method, a printing method including an inkjet method and a LB method.

<Electron Transport Layer>

An electron transport layer 6d contains an electron transport material having a function of transporting an electron, and in a broad meaning, an electron injection layer 6e and a hole blocking layer (not illustrated in the figure) are also included in an electron transport layer 6d. An electron transport layer 6d may be provided as a single layer or a plurality of layers.

In a single layered electron transport layer 6d, and in a laminated layered electron transport layer 6d, the only requirement for an electron transport material (it may be used as a hole blocking material) is to have a function of transferring an electron injected from the cathode into the light-emitting layer 6c. Any compounds may be selected from the known compounds.

Examples of such compound include: a nitro-substituted fluorene derivative, a diphenylquinone derivative, a thiopyradineoxide derivative, carbodiimide, a fluorenylidenemethane derivative, anthraquinonedimethane, an anthrone derivative, and an oxadiazole derivative. In addition, a thiadiazole derivative which has a structure of replacing an oxygen atom in the oxadiazole ring with a sulfur atom, and a quinoxaline derivative which has a quinoxaline ring known as an electron inductive group are also used for a material in an electron transport layer 6d. In addition, polymer materials, in which these materials are introduced in a polymer chain or in the main chain of polymer, may be also utilized.

Further, the following may be used as a material for an electron transport layer 6d: a metal complex of a 8-quinolinol derivative such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb.

Further, metal-free or metal phthalocyanine, or a compound whose terminal is substituted by an alkyl group or a sulfonic acid group, may be preferably utilized as a material for an electron transport layer 6d. In addition, a distyryl pyrazine derivative used as a material for a light-emitting layer 6c is also used as a material for an electron transport layer 6d. In the same manner as used for a hole injection layer 6a and a hole transport layer 6b, an inorganic semiconductor such as an n-type Si and an n-type SiC may be also utilized as a material for an electron transport layer 6d.

Further, it is possible to increase an n-property of an electron transport layer 6d by doping with an impurity. As examples thereof, listed are those described in each of JP-A Nos. 4-297076, 10-270172, 2000-196140, 2001-102175, as well as in J. Appl. Phys., 95, 5773 (2004). Further, it is preferable to incorporate potassium or a potassium compound in the electron transport layer 6d. As a potassium compound, it may use potassium fluoride, for example. When the n-property of the electron transport layer 6d is made high, it is possible to produce an element of lower electric power consumption.

As a material for an electron transport layer 6d (an electron transport compound), it may use the same compound which constitutes an undercoat layer 5a as described above. This is the same for an electron transport layer 6d which serves also as an electron injection layer 6e. It may use the same compound which constitutes an undercoat layer 5a as described above.

The layer thickness of the electron transport layer 6d is not specifically limited, however, it is generally about 5 nm to 5 µm, and preferably it is 5 to 200 nm. The electron transport layer 6d may be a single layer structure containing one or more types of the above-described materials.

An electron transport layer 6d is preferably formed in a film with the above-described material by the following known methods, for example: a vacuum deposition method, a spin coating method, a cast method, a printing method including an ink-jet method, and a LB method.

<Blocking Layer: Hole Blocking Layer and Electron Blocking Layer>

A blocking layer is appropriately provided according to necessity, in addition to the above-described basic constituting layers of organic compounds. For example, there is a hole blocking (hole block) layer described in JP-A Nos. 11-204258 and 11-204359 and p. 237 of "Organic EL Elements and Industrialization Front thereof (Nov. 30, 1998), published by N. T. S. Corp.)".

A hole blocking layer, in a broad meaning, is provided with a function of an electron transport layer 6d. A hole blocking layer is composed of a material having a function of a transporting an electron but a very small ability of transporting a hole. It can improve the recombination probability of an electron and a hole by blocking a hole while transporting an electron. Further, a constitution of an electron transport layer 6d described later may be appropriately utilized as a hole blocking layer according to the present invention when needed. The hole blocking layer is preferably arranged adjacent to the light-emitting layer 6c.

On the other hand, an electron blocking layer has a function of a hole transport layer 6b. An electron blocking layer is composed of a material having a function of transporting a hole but a very small ability of transporting an electron. It can improve the recombination probability of an electron and a hole by blocking an electron while transporting a hole. Further, a constitution of a hole transport layer 6b described later may be appropriately utilized as an electron blocking layer when needed. The thickness of the hole blocking layer according to the present invention is preferably 3 to 100 nm, and more preferably, it is 5 to 30 nm.

<<Sealing Material>>

A sealing material 10 covers the organic EL element 100. It may be a plate type (a film type) sealing material that is fixed to the side of the film substrate 11 through an adhesive 11, or it may be a sealing film. The sealing material 10 is placed in a condition of covering at least the organic light-emitting unit 6, with exposing edge portions of the transparent metal electrode 5 and the opposite electrode 7 of the organic EL element 100. It may be constituted that an electrode is provided to the sealing material 10 so that this electrode and edge portions of the transparent metal electrode 5 and the opposite electrode 7 of the organic EL element 100 are made in a conduction state.

As a plate type (or film type) sealing material 10, it is preferable to be provided with flexibility as the transparent substrate 13. Specifically listed are a flexible glass substrate, a polymer substrate, and a metal substrate. These substrates may be used in a thinner film shape. Examples of a glass substrate include: soda-lime glass, barium-strontium containing glass, lead glass, aluminosilicate glass, borosilicate glass, barium borosilicate glass, and quartz. Further, examples of a polymer substrate include: polycarbonate, acryl, polyethylene terephthalate, polyether sulfide, and polysulfone. A metal substrate includes one made of a metal or an alloy selecting from the group consisting of stainless steel, iron, copper, aluminum, magnesium, nickel, zinc, chromium, titanium, molybdenum, silicon, germanium, and tantalum, or an alloy thereof.

Among them, since it is possible to make an element in a thin film, a polymer substrate or a metal substrate in a thin film state is preferably used as a sealing material.

Further, an oxygen permeability of the film state polymer substrate is preferably $1 \times 10^{-3}$ ml/(m²·24 h·atm) or less determined by the method based on JIS K 7126-1987, and a water vapor permeability thereof is preferably $1\times10^{-3}$ g/(m$^2$·24 h) or less (at 25±0.5° C., relative humidity: 90±2% RH) determined by the method based on JIS K 7129-1992.

The above-described substrate materials may be used for the sealing material 10 after converting them into a concave shape. Conversion of the sealing material into a concave shape is carried out employing a sand blast process or a chemical etching process.

An adhesive 11 used for fixing the plate type sealing material 10 to the film substrate 1 is employed as a sealing agent to seal the organic EL element 100 that is interposed between sealing material 10 and the film substrate 1. Specific examples of an adhesive 11 are: a photo-curing and heat-curing type adhesive having a reactive vinyl group such as an acrylic acid based oligomer and a methacrylic acid based oligomer; a moisture curing type adhesive such as 2-cyanoacrylates.

A further example of an adhesive 11 is a thermal and chemical curing type (two liquid mixing type) such as an epoxy based adhesive. Further, it may be listed hot-melt type polyamide, polyester, and polyolefin. Moreover, it may be listed a cationically curable type UV curable epoxy resin adhesive.

In addition, since the organic materials constituting the organic EL element 100 are occasionally deteriorated via a thermal process, the adhesive 11 is preferably a material which enables adhesion and curing between room temperature (25° C.) and 80° C. Further, a desiccating agent may be dispersed into the adhesive 11.

The adhesive 11 may be applied onto a sealing portion of the plate type sealing material 10 and the film substrate 1 via a commercial dispenser, or may be printed thereon in the same manner as a screen printing.

When a space is formed between the sealing material 10, the film substrate 1, and adhesive 11, it is preferable to inject an inert gas such as nitrogen or argon, or an inert liquid such as a fluorinated hydrocarbon or a silicon oil in the space. It may be made to a vacuum state. Further, a hygroscopic compound may be enclosed in the space Examples of a hygroscopic compound include: metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates
(for example, barium perchlorate and magnesium perchlorate). In sulfates, metal halides, and perchlorates, suitably employed are anhydrides.

On the other hand, when a sealing film is used as a sealing material 10, the sealing film is used for fully covering the organic light-emitting unit 6 of the organic EL element 100, and at the same time, it covers the film substrate 1 with a condition that the edge portions of the transparent metal electrode 5 and the opposite electrode 7 of the organic EL element 100 are exposed.

The sealing film is composed of an inorganic material or an organic material. In particular, it is composed of a material having a function of preventing the penetration of the substance which induces deterioration of the organic light-emitting unit 6 of the organic EL element 100. Examples of the material are inorganic materials such as silicon oxide, silicon dioxide, and silicon nitride. Further, in order to improve brittleness of the sealing film, it may be formed a laminated structure by using a film made of an organic material in addition to the film made of an inorganic material.

The forming methods of these film are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method.

<<Protective Film and Protective Plate>>

A protective film or a protective plate (not illustrated in the figure) may be provided by interposing the film substrate 1, the organic EL element 100, and the sealing material 10. This protective film or protective plate may be arranged to enhance the mechanical strength of the organic EL element 100. Specifically, when the sealing material 10 is achieved via the sealing film, the resulting mechanical strength of the organic EL element 100 is not always high enough. In this case, it is preferable to arrange the protective film or the protective plate.

Usable materials for the protective film or the protective plate include: a glass plate, a polymer plate, a polymer film thinner than the polymer plate, a metal plate, a metal film thinner than the metal plate, a polymer material film, or a metal material film. Among these, in terms of light weight and a decrease in thickness of the element, it is preferable to employ a polymer film.

<<Production Method of Organic EL Element>>

Here, a production method of an organic EL element 100 illustrated in FIG. 1 is described as an example.

At first, a first gas barrier layer 2a is formed on a film substrate 1 with a plasma chemical deposition method. A polysilazane containing liquid is applied thereon. Then, the coated layer is irradiated with VUV rays to reform the layer. Thus, a second gas barrier layer 2b is formed.

Subsequently, a resin material containing solution in which light scattering particles having an average particle size of 0.2 μm or more was applied to form a light scatter layer 3. Then, on the light scatter layer 3, there is formed a smooth layer 4 (a first smooth layer 4a) containing an oxide or a nitride of silicon or niobium as a main component with a dry process or a wet process.

Subsequently, on the first smooth layer 4a is formed an undercoat layer 5a composed of a nitrogen containing compound so as to have a thickness of 1 μm or less, preferably in the range of 10 to 100 nm with a suitable method such as a vapor deposition method.

Subsequently, an electrode layer 5b composed of silver (or an alloy mainly composed of silver) is formed on the undercoat layer 5a so as to have a thickness of 12 nm or less, preferably in the range of 4 to 9 nm with a suitable method such as a vapor deposition method. Thus, it is formed a transparent metal electrode 5 to become an anode. At the same time, an extraction electrode 8 is formed with a suitable method such as a vapor deposition method on the edge of the transparent metal electrode 5 to be connected to the outer electric source.

Subsequently, on this is formed an organic light-emitting unit 6 by laminating: a hole injection layer 6a, a hole transport layer 6b, a light-emitting layer 6c, an electron transport layer 6d, and an electron injection layer 6e in this order.

These layers each may be formed with a spin coating method, a casting method, an inkjet method, a vapor deposition method, and a printing method. From the viewpoint of obtaining a homogeneous layer and hardly producing pinholes, a vacuum vapor deposition method, or a spin coating method is particularly preferred. It may be applied a different formation method for each layer. When a vapor deposition method is employed for forming each of these layers, the deposition conditions may vary depending on the type of compound used. Usually, it is preferable to suitably select the conditions of: a boat heating temperature of 50 to 450° C., a vacuum level of $1\times10^{-6}$ to $1\times10^{-2}$ Pa, a deposition rate of 0.01 to 50 nm/sec, a substrate temperature of −50 to 300° C. and a thickness of 0.1 to 5 µm.

After forming the organic light-emitting unit 6 as described above, an opposite electrode 7 to become a cathode is formed with a suitable method such as a vapor deposition method on the upper position of the organic light-emitting unit 6. At this moment, the opposite electrode 7 is formed having a pattern in a shape drawing the terminal portion to the periphery of the transparent substrate from above the organic light-emitting unit 6, while keeping the insulating condition with the transparent electrode 5 by the organic light-emitting unit 6. By this, an organic EL element 100 may be obtained. Further, a sealing material 10 is placed to cover at least the organic light-emitting unit 6, the first smooth layer 4a and the light scatter layer 3, while keeping the state of exposing the terminal portions of the transparent metal electrode 5 (the extraction electrode 8) of the organic EL element 100 and the opposite electrode 7.

By the steps described above, an organic EL element 100 having a required light-emitting pattern may be produced on the film substrate 1. In the production of the organic EL element 100, it is preferable that the production from the organic light-emitting unit 6 to the opposite electrode 7 is done with one time vacuuming operation. However, it may employ a different production method by extracting the film substrate 1 from the vacuum atmosphere on the way. In that case, it is required to conduct the operations under a dry inert gas atmosphere.

When a direct-current voltage is applied to the produced organic EL element 100, the transparent electrode 5 as an anode is made to have a plus(+) polarity, and the opposite electrode 7 as a cathode is made to have a minus(−) polarity. By applying voltage of 2 o 40 v, light emission may be observed. Further, an alternating-current voltage may be applied. In addition, an arbitrary wave shape may be used for the applying alternating-current.

<<Advantageous Effects of Organic EL Element>>

The organic EL element 100 according to the present invention includes: the gas barrier layer 2, the light scatter layer 3 and the first smooth layer 4a between the transparent electrode 5 having both conductivity and light transmittance and the film substrate 1. Such a configuration can reduce optical loss caused by total reflection between the transparent electrode 5 and the film substrate 1 to enhance the luminescence efficiency of the organic EL element 100.

The organic EL element 100 includes the transparent electrode 1 as an anode, on which the organic light-emitting unit 6 and the opposite electrode or cathode 7 are disposed. Such a configuration can attain light emission at high luminance of the organic EL element 100 by a sufficient voltage applied between the transparent electrode 5 and the opposite electrode 7, and can enhance the light extraction efficiency of the emitted light h from the transparent electrode 5 to attain high luminance. This configuration can also reduce the driving voltage for providing a predetermined luminance to prolong the service life.

<<Application of Organic EL Element>>

An organic EL element 100 of the present invention may be used for a various types of illumination light sources, since it is a surface-emitting body. Examples of an illumination light source include: illumination devices of a home use illumination and a car room illumination, a backlight of a watch or a liquid crystal, a panel advertisement, a light source for a signal, a light source for an optical memory medium, a light source for an electrophotographic copier, a light source for an optical telecommunication processor and a light source for a photo-sensor. These are applications which make use of the features of a surface-emitting body.

Further, an organic EL element 100 of the present invention may be utilized as one type of lamp for an illumination and an exposure light, and it may be also utilized for a projector of an image projecting type, or for a display device (a display) which is used for directly viewing still images and moving images. In this case, in accordance with a large size illumination device and display recently developed, it may be used as a tiling form in which a plurality of light-emitting panels provided with an organic EL element 100 are bonded together to achieve an enlarged light-emitting surface.

An operating mode in the case of being utilized as a display device for playback of moving images may be either a simple matrix (a passive matrix) mode or an active matrix mode. In addition, a color or a full-color display device may be prepared by utilizing at least two types of organic EL elements 100 of the present invention which emit different emitting colors.

In the following, a lighting device will be described as an example of a use. Then, it will be described a lighting device with an enlarged size of light-emitting surface by tiling.

An organic EL element 100 of the present invention may be used for a lighting device.

<<Lighting Device>>

A lighting device employing an organic EL element 100 of the present invention may be provided with a resonator structure to the organic EL element as the above-described. A utilization purpose of such an organic EL element 100 provided with a resonator structure includes such as a light source for an optical memory medium, a light source for an electrophotographic copier, a light source for an optical telecommunication processor and a light source for a photo-sensor, however, the utilization purpose is not limited to them. Further, the organic EL element may be utilized for the above-described applications by making to perform laser emission.

The materials used for an organic EL element 100 of the present invention may be applied to an organic EL element producing substantially white light (it is called as a white organic EL element). Plural emission colors are simultaneously emitted by plural number of emission materials to obtain white light by mixing colors. A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained.

Further, a combination of emission materials to obtain plural number of emission colors may be either a combination comprising plural number of materials which emit phosphoresce or fluorescence, or a combination of a material which emits phosphoresce or fluorescence and a dye material which emits by light from an emission material as exiting light, however, in a white organic EL element according to the present invention, it may be mixed with plural emission dopants in combination.

This white organic EL element is different from a white organic EL device in which plural colors of emission elements are arranged parallel in an alley form, and a white organic EL itself emits white light. Therefore, it is not required a mask for forming almost all of the constituting layers. The layer formation can be done all over the plane with methods such as an evaporation method, a cast method, a spin coat method, an inkjet method and a printing method, resulting in improvement of productivity.

An light-emitting material utilized in a light-emitting layer is not specifically limited, and in the case of a backlight of a liquid crystal display element, any combination by arbitrary selection among metal complexes according to the present invention or light-emitting materials well known in the art can be utilized so as to be fitted to the wavelength range corresponding to CF (color filter) characteristics, whereby white emission can be obtained.

By employing the white organic EL element as described above, it is possible to produce a lighting device which emits substantially white light.

EXAMPLES

Hereafter, the present invention will be described specifically by referring to examples, however, the present invention is not limited to them. In examples, the term "%" is used. Unless particularly mentioned, it represents "mass %".
<<Preparation of Substrate>>
(1) Preparation of Substrate 1
(1-1) Film Substrate A biaxially oriented polyethylene naphthalate film (PEN film having a thickness of 100 μm and a width of 350 mm, Neotex™ Q65FA made by Teijin DuPont Films Co. Ltd.) was used as a film substrate.
(1-2) Preparation of Primer Layer In the subsequent step, an UV-curable organic/inorganic hybrid hard coat material OPSTAR Z7501 was applied with a wire bar to an easy-adhesion surface of the film substrate to obtain a coated layer with a dry thickness of 4 μm. Then, the layer was dried at 80° C. for three minutes, and was cured with a high pressure mercury lamp at 1.0 J/cm² under an air atmosphere to form a primer layer.

The maximum cross-section height Ra (p) that indicates the surface roughness was 5 nm.

The average surface roughness Ra is determined by atomic force microscopy (made by Digital Instrument Co. Ltd.). The irregularity of a surface is continuously measured with a detector equipped with a stylus having a micro tip with an extremely small radius to calculate the roughness from the cross-sectional curve of the irregularity. The fine irregularity over a 30 μm section on the surface is measured three times with the stylus having a micro tip with an extremely small radius to average the three roughness values determined from fluctuations caused by the fine irregularity.
(1-3) Preparation of First Gas Barrier Layer The film substrate was loaded in a CVD apparatus, and a first gas barrier layer having a thickness of 300 nm was prepared with the following layer forming conditions (plasma CVD conditions) so that to obtain each element profile as illustrated in FIG. 6.
<Layer Forming Conditions>

Supplying amount of raw material gas (hexamethylene disiloxane, HMDSO: $(CH_3)_6Si_2O$): 50 sccm (Standard Cubic Centimeter per Minutes)

Supplying amount of oxygen gas ($O_2$): 500 sccm

Vacuum level in vacuum chamber: 3 Pa

Impressed electric power from power source for plasma generation: 0.8 kW

Frequency of power source for plasma generation: 80 kHz

Transport rate of resin substrate having a smoothing layer: 0.5 to 1.66 m/min
(1-4) Preparation of Second Gas Barrier Layer A dibutyl ether solution containing 10 mass % of perhydropolysilazane (PHPS) (AQUAMICANN120-10, non-catalysis type, made by AZ Electronic Materials, Ltd.) was used for a coating liquid.

The prepared coating liquid for forming a polysilazane layer as described above was coated with a wire bar so that the dried (average) thickness became 300 nm. The coated layer was treated under the condition of temperature 85° C. and relative humidity 55% for one minute to dry. The sample was further kept under an atmosphere of temperature 25° C. and relative humidity 10% (dew point: −8° C.) for 10 minute to perform a dehumidification treatment and to form a polysilazane layer.

Subsequently, the formed polysilazane layer was subjected to a silica conversion treatment with a UV apparatus as described below under an atmospheric pressure.
<UV Ray Irradiation Apparatus>

Apparatus: Excimer irradiation apparatus MODEL: MECL-M-1-200, made by M. D. COM. Inc.

Wavelength: 172 nm

Enclosed gas in the lamp: Xe
<Reforming Treatment Conditions>

The sample fixed on the movable stage was subjected to a reforming treatment under the following conditions to form a second gas barrier layer.

Excimer light strength: 130 mW/cm² (172 nm)

Distance between the sample and the light source: 1 mm

Stage heating temperature: 70° C.

Oxygen density in the irradiation apparatus: 1.0%

Excimer irradiation time: 5 seconds

Thus prepared substrate 1 had a water vapor permeability of less than $1 \times 10^{-4}$ g/(m²·24 h). It exhibited an excellent water vapor barrier property.

In the present examples, a water vapor permeability is a value determined at 25±0.5° C., and relative humidity 90±2% RH by the method based on JIS K 7129-1992.
(2) Preparation of Substrate 2

A light scatter layer and a smooth layer were formed on the substrate 1 (the second gas barrier layer) as described below to prepare a substrate 2.
(2-1) Preparation of Light Scatter Layer $TiO_2$ particles having a refractive index of 2.4 and an average particle size of 0.25 μm (JR600A, made by Teika Co. LTD.) and a resin solution (organic-inorganic hybrid resin, ED230AL made by APM Co. Ltd.) were mixed to have a solid portion ratio of 40 volume %/60 volume % of solution. To the mixture was added propyleneglycol monomethyl ether (PGME) so that the solid portion density in the liquid became 15 mass %.

To the above-described solid portion (effective mass component) was added 0.4 mass % of additive (Disperbyk-2096, made by BYK-Chemie Japan Co. Ltd.) to make formulation in an amount of 10 ml.

Specifically, the above-described $TiO_2$ particles, solvent, and additive were mixed in such a manner that the solvent and the additive became 10 mass % to the $TiO_2$ particles. While cooling the mixture at normal temperature (25° C.), it was dispersed with an ultrasonic disperser (UH-50, made by SMT Co. Ltd.) under a standard condition of a micro tip step (MS-3, 3 mmΦ, made by SMT Co. Ltd.) for 10 minutes to prepare a $TiO_2$ dispersion liquid.

Subsequently, with stirring the $TiO_2$ dispersion liquid at 100 rpm, the resin solution was added and mixed. After completion of addition, the stirring rate was increased to 500 rpm, and it was mixed for 10 minutes. Then, the mixture was filtered with a hydrophobic PVDF 0.45 μm filter (made by Whatman Co. Ltd.) to obtain a targeted coating liquid for a light scatter layer.

The above-described coating liquid was applied on the substrate 1 with an ink-jet method. Then, it was dried preliminarily (80° C. for 2 minutes), then, it was dried with wavelength controlled IR (described later) under the power condition to make a temperature of the substrate of less than 80° C. for 5 minutes.

Subsequently, the curing reaction was promoted under the following reforming conditions to obtain a light scatter layer having a thickness of 0.3 μm.

<Reforming Treatment Device>
Excimer applicator made by M.D.COM. Inc. (MODEL: MEIRH-M-1-200-222-H-KM-G, wavelength: 222 nm, gas sealed in the lamp: KrCl)

<Conditions on Reforming Treatment>
Intensity of excimer light: 8 $J/cm^2$ (222 nm)
Heating temperature of the stage: 60° C.
Oxygen level in the applicator: Atmosphere (2-2) Preparation of Smooth Layer Subsequently, a smooth layer coating liquid was prepared as follows. A high refractive UV curable resin (RIODURAS TYT 82-1, made by Toyo Ink Co. Ltd., and nanosol particles: $TiO_2$) was mixed in a mixture of organic solvents of propyleneglycol monomethyl ether (PGME) and 2-methyl-2,4-pentanediol (PD) (solvent ratio: 90 mass %/10 mass %). The formulation in an amount of 10 ml was made so that the solid portion density in the liquid became 12 mass %.

Specifically, the above-described high refractive UV curable resin and the solvent were mixed and stirred at 500 rpm for 1 minute. Then, the mixture was filtered with a hydrophobic PVDF 0.2 μm filter (made by Whatman Co. Ltd.) to obtain a targeted coating liquid for a smooth layer.

The above-described coating liquid was applied on the light scatter layer with an ink-jet method. Then, it was dried preliminarily (80° C. for 2 minutes), then, it was dried with wavelength controlled IR under the power condition to make a temperature of the substrate of less than 80° C. for 5 minutes.

The drying treatment was done by radiation heat transfer drying with a wavelength controlled IR heater: IR radiation apparatus (Ultimate heater/carbon, made by Meimei Industry Inc.) attached with 2 pieces of quartz glass plates that absorb IR rays of 3.5 μm or more, and a cooling air was passed through the glass plates.

The cooling air was set to be 200 L/min, and the temperature of the tube surface quartz glass was controlled to be less than 120° C. The temperature of the substrate was measured by connecting NR 2000 (made by KEYENCE Co. Ltd.) with locating K thermocouple at the upper and under surface of the substrate, and at the space position of 5 mm over the substrate.

Subsequently, the curing reaction was promoted under the following reforming conditions to obtain a smooth layer having a thickness of 0.5 μm. Thus, a light extracting layer composed of two layers of a light scatter layer and a smooth layer was prepared.

<Reforming Treatment Device>
Excimer applicator made by M.D.COM. Inc. (MODEL: MEIRH-M-1-200-222-H-KM-G, wavelength: 222 nm, gas sealed in the lamp: KrCl)

<Conditions on Reforming Treatment>
Intensity of excimer light: 8 $J/cm^2$ (222 nm)
Heating temperature of the stage: 60° C.
Oxygen level in the applicator: Atmosphere The single smooth layer had a water vapor permeability of 0.1 $g/(m^2 \cdot 24 \ h)$, and a refractive index of 1.82.

The light extracting layer thus prepared had a transmittance T of 67%, and a haze value of 50%. Here, the haze value is a value of the light extracting layer composed of the light scatter layer on which the smooth layer was laminated.

(3) Preparation of Substrate 3

After forming a light scatter layer on the substrate 1 (the second gas barrier layer) in the same manner as preparation of the substrate 2, a smooth layer was formed as described below to prepare a substrate 3.

(3-1) Preparation of Silicon Oxynitride

At first, the substrate was installed in a chamber of a magnetron sputtering apparatus (SPF-730H, made by Anelva Co. Ltd.). Then, the inside of the chamber of a magnetron sputtering apparatus was decompressed to achieve the vacuum level of $3.0 \times 10^4$ Pa with an oil-sealed rotary pump and a cryopump. Silicon nitride was used as a target, and an argon (Ar) gas was introduced with 30 sccm. A high frequency power (loaded power: 1.2 kW) of 13.56 MHz frequency was applied to form a film made of silicon oxynitride on the light scatter layer at a film forming pressure of 0.25 Pa with a thickness of 100 nm.

(3-2) Plasma Treatment

Next, a parallel plate type plasma CVD apparatus (PED-401, made by Anelva Co. Ltd.) was used. It was prepared a substrate formed thereon a film with a sputtering method as described above. This substrate was installed at the side of the under electrode in the chamber of the plasma CVD apparatus. Next, the inside of the chamber was decompressed to achieve the vacuum level of $1.0 \times 10^{-2}$ Pa with an oil-sealed rotary pump and a turbo molecular pump. Subsequently, a nitrogen gas ($N_2$) was introduced from a raw material supplying apparatus through a raw material supplying nozzle into the chamber with 30 sccm. By adjusting the pressure control valve located between the chamber and the vacuum exhaust pump, the inside pressure of the chamber was made to be 20 Pa. Then, a power (loaded power: 200 W) of 90 kMz frequency was applied to the under electrode. Glow discharge plasma was generated between the under electrode and the upper electrode (at a neighborhood of the raw material supplying nozzle aperture area (gas inlet)). A nitrogen plasma treatment was performed for 1 minute to the silicon nitride film on the substrate to form a smooth layer made of silicon nitride having a thickness of 90 nm.

The single smooth layer had a water vapor permeability of $1.0 \times 10^{-3}$ $g/(m^2 \cdot 24 \ h)$, and a refractive index of 2.1.

(4) Preparation of Substrate 4

A substrate 4 was prepared in the same manner as preparation of the substrate 3 except that a smooth layer was prepared as described in the following.

While maintaining the vacuum environment, it was transferred in the sputter apparatus, and a smooth layer was formed.

Specifically, silicon nitride ($Si_3N_4$) was used as a target material. This target material was formed in a cylindrical shape, and the distance between the upper edge of the cylindrical target and the substrate was made to be 7 cm. An argon gas containing 20 volume % of oxygen was used as a sputter gas, and the gas pressure was set to be $1.33 \times 10^{-2}$ Pa. An alternating-current source of frequency 13.56 MHz was used an electric power source. When the loaded power was 100 W, the film forming rate was found to be 1 Å/second measured with a quartz oscillator. A smooth layer made of silicon oxynitride having a thickness of 90 nm was formed under these conditions.

The single smooth layer had a water vapor permeability of $5.0 \times 10^{-3}$ g/(m$^2$·24 h), and a refractive index of 1.8.

(5) Preparation of Substrate 5

A substrate 5 was prepared in the same manner as preparation of the substrate 3 except that a smooth layer was prepared as described in the following.

Silicon (Si) was used as a target material. This target material was formed in a cylindrical shape, and the distance between the upper edge of the cylindrical target and the substrate was made to be 7 cm. An argon gas containing 25 volume % of oxygen was used as a sputter gas, and the gas pressure was set to be $1.33 \times 10^{-2}$ Pa. An alternating-current source of frequency 13.56 MHz was used an electric power source. When the loaded power was 150 W, the film forming rate was found to be 1 Å/second measured with a quartz oscillator. A smooth layer made of silicon dioxide having a thickness of 90 nm was formed under these conditions. Thus a substrate 5 was formed.

The single smooth layer had a water vapor permeability of $5.0 \times 10^{-3}$ g/(m$^2$·24 h), and a refractive index of 1.45.

(6) Preparation of Substrate 6

A substrate 6 was prepared in the same manner as preparation of the substrate 3 except that a smooth layer was prepared as described in the following.

First, a substrate was fixed to a substrate holder in an electron beam vapor deposition apparatus. Niobium oxide ($Nb_2O_5$) was placed in a heating boat. The substrate holder and the heating boat were installed in a vacuum chamber of the electron beam vapor deposition apparatus.

Next, after reducing the pressure of the vacuum chamber of the electron beam vapor deposition apparatus to $4 \times 10^{-4}$ Pa, an electron beam was irradiated to the heating boat containing niobium oxide. Thus, a smooth layer made of niobium oxide having a thickness of 90 nm was formed on the substrate at a vapor deposition rate of 0.1 to 0.2 nm/second.

The single smooth layer had a water vapor permeability of $1.0 \times 10^{-3}$ g/(m$^2$·24 h), and a refractive index of 2.3.

(7) Preparation of Substrates 7 to 10

Substrates 7 to 10 were prepared in the same manner as preparation of the substrate 3 except that a thickness of a smooth layer was changed as described in Table 1.

The refractive indexes of the smooth layer of the substrates 7 and 10 were the same as the refractive index of the smooth layer of the substrate 3.

(8) Preparation of Substrate 11

After forming a light scatter layer on the substrate 1 (the second gas barrier layer) in the same manner as preparation of the substrate 2, a smooth layer containing PHPS and having a thickness of 50 nm was formed in the same manner as preparation of the second gas barrier layer of the substrate 1 to prepare a substrate 11.

The single smooth layer had a water vapor permeability of $1.0 \times 10^{-2}$ g/(m$^2$·24 h). A refractive index of the smooth layer was low (n=1.5) at the substrate side, and high (n=1.5) at the opposite side, that is, at the smooth layer surface side. It was confirmed that the refractive index had a gradient in the smooth layer.

(9) Preparation of Substrates 12 and 13

Substrates 12 and 13 were prepared in the same manner as preparation of the substrate 11 except that a thickness of a smooth layer was changed as described in Table 1.

The refractive indexes of the smooth layer of the substrates 12 and 13 were the same as the refractive index of the smooth layer of the substrate 11.

(10) Preparation of Substrate 14

A substrate 14 was prepared in the same manner as preparation of the substrate 3 except that a smooth layer was prepared as described in the following.

A coating liquid containing an inorganic precursor was applied on the substrate surface with a reduced pressure pushing type coater to form a layer having a dried thickness of 50 nm.

The coating liquid containing an inorganic precursor was prepared as follows. A dibutyl ether solution containing 20 mass % of perhydropolysilazane (AQUAMICA NN120-20, made by AZ Electronic Materials, Ltd.) without catalyst; and a dibutyl ether solution containing 20 mass % of perhydropolysilazane (AQUAMICA NN120-20, made by AZ Electronic Materials, Ltd.) with an amine catalyst containing in an amount of 5 mass % of the solid portion were mixed. After adjusting the amount of the amine catalyst to be 1 mass % of the solid portion, $TiO_2$ nanoparticles dispersed in toluene with 50% (having a refractive index of 2.4 and an average particle size of 0.02 µm: HDT-760T, made by Teika Co. LTD.) and polysilazane were mixed with 2:1 in a volume ratio. To the above-described solid portion (effective mass component) was added 0.25 mass % of additive (Disperbyk-2096, made by BYK-Chemie Japan Co. Ltd.) and it was diluted with a mixture liquid of toluene/dibutyl ether to obtain a 5 mass % coating liquid.

After coating the layer, it was dried under the conditions of drying temperature of 80° C., drying time of 300 seconds, and a drying atmosphere having a dew point of 5° C.

After drying, the substrate was gradually cooled to 25° C. A reforming treatment was done to the coated surface by VUV irradiation in the VUV irradiation apparatus. Thus, a smooth layer having a thickness of 50 nm containing PHPS and $TiO_2$ nanoparticles was formed. As a light source for the VUV irradiation apparatus, it was used an Xe excimer lamp having a double tube structure that emits VUV rays of 172 nm.

<Reforming Treatment Device>

Excimer applicator made by M.D.COM. Inc. (MODEL: MECL-M-1-200, wavelength: 172 nm, gas sealed in the lamp: Xe)

<Conditions on Reforming Treatment>

Intensity of excimer light: 3 J/cm$^2$ (172 nm)

Heating temperature of the stage: 100° C.

Oxygen level in the applicator: 1,000 ppm

The single smooth layer had a water vapor permeability of $8.0 \times 10^{-2}$ g/(m$^2$·24 h). A refractive index of the smooth layer was low (n=1.8) at the substrate side, and it was high (n=1.9) at the opposite side, that is, at the smooth layer surface side. It was confirmed that the refractive index had a gradient in the smooth layer.

(11) Preparation of Substrate 15

A substrate 15 was prepared in the same manner as preparation of the substrate 14 except that a second smooth layer was prepared between the light scatter layer and the smooth layer (the first smooth layer) as described for the substrate 2, and that the thickness of the first smooth layer was made to be 90 nm.

The single first smooth layer had a water vapor permeability of $8.0 \times 10^{-2}$ g/(m$^2$·24 h). A refractive index of the smooth layer of the substrate 15 was the same as the refractive index of the smooth layer of the substrate 14.

(12) Preparation of Substrate 16

A substrate 16 was prepared in the same manner as preparation of the substrate 14 except that a thickness of a smooth layer was changed as described in Table 1.

The refractive index of the smooth layer of the substrates 16 was the same as the refractive index of the smooth layer of the substrate 14.

(13) Preparation of Substrate 17

A substrates 17 having a two-layered smooth layer was prepared by forming a smooth layer (a first smooth layer) on the substrate 2 (the smooth layer: a second smooth layer) in the same manner as preparation of the substrate 3.

(14) Preparation of Substrate 18

A substrates 18 having a two-layered smooth layer was prepared by forming a smooth layer (a first smooth layer) on the substrate 2 (the smooth layer: a second smooth layer) in the same manner as preparation of the substrate 12.

(15) Preparation of Substrate 19

A smooth layer of the substrate 3 was formed on the substrate 2 (the second smooth layer). Further thereon, a smooth layer of the substrate 11 was formed with a thickness of 20 nm. Thus, it was formed a substrate 19 having a second smooth layer and a two-layered first smooth layer.

The two-layered first smooth layer had a water vapor permeability of $1.0 \times 10^{-3}$ g/(m$^2$·24 h). A refractive index of each layer composing the first smooth layer was 2.1 for the layer made of SiN, and 1.7 for the layer made of PHPS. It was not found gradient of the refractive index.

(16) Preparation of Substrate 20

A smooth layer of the substrate 11 was formed on the substrate 2 (the second smooth layer) to have a thickness of 20 nm. Further thereon, a smooth layer of the substrate 3 was formed. Thus, it was formed a substrate 20 having a second smooth layer and a two-layered first smooth layer.

The two-layered first smooth layer had a water vapor permeability of $1.0 \times 10^{-3}$ g/(m$^2$·24 h). A refractive index of each layer composing the first smooth layer was 2.1 for the layer made of SiN, and 1.7 for the layer made of PHPS. It was not found gradient of the refractive index. It was not found gradient of the refractive index.

(17) Preparation of Substrate 21

A low refractive light scatter layer and a smooth layer were formed on the substrate 1 (the second gas barrier layer) as described in the following to prepare a substrate 21.

(17-1) Preparation of Light Scatter Layer

To a mixture of 30 mass % of tetramethoxysilan oligomer (MS51, made by Mitsubishi Chemical Co. Ltd.), 50 mass % of BtOH, 8 mass % of desalted water, and 12 mass % of MeOH was added a small amount of acid catalyst (aluminum acetyl acetonate). Then, titania fine particles having a particle size of 70 to 150 nm were added to the mixture with a surface-active agent. The mixture was stirred at 60° C. for 3 hours, then, it was left for one week for aging.

The prepared mixture was applied on the substrate with a dip coater, after drying the coated layer for 15 minutes, it was immersed in methanol for 5 minutes. Then, it was pulled up and dried for 5 minutes, and it was heated at 150° C. for 15 minutes in an oven to form a light scatter layer.

The light scatter layer had a thickness of 600 nm. When a low refractive film only made of matrix materials (materials without the fine particles) was measured with an ellipsometer, it was found to be 1.27 at a wavelength of 550 nm.

(17-2) Preparation of Smooth Layer

ZrO$_2$ was used as a target material. This target material was formed in a cylindrical shape, and the distance between the upper edge of the cylindrical target and the substrate was made to be 7 cm. An argon gas containing 2 volume % of oxygen was used as a sputter gas, and the gas pressure was set to be $1.33 \times 10^{-2}$ Pa. An alternating-current source of frequency 13.56 MHz was used an electric power source. With applying the loaded power of 300 W, a smooth layer made of ZrO$_2$ and having a thickness of 300 nm was formed.

The single smooth layer had a water vapor permeability of $8.0 \times 10^{-2}$ g/(m$^2$·24 h), and a refractive index of 2.0.

(18) Preparation of Substrate 22

A substrate 22 was prepared in the same manner as preparation of the substrate 21 except that a smooth layer was formed as described in the following.

ITO was used as a target material. This target material was formed in a cylindrical shape, and the distance between the upper edge of the cylindrical target and the substrate was made to be 7 cm. An argon gas containing 10 volume % of oxygen was used as a sputter gas, and the gas pressure was set to be $1.33 \times 10^{-2}$ Pa. An alternating-current source of frequency 13.56 MHz was used an electric power source. With applying the loaded power of 300 W, a smooth layer made of ITO and having a thickness of 200 nm was formed.

The single smooth layer had a water vapor permeability of 0.12 g/(m$^2$·24 h), and a refractive index of 1.95.

The first smooth layer formed with a dry process did not exhibit a difference of surface roughness between before and after the film formation. However, when the first smooth layer formed with a wet process was used, the surface roughness after the film formation was improved from that of before the process. This is an advantageous point to use a wet process. The single film formed with a wet process has an inferior water vapor permeability compared with that of the film formed with a dry process, however, this advantageous point is supposed to improve high-temperature storage stability and to prevent generation of dark spots (at initial stage an at after aging).

<Preparation of Organic EL Element>

Organic EL elements 1 to 22 were prepared by using the prepared substrates 1 to 22 as described in the following.

(1) Preparation of Transparent Electrode

A substrate having a gas barrier layer disposed thereon was cut to a size of 5 cm×5 cm, and it was fixed to a substrate holder of a commercially available vacuum deposition apparatus. An exemplified compound (1-6) was placed in a tantalum resistive heating boat. The substrate holder and the resistive heating boat were mounted on a first vacuum chamber of the vacuum deposition apparatus. Silver (Ag) was placed in another tungsten resistive heating boat, and it was mounted on a second vacuum chamber.

Exemplified Compound (1-6)

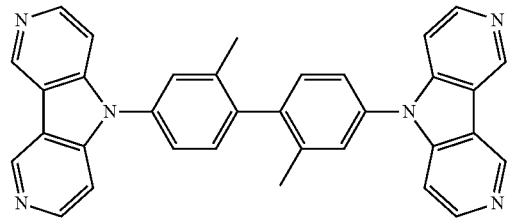 [SMILES: Cc1cc(-n2c3ccncc3c3cnccc32)ccc1-c1ccc(-n2c3ccncc3c3cnccc32)cc1C]

Next, the pressure of the first vacuum chamber was reduced to $4 \times 10^4$ Pa, and the heating boat containing the exemplified compound (1-6) was heated by electrical conduction to deposit an undercoat layer of the exemplified compound (1-6) having a of 50 nm on the substrate at a deposition rate of 0.1 to 0.2 nm/sec.

Subsequently, the substrate having the undercoat layer deposited thereon was placed into the second vacuum chamber under vacuum. The pressure of the second vacuum chamber was reduced to 4×10$^{-4}$ Pa, and the heating boat containing silver was heated by electrical conduction to deposit an electrode layer composed of silver having a thickness of 8 nm on the undercoat layer at a deposition rate of 0.1 to 0.2 nm/sec. A transparent electrode (anode) having a laminate structure composed of the undercoat layer and the electrode layer was prepared.

(2) Preparation of Organic Functional Layers

The constituting materials for each layer of organic functional layers were loaded in each of the vapor deposition boat of the vacuum deposition apparatus with an optimum amount. The vapor deposition boats made of resistive heating materials such as molybdenum and tungsten were used.

As the constituting materials for each layer of organic functional layers, the following compounds α-NPD, BD-1, GD-1, RD-1, H-1, H-2 and E-1 were used.

First, the inner pressure of the deposition chamber was reduced to a degree of vacuum of 4×10$^{-4}$ Pa, and the heating boat containing α-NPD was heated by electrical conduction to deposit. It was deposited on the transparent electrode at a deposition rate of 0.1 nm/sec to form a hole injection transporting layer.

Similarly, compounds BD-1 and H-1 were co-deposited in such a manner that the content of compound BD-1 became 5% at a deposition rate of 0.1 nm/sec to result in forming a blue phosphorescent layer having a thickness of 15 nm.

Next, compounds GD-1, RD-1, and H-2 were co-deposited in such a manner that the content of compound GD-1 became 17%, and the content of compound RD-1 became 0.8% at a deposition rate of 0.1 nm/sec to result in forming a yellow phosphorescent layer having a thickness of 15 nm.

Then, compound E-1 was deposited at a deposition rate of 0.1 nm/sec to result in forming an electron transfer layer having a thickness of 30 nm.

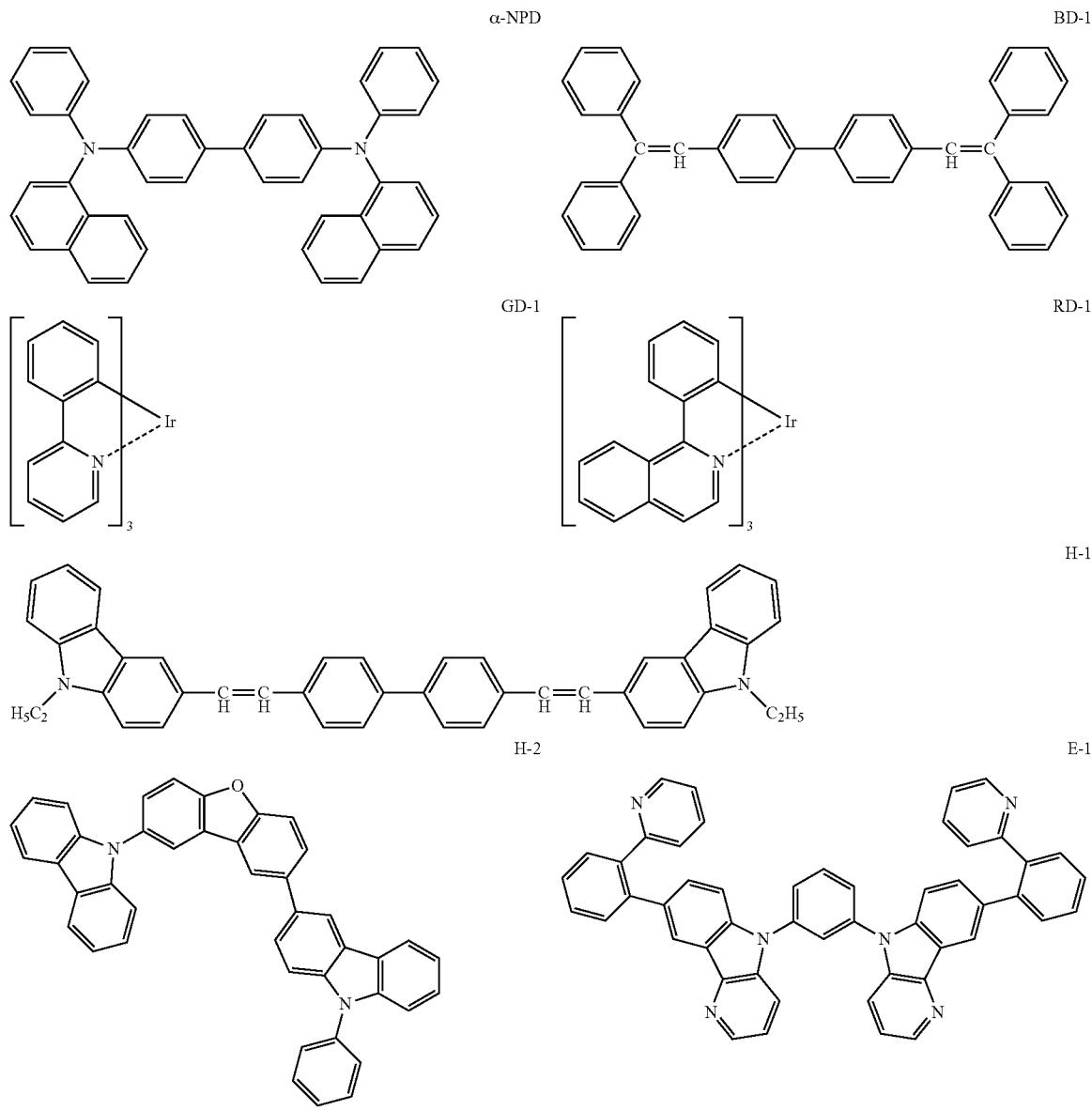

(3) Preparation of Opposite Electrode

Lithium fluoride (LiF) was deposited to form a layer having a thickness of 1.5 nm. Then, aluminum was deposited to form a layer having a thickness of 110 nm to form an opposite electrode (cathode). The opposite electrode was made in the form of extending the edge portion at the periphery of the substrate under the condition of isolated by the organic functional layers from the hole injection layer to the electron injection layer.

A vapor deposition mask was used for forming each layer. Among the area in the substrate of 5 cm×5 cm size, the center area of 4.5 cm×4.5 cm was made to be an emission area, and it was placed non-emission area of 0.25 cm width at entire around the emission area.

(4) Sealing (4-1) Preparation of Adhesive Composition

The following compositions were dissolved in toluene to prepare adhesive composition having a solid content of 25 mass %:

| | |
|---|---|
| Polyisobutylene resin (Opanol B50, made by BASF Ltd., Mw: 340,000) | 100 mass parts |
| Polybutene resin (Nisseki polybutene, Grade HV-1900, made by Nippon Oil Corporation, Ltd., Mw: 1900) | 30 mass parts |
| Hindered amine light stabilizer (TINUVIN 765, made by Ciba Japan Ltd.; containing a tertiary hindered amino group) | 0.5 mass parts |
| Hindered phenol anti-oxidant ((IRGANOX 1010, Ciba Japan Ltd.; containing two tertiary butyl groups at two β positions of a phenol) | 0.5 mass parts |
| Cyclic olefin polymer (Eastotac H-100L resin, made by Eastman Chemical Co.) | 50 mass parts |

(4-2) Preparation of Adhesive Sheet for Sealing

As a gas barrier material, it was used a polyethylene terephthalate having vapor-deposited aluminum (Al) (Alpet 12/34, made by Asia Aluminum Co. Ltd.) for a gas barrier layer. The above-prepared adhesive composition solution was coated on the aluminum side (the gas barrier side) so that the dried adhesive layer thickness became 20 μm. Then it was dried at 120° C. for 2 minutes to form an adhesive layer. Subsequently, a polyethylene terephthalate having a thickness of 38 μm and subjected to a peeling off treatment was pasted as a peeling-off sheet to the surface of the formed adhesive layer facing the peeling off treatment. Thus, it was prepared an adhesive sheet for sealing.

(4-3) Sealing

The prepared adhesive sheet for sealing as described above was placed under a nitrogen atmosphere. The peeling-off sheet was removed under a nitrogen atmosphere, then, it was dried on the hot plate heated at 120° C. for 10 minutes. After confirming that the sheet was cooled to room temperature (25° C.), it was used to completely laminate a cathode. Then, it was heated at 90° C. for 10 minutes.

(5) Preparation of Light Extracting Layer

On the opposite surface of the substrate provided with each layer was adhered a micro-lens array sheet (made by MN tech Co. Ltd.) used for a light extracting layer. Thus an organic EL element was obtained.

Each emission having a different color emitted in the light-emitting layer can be extracted from the transparent electrode side, that is, from the substrate side the prepared organic EL element.

Evaluation of Organic EL Element (1) MEASUREMENT OF DRIVING VOLTAGE AND LIGHT-EMISSION EFFICIENCY The prepared organic EL elements each were lighted at room temperature (25° C.) at a constant current density of 2.5 mA/cm². The luminance of the each organic EL element was measured with a spectral radiance meter CS-2000 (made by KONICA MINOLTA Inc.) to determine the light-emission efficiency of the each organic EL element (light extraction efficiency) at the current value.

The evaluation results are listed in Table 1.

Here, the light-emission efficiency was expressed as a relative value to the light-emission efficiency of the organic EL element 2 being 100.

(2) EVALUATION OF HIGH-TEMPERATURE STORAGE STABILITY

The prepared organic EL elements each were installed in a constant-temperature oven of 85° C. (dry). The voltage increasing rate of the sample before subjecting to the keeping test and after the keeping test (200 hours) was measured with driving the constant electric current as described in the evaluation (1). The results were evaluated.

(3) EVALUATION OF DARK SPOTS

The prepared organic EL elements each were driven to continuously emit light with the constant electric current as described in the evaluation (1). The emission condition of the initial emission state and 200 hour driven state were evaluated with visual inspection. The generation condition of the dark spots were evaluated according to the following criteria.

O: There is no dark spot (DS) having a size of larger than 150 μmΦ.

OΔ: The number of the DS having a size of larger than 150 μmΦ is from 1 to 3.

Δ: The number of the DS having a size of larger than 150 μmΦ is from 4 to 20.

ΔX: The number of the DS having a size of larger than 150 is very large.

X: No emission is observed.

The evaluation results are listed in Table 1.

(4) FLEXIBLE APTITUDE

The prepared organic EL elements each were wound around a roll of 15 mmΦ under the condition that the PET sealing surface with deposited aluminum was kept outside, then the wound sample was rewound to be flat. This operation was repeated 100 times. After repeating 100 times of the above-described operation, the emission condition of the sample was observed.

The evaluation of flexible aptitude was done by the following criteria.

O: No degradation was detected

OΔ: The number of the DS having a size of larger than 150 μmΦ is from 1 to 3.

Δ: The number of the DS having a size of larger than 150 μmΦ is from 4 to 20.

ΔX: The number of the DS having a size of larger than 150 μmΦ is very large.

X: No emission is observed at the bending portion.

The evaluation results are listed in Table 1.

In Table 1, the constitution of the smooth layer in each organic EL element is indicated by separately describing the first smooth layer and the second smooth layer for convenience. As for the film forming method, film formation with a dry process is indicated as "dry", and film formation with a wet process is indicated as "wet".

A water vapor permeability in the substrates 17 to 20 is a water vapor permeability of the first smooth layer.

TABLE 1

| *1 | *2 | Light-Scatter layer Average particle size (μm) | Smooth layer Second smooth layer Material | *3 | *4 | First smooth layer Material | *3 | *4 | *5 | *6 | Dark spot *7 | *8 | *9 | *10 | Remarks |
|---|---|---|---|---|---|---|---|---|---|---|---|---|---|---|---|
| 1 | 1 | — | — | — | — | — | — | — | — | 50 | 108 | ○ | ○ | ○ | Comparative example |
| 2 | 2 | 0.25 | TYT82-01 | 500 | wet | — | — | — | 0.1 | 100 | 200以上 | ○ | x | ○ | Comparative example |
| 3 | 3 | 0.25 | — | — | — | SiN | 90 | dry | $1 \times 10^{-3}$ | 100 | 103 | ○Δ | ○Δ | ○ | Inventive example |
| 4 | 4 | 0.25 | — | — | — | SiON | 90 | dry | $5 \times 10^{-3}$ | 98 | 105 | ○Δ | ○Δ | ○ | Inventive example |
| 5 | 5 | 0.25 | — | — | — | SiO2 | 90 | dry | $5 \times 10^{-3}$ | 90 | 105 | ○Δ | ○Δ | ○ | Inventive example |
| 6 | 6 | 0.25 | — | — | — | Nb2O5 | 90 | dry | $1 \times 10^{-3}$ | 100 | 103 | ○Δ | ○Δ | ○ | Inventive example |
| 7 | 7 | 0.25 | — | — | — | SiN | 20 | dry | $5 \times 10^{-3}$ | 100 | 110 | ○ | ○ | ○ | Inventive example |
| 8 | 8 | 0.25 | — | — | — | SiN | 50 | dry | $5 \times 10^{-3}$ | 100 | 108 | ○ | ○ | ○ | Inventive example |
| 9 | 9 | 0.25 | — | — | — | SiN | 200 | dry | $1 \times 10^{-3}$ | 100 | 100 | ○Δ | ○Δ | ○ | Inventive example |
| 10 | 10 | 0.25 | — | — | — | SiN | 500 | dry | $1 \times 10^{-5}$ | 100 | 100 | Δ | Δ | ○Δ | Inventive example |
| 11 | 11 | 0.25 | — | — | — | PHPS | 50 | wet | $1 \times 10^{-2}$ | 100 | 108 | ○ | ○ | ○ | Inventive example |
| 12 | 12 | 0.25 | — | — | — | PHPS | 90 | wet | $1 \times 10^{-2}$ | 90 | 103 | ○ | ○ | ○ | Inventive example |
| 13 | 13 | 0.25 | — | — | — | PHPS | 200 | wet | $1 \times 10^{-2}$ | 80 | 108 | ○ | ○ | ○ | Inventive example |
| 14 | 14 | 0.25 | — | — | — | PHPS + nano-TiO2 | 50 | wet | $8 \times 10^{-2}$ | 100 | 110 | ○ | ○ | ○ | Inventive example |
| 15 | 15 | 0.25 | TYT82-01 | 500 | wet | PHPS + nano-TiO2 | 90 | wet | $8 \times 10^{-2}$ | 100 | 108 | ○ | ○ | ○ | Inventive example |
| 16 | 16 | 0.25 | — | — | — | PHPS + nano-TiO2 | 200 | wet | $8 \times 10^{-2}$ | 100 | 110 | ○ | ○ | ○ | Inventive example |
| 17 | 17 | 0.25 | TYT82-01 | 500 | wet | SiN | 90 | dry | $1 \times 10^{-3}$ | 100 | 104 | ○Δ | ○Δ | ○ | Inventive example |
| 18 | 18 | 0.25 | TYT82-01 | 500 | wet | PHPS | 90 | wet | $1 \times 10^{-2}$ | 90 | 106 | ○ | ○ | ○ | Inventive example |
| 19 | 19 | 0.25 | TYT82-01 | 500 | wet | SiN/PHPS | 90/20 | dry/wet | $1 \times 10^{-3}$ | 100 | 100 | ○ | ○ | ○ | Inventive example |
| 20 | 20 | 0.25 | TYT82-01 | 500 | wet | PHPS/SiN | 20/90 | wet/dry | $1 \times 10^{-3}$ | 100 | 100 | ○ | ○ | ○ | Inventive example |
| 21 | 21 | 0.07~0.15 | — | — | — | ZrO2 | 300 | dry | $8 \times 10^{-2}$ | 100 | 110 | Δ | Δ | x | Comparative example |
| 22 | 22 | 0.07~0.15 | — | — | — | ITO | 200 | dry | 0.12 | 100 | 130 | Δ | x | x | Comparative example |

*1: Organic EL element No.
*2: Substrate No.
*3: Layer thickness(μm)
*4: Film forming method
*5: Water vapor permeability (g/(m2 · 24 h)
*6: Light-emission efficiency
*7: High-temperature storage stability
*8: Before storage
*9: After storage
*10: Flexible aptitude

(5) CONCLUSION

As are clearly demonstrated by Table 1, the organic EL elements 3 to 20 of the present invention are superior to the organic EL elements 1, 2, 21 and 22 of (comparative samples) with respect to all of light-emission efficiency, high-temperature storage stability, dark spots, and flexible aptitude.

From these results, it can be confirmed the following.

That is, when an organic electroluminescent element contains a film substrate having thereon: at least one gas barrier layer, a light scatter layer, at least one smooth layer, and a light-emitting unit containing an organic functional layer interposed between a pair of electrodes, laminated in this order; the light scatter layer contains a binder and light scatter particles having an average particle size of 0.2 μm or more to less than 1 μm; and the smooth layer contains an oxide or a nitride of silicon or niobium as a main component, it is efficient to achieve a high-temperature storage stability and improved light-emission efficiency while maintaining flexible aptitude.

INDUSTRIAL APPLICABILITY

The present invention can be used to provide an organic electroluminescent element achieving a high-temperature storage stability and improved light-emission efficiency while maintaining flexible aptitude

DESCRIPTION OF SYMBOLS

1: Film substrate
2: Gas barrier layer
2*a*: First gas barrier layer
2*b*: Second gas barrier layer
3: Light scatter layer
4: Smooth layer
4*a*: First smooth layer
4*b*: Second smooth layer
5: Transparent electrode
5*a*: Undercoat layer
5*b*: Electrode layer
6: Light-emitting unit
6*a*: Hole injection layer
6*b*: Hole transport layer
6*c*: Light-emitting layer
6*d*: Electron transport layer
6*e*: Electron injection layer
7: Opposite electrode
8: Extraction electrode
9: Auxiliary electrode
10: Sealing material
11: Adhesive
13*a*: Light extracting surface
20: Delivery roller
21 to 24: Conveyer rollers
25: Reeling roller
31 and 32: Deposition rollers
41: Deposition gas inlet
51: Power source for plasma generation
61 and 62: Magnetic-field generators
100: Organic EL element
A: Oxygen distribution curve
B: Silicon distribution curve
C: Carbon distribution curve
X and Y: Local maximum points of oxygen atomic percentage
m: Perpendicular bisector
p, $t_1$ and $t_2$: points

The invention claimed is:

1. An organic electroluminescent element comprising a film substrate having thereon: at least one gas barrier layer, a light scatter layer, at least one smooth layer, and a light-emitting unit containing an organic functional layer interposed between a pair of electrodes, laminated in this order,
wherein the at least one gas barrier layer is in direct contact with the film substrate, and the at least one gas barrier layer contains silicon, oxygen, and carbon and has a carbon distribution curve in which an absolute value of a difference between a maximum value and a minimum value of a carbon atomic percentage is 3 at % or more,
wherein the light scatter layer contains a binder and light scatter particles having an average particle size of 0.2 μm or more to less than 1 μm; and
the smooth layer contains an oxide or a nitride of silicone or niobium as a main component.

2. An organic electroluminescent element comprising a film substrate having thereon: a first gas barrier layer, a second gas barrier layer, a light scatter layer, at least one smooth layer, and a light-emitting unit containing an organic functional layer interposed between a pair of electrodes, laminated in this order,
wherein the first gas barrier layer is in direct contact with the film substrate, and the first gas barrier layer contains silicon, oxygen, and carbon and has a carbon distribution curve in which an absolute value of a difference between a maximum value and a minimum value of a carbon atomic percentage is 3 at % or more,
wherein the light scatter layer contains a binder and light scatter particles having an average particle size of 0.2 μm or more to less than 1 μm; and
the smooth layer has a water vapor permeability of less than 0.1 g/(m²·24 h).

3. An organic electroluminescent element described in claim 1,
wherein the smooth layer contains a reaction product of an inorganic silicon compound or an organic silicon compound, or niobium oxide as a main component.

4. An organic electroluminescent element described in claim 1,
wherein a water vapor permeability of the gas barrier layer (Wg), a water vapor permeability of the light scatter layer (Ws), and a water vapor permeability of the smooth layer (Wf) satisfy the following conditional expression, $$Wg \leq Wf < Ws.$$

5. An organic electroluminescent element described in claim 1,
wherein the smooth layer has a refractive index in the range of 1.7 to 3.0.

6. An organic electroluminescent element described in claim 1,
wherein the smooth layer contains nanoparticles having a refractive index in the range of 1.7 to 3.0.

7. An organic electroluminescent element described in claim 1,
wherein the smooth layer has a first smooth layer and a second smooth layer in a sequential order from a side of the light-emitting unit;
the first smooth layer contains niobium oxide as a main component; and
the second smooth layer is formed with a wet process.

8. An organic electroluminescent element described in claim 7,
wherein the first smooth layer is formed with a dry process.

9. An organic electroluminescent element described in claim 7,
wherein the first smooth layer is formed with a wet process.

10. An organic electroluminescent element described in claim 7,
wherein at least one of the first smooth layer and the second smooth layer contains nanoparticles having a refractive index in the range of 1.7 to 3.0.

11. An organic electroluminescent element described in claim 7,
wherein the first smooth layer and the second smooth layer both respectively have a refractive index in the range of 1.7 to 3.0.

12. An organic electroluminescent element described in claim 1, wherein the light scatter layer is patterned in a sealing region.

* * * * *